(12) United States Patent
Kang et al.

(10) Patent No.: US 12,100,710 B2
(45) Date of Patent: Sep. 24, 2024

(54) PIXEL IN A DISPLAY AREA HAVING A PLURALITY OF REPAIR PATTERNS/CIRCUIT OVERLAPPING BETWEEN A PAIR OF PLURALITY OF ELECTRODES INCLUDING A FIRST ELECTRODE AND A SECOND ELECTRODE THAT ARE SPACED APART FROM EACH OTHER AND AN INTERMEDIATE ELECTRODE ARRANGED BETWEEN THE FIRST ELECTRODE AND THE SECOND ELECTRODE, AND DISPLAY DEVICE COMPRISING THE PIXEL

(71) Applicant: SAMSUNG DISPLAY CO., LTD., Yongin-Si (KR)

(72) Inventors: Sin Chul Kang, Yongin-Si (KR); Won Sik Oh, Yongin-Si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 479 days.

(21) Appl. No.: 17/429,546

(22) PCT Filed: Aug. 9, 2019

(86) PCT No.: PCT/KR2019/010114
§ 371 (c)(1),
(2) Date: Aug. 9, 2021

(87) PCT Pub. No.: WO2020/166774
PCT Pub. Date: Aug. 20, 2020

(65) Prior Publication Data
US 2022/0149079 A1    May 12, 2022

(30) Foreign Application Priority Data
Feb. 11, 2019    (KR) .................. 10-2019-0015723

(51) Int. Cl.
*H01L 27/12*    (2006.01)
*H01L 25/16*    (2023.01)
(Continued)

(52) U.S. Cl.
CPC .......... *H01L 27/124* (2013.01); *H01L 25/167* (2013.01); *G09G 3/006* (2013.01);
(Continued)

(58) Field of Classification Search
CPC ..... H01L 27/124; H01L 25/167; H01L 24/24; H01L 2224/24147; H01L 25/0753;
(Continued)

(56) References Cited

U.S. PATENT DOCUMENTS 8,227,977 B2    7/2012    Lhee et al.
9,646,530 B2    5/2017    Hwang et al.
(Continued)

FOREIGN PATENT DOCUMENTS

KR    10-2007-0033699    3/2007
KR    10-2010-0093220    8/2010
(Continued)

OTHER PUBLICATIONS

International Search Report, with English translation, corresponding to International Application No. PCT/KR2019/010114 dated Nov. 27, 2019.
(Continued)

*Primary Examiner* — Ermias T Woldegeorgis
(74) *Attorney, Agent, or Firm* — KILE PARK REED & HOUTTEMAN PLLC

(57)    ABSTRACT

A display device includes a pixel disposed in a display area. The pixel includes a first electrode and a second electrode spaced apart from each other; at least one intermediate electrode disposed between the first electrode and the second electrode; a plurality of light emitting elements electrically
(Continued)

connected between a pair of adjacent electrodes of a plurality of electrodes including the first electrode, the second electrode, and the at least one intermediate electrode; and a plurality of repair patterns overlapping and disposed between a pair of adjacent electrodes of the plurality of electrodes.

20 Claims, 37 Drawing Sheets

(51) Int. Cl.
    *G09G 3/00*            (2006.01)
    *G09G 3/32*            (2016.01)
    *H01L 23/00*          (2006.01)

(52) U.S. Cl.
    CPC ....... *G09G 3/32* (2013.01); *G09G 2300/0809* (2013.01); *H01L 24/24* (2013.01); *H01L 2224/24147* (2013.01)

(58) Field of Classification Search
    CPC ......... H01L 27/15; H01L 33/62; H01L 33/38; H01L 27/156; G09G 3/006; G09G 3/32; G09G 2300/0809; G09G 2300/0426; G09G 3/3233; G09G 2330/08
    See application file for complete search history.

(56) References Cited

U.S. PATENT DOCUMENTS

| | | |
|---|---|---|
| 9,824,628 B2 | 11/2017 | Na |
| 9,972,549 B2 | 5/2018 | Wu et al. |
| 10,026,777 B2 | 7/2018 | Kang et al. |
| 2010/0207106 A1 | 8/2010 | Lhee et al. |
| 2018/0175009 A1* | 6/2018 | Kim ........................ H01L 33/20 |

FOREIGN PATENT DOCUMENTS

| | | | | |
|---|---|---|---|---|
| KR | 20150093909 A | * | 8/2015 | ........... G09G 3/3283 |
| KR | 10-2016-0081241 | | 7/2016 | |
| KR | 10-2017-0049117 | | 5/2017 | |
| KR | 10-2018-0071465 | | 6/2018 | |
| KR | 10-2096056 | | 4/2020 | |

OTHER PUBLICATIONS

Written Opinion, with English translation, corresponding to International Application No. PCT/KR2019/010114, dated Nov. 27, 2019.

* cited by examiner

PIXEL IN A DISPLAY AREA HAVING A PLURALITY OF REPAIR PATTERNS/CIRCUIT OVERLAPPING BETWEEN A PAIR OF PLURALITY OF ELECTRODES INCLUDING A FIRST ELECTRODE AND A SECOND ELECTRODE THAT ARE SPACED APART FROM EACH OTHER AND AN INTERMEDIATE ELECTRODE ARRANGED BETWEEN THE FIRST ELECTRODE AND THE SECOND ELECTRODE, AND DISPLAY DEVICE COMPRISING THE PIXEL

CROSS-REFERENCE TO RELATED APPLICATION(S)

This application is a national entry of International Application No. PCT/KR2019/010114, filed on Aug. 9, 2019, which claims under 35 U.S.C. §§ 119(a) and 365(b) priority to and benefits of Korean Patent Application No. 10-2019-0015723, filed on Feb. 11, 2019 in the Korean Intellectual Property Office (KIPO), the entire contents of which are incorporated herein by reference.

BACKGROUND

1. Technical Field

Various embodiments of the disclosure relate to a pixel and a display device including the pixel.

2. Description of Related Art

Recently, a technique of manufacturing a subminiature light emitting element with a material having a reliable inorganic crystal structure and manufacturing a light emitting device with the light emitting element has been developed. For example, a technique of fabricating a plurality of subminiature light emitting elements having a small size corresponding to a range from the nanometer scale to the micrometer scale, and forming light sources of various light emitting devices, e.g., pixels of display devices including the subminiature light emitting elements, has been developed.

SUMMARY

Various embodiments of the disclosure are directed to a pixel including a light emitting element, and a display device including the pixel.

A display device in accordance with an embodiment of the disclosure may include a pixel disposed in a display area. The pixel may include a first electrode and a second electrode spaced apart from each other; at least one intermediate electrode disposed between the first electrode and the second electrode; a plurality of light emitting elements electrically connected between a pair of adjacent electrodes of a plurality of electrodes including the first electrode, the second electrode, and the at least one intermediate electrode; and a plurality of repair patterns overlapping and disposed between a pair of adjacent electrodes of the plurality of electrodes.

In an embodiment, the first electrode, the at least one intermediate electrode, and the second electrode may be successively connected in series via each of the plurality of light emitting elements or the plurality of repair patterns.

In an embodiment, the first electrode, the at least one intermediate electrode, and the second electrode may be successively disposed at positions spaced apart from each other in a first direction, and each may extend in a second direction intersecting the first direction.

In an embodiment, the plurality of repair patterns may be spaced apart from each other in the first direction.

In an embodiment, the pixel may include a display element layer in which the first electrode, the second electrode, the at least one intermediate electrode, and the plurality of light emitting elements are disposed; and a circuit element layer disposed under the display element layer, and in which the plurality of repair patterns are disposed.

In an embodiment, at least one of the plurality of repair patterns may include a repair transistor. The repair transistor may include a gate electrode overlapping a gate-on power line to be supplied with a gate-on voltage capable of turning on the repair transistor, any one electrode of the first and second electrodes, or an electrode line electrically connected to the any one electrode; a semiconductor pattern overlapping an area of the gate electrode; and a source electrode and a drain electrode electrically connecting a pair of adjacent electrodes to respective different ends of the semiconductor pattern.

In an embodiment, the gate-on power line and the source and drain electrodes of the repair transistor may be disposed on a same layer.

In an embodiment, the pixel may include a guide pattern disposed in the display element layer and overlapping the gate electrode of the repair transistor and the gate-on power line.

In an embodiment, the guide pattern may include a conductive or insulating pattern, and the conductive or insulating pattern and at least one electrode of the plurality of electrodes disposed in the display element layer including the first and the second electrodes are disposed on a same layer, or the conductive or insulating pattern and at least one insulating layer disposed in the display element layer are disposed on a same layer.

In an embodiment, the display device may further include a first power line electrically connected to the first electrode; and a second power line electrically connected to the second electrode.

In an embodiment, the pixel may include a pixel circuit electrically connected between the first power line and the first electrode or between the second power line and the second electrode. The pixel circuit may include transistors of an identical type to the repair transistor.

In an embodiment, the pixel may include a first electrode line electrically connected between the first power line and the first electrode, and a second electrode line electrically connected between the second power line and the second electrode. The gate-on power line may be disposed adjacent to one of the first and second electrode lines that is supplied with a power or signal having a potential closer to a potential of a power or signal of the gate-on power line than the other of the first and second electrode lines.

In an embodiment, at least one of the plurality of repair patterns may include a conductive pattern disposed in the circuit element layer such that the conductive pattern intersects a pair of electrodes of the plurality of electrodes corresponding to the at least one of the plurality of repair patterns.

In an embodiment, the at least one intermediate electrode may overlap at least two repair patterns of the plurality of repair patterns spaced apart from each other, and the at least one intermediate electrode including a slit disposed between the at least two repair patterns.

In an embodiment, one of the first and second electrodes or an electrode line electrically connected to the one of the first and second electrodes may include a protrusion overlapping one of the plurality of repair patterns.

In an embodiment, the plurality of repair patterns may include at least one repair pattern electrically isolated from a pair of electrodes of the plurality of electrodes corresponding to the at least one repair pattern. The pixel may include at least one light emitting element electrically connected in a forward direction between the pair of adjacent electrodes that overlap the at least one repair pattern.

In an embodiment, the plurality of repair patterns may include at least one repair pattern electrically connected between a pair of electrodes of the plurality of electrodes corresponding to the at least one repair pattern. The pair of adjacent electrodes that overlap the at least one repair pattern may be electrically connected to each other only through the at least one repair pattern.

In an embodiment, the pixel may include at least one of: a plurality of banks disposed under respective partial areas of the first electrode, the second electrode, and the at least one intermediate electrode; and a plurality of contact electrodes respectively disposed over the first electrode, the second electrode, and the at least one intermediate electrode, and electrically connecting each of the first electrode, the second electrode, and the at least one intermediate electrode to an end of an adjacent light emitting element.

A pixel in accordance with an embodiment of the disclosure may include a first electrode and a second electrode spaced apart from each other; at least one intermediate electrode disposed between the first electrode and the second electrode; a plurality of light emitting elements electrically connected between a pair of adjacent electrodes of a plurality of electrodes including the first electrode, the second electrode, and the at least one intermediate electrode; and a plurality of repair patterns overlapping and disposed between a pair of adjacent electrodes of the plurality of electrodes.

In an embodiment, the plurality of repair patterns may include at least one repair pattern including a repair transistor electrically connected between a pair of adjacent electrodes of the plurality of electrodes disposed on sides of the repair pattern; or a conductive pattern intersecting the pair of adjacent electrodes disposed on the sides of the repair pattern.

In a pixel and a display device including the pixel in accordance with embodiments of the disclosure, an open defect which may occur in the pixel having a serial connection structure of light emitting elements may be readily repaired. Consequently, the yield of the display device may be enhanced.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1A:
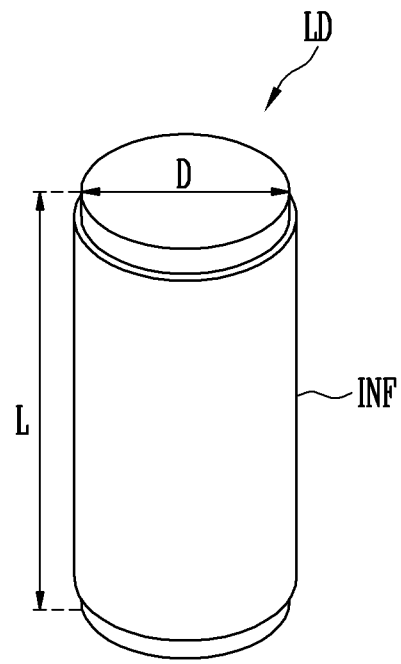
FIGS. 1A and 1B are respectively a perspective view and a cross-sectional view schematically illustrating a light emitting element in accordance with an embodiment of the disclosure.

Reference will now be made in detail to various embodiments of the disclosure, specific examples of which are illustrated in the accompanying drawings and described below, since the embodiments of the disclosure can be variously modified in many different forms. However, the disclosure is not limited to the following embodiments and may be modified into various forms.

Some elements which are not directly related to the features of the disclosure in the drawings may be omitted to clearly explain the disclosure. Furthermore, the sizes, ratios, or the like of some elements in the drawings may be exaggerated. It should be noted that the same reference numerals are used to designate the same or similar elements throughout the drawings, and repetitive explanation will be omitted.

It will be understood that, although the terms "first," "second," etc. may be used herein to describe various elements, these elements should not be limited by these terms. It will be further understood that the terms "comprise," "include," "have," etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first component or part is disposed on a second component or part, the first component or part may be not only directly on the second component or part but a third component or part may also intervene between them. Furthermore, the term "position," "direction," etc. used in the following description are defined in relative terms, and it should be noted that they may be changed into a reverse position or direction depending on a view angle or direction. Furthermore, a singular form may include a plural form as long as it is not specifically mentioned in a sentence.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIGS. 1A, 1B, 2A, 2B, 3A, and 3B are schematic perspective views and schematic cross-sectional views illustrating light emitting elements LD in accordance with embodiments. Although FIGS. 1A to 3B illustrate cylindrical rod-type light emitting elements LD, the type and/or shape of the light emitting elements LD in accordance with the disclosure is not limited thereto.

Figure 1B:
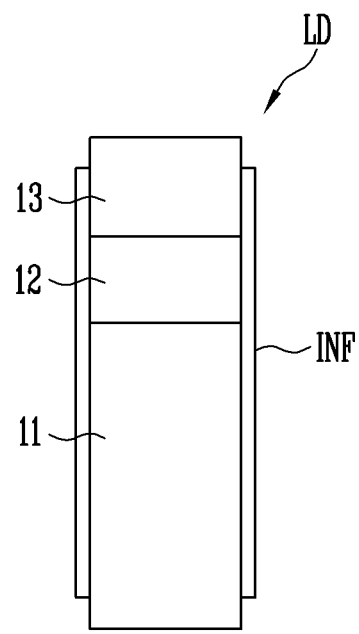

Referring to FIGS. 1A and 1B, a light emitting element LD in accordance with an embodiment may include a first conductivity type semiconductor layer 11, a second conductivity type semiconductor layer 13, and an active layer 12 interposed between the first and second conductivity type semiconductor layers 11 and 13. For example, the light emitting element LD may include the first conductivity type semiconductor layer 11, the active layer 12, and the second conductivity type semiconductor layer 13 which are successively stacked each other in a longitudinal direction.

In an embodiment, the light emitting element LD may be provided in the form of a rod extending in a direction. If the direction in which the light emitting element LD extends is defined as the longitudinal direction, the light emitting element LD may have a first end and a second end in the longitudinal direction.

In an embodiment, one of the first and second conductivity type semiconductor layers 11 and 13 may be disposed on the first end of the light emitting element LD. The other of the first and second conductivity type semiconductor layers 11 and 13 may be disposed on the second end of the light emitting element LD.

In an embodiment, the light emitting element LD may be a rod-type light emitting diode manufactured in the form of a rod. In this specification, the term "rod-type" embraces a rod-like shape and a bar-like shape such as a cylindrical shape and a prismatic shape extending in the longitudinal direction (for example, having an aspect ratio greater than 1), and the cross-sectional shape thereof is not limited to a particular shape. For example, the length L of the light emitting element LD may be greater than a diameter D thereof (or a width of the cross-section thereof).

In an embodiment, the light emitting element LD may have a small size ranging from the nanometer scale to the micrometer scale. For example, each light emitting element LD may have a diameter D and/or a length L ranging from the nanometer scale to the micrometer scale. However, in the disclosure, the size of the light emitting element LD is not limited thereto. For example, the size of the light emitting element LD may be changed in various ways depending on design conditions of various devices, e.g., a display device, which employ, as a light source, a light emitting device including a light emitting element LD.

The first conductivity type semiconductor layer 11 may include, for example, at least one N-type semiconductor layer. For instance, the first conductivity type semiconductor layer 11 may include an N-type semiconductor layer which includes a semiconductor material of InAlGaN, GaN, AlGaN, InGaN, AlN, and InN and is doped with a first conductive dopant such as Si, Ge, or Sn. However, a material for forming the first conductivity type semiconductor layer 11 is not limited thereto, and the first conductivity type semiconductor layer 11 may be formed of (or include) various other materials.

The active layer 12 may be disposed on the first conductivity type semiconductor layer 11 and have a single or multi-quantum well (MQW) structure. In an embodiment, a cladding layer (not shown) doped with a conductive dopant may be formed over and/or under the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If a voltage equal to or greater than a threshold voltage is applied between the opposite ends of the light emitting element LD, the light emitting element LD may emit light by combination of electron-hole pairs in the active layer 12. Since light emission of the light emitting element LD can be controlled based on the foregoing principle, the light emitting element LD may be used as a light source of various light emitting devices as well as a pixel of the display device.

The second conductivity type semiconductor layer 13 may be disposed on the active layer 12 and include a semiconductor layer having a type different from that of the first conductivity type semiconductor layer 11. For example, the second conductivity type semiconductor layer 13 may include at least one P-type semiconductor layer. For instance, the second conductivity type semiconductor layer 13 may include a P-type semiconductor layer which includes any one semiconductor material of InAlGaN, GaN, AlGaN, InGaN, AlN, and InN and is doped with a second conductive dopant such as Mg. However, the material for forming the second conductivity type semiconductor layer 13 is not limited thereto, and the second conductivity type semiconductor layer 13 may be formed of various other materials.

In an embodiment, the light emitting element LD may further include an insulating film INF provided on the surface of the light emitting element LD. The insulating film INF may be formed on the surface of the light emitting element LD to enclose an outer circumferential surface of at least the active layer 12 and may further enclose areas of the first and second conductivity type semiconductor layers 11 and 13. Here, the insulating film INF may allow the opposite ends of the light emitting element LD that have different polarities to be exposed to the outside. For example, the insulating film INF may expose one end of each of the first and second conductivity type semiconductor layers 11 and 13 that are disposed on the respective opposite ends of the light emitting element LD in the longitudinal direction, and for example, may expose two base sides of the cylinder (top and bottom surfaces of the light emitting element LD in FIGS. 1A and 1B) rather than covering (or overlapping) the two base sides.

In an embodiment, the insulating film INF may include at least one insulating material of silicon dioxide ($SiO_2$), silicon nitride ($Si_3N_4$), aluminum oxide ($Al_2O_3$), and titanium dioxide ($TiO_2$), but the disclosure is not limited thereto. In other words, the material that forms the insulating film INF is not limited to a particular material, and the insulating film INF may be formed of various insulating materials.

In an embodiment, the light emitting element LD may further include additional other components as well as the first conductivity type semiconductor layer 11, the active layer 12, the second conductivity type semiconductor layer 13, and/or the insulating film INF. For example, the light emitting element LD may further include one or more fluorescent layers, one or more active layers, one or more semiconductor layers, and/or one or more electrode layers disposed on an end of the first conductivity type semiconductor layer 11, the active layer 12, and/or the second conductivity type semiconductor layer 13.

Figure 2A:
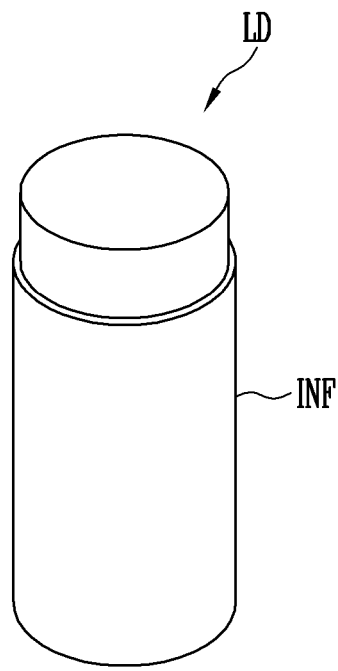
FIGS. 2A and 2B are respectively a perspective view and a cross-sectional view schematically illustrating a light emitting element in accordance with an embodiment of the disclosure.
Figure 2B:
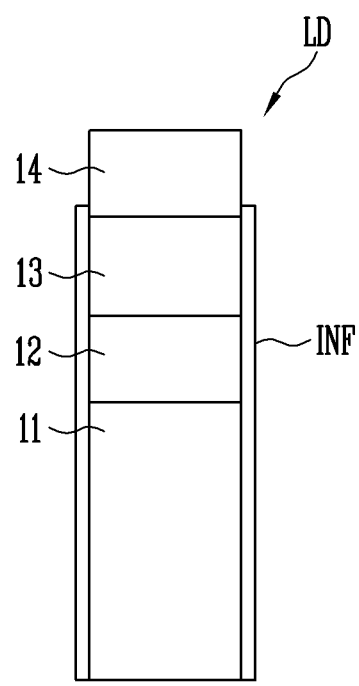
Figure 3A:
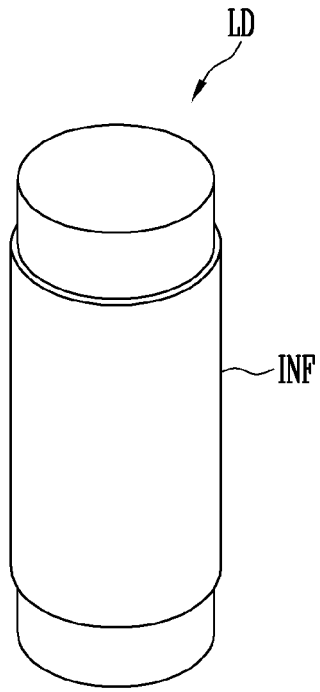
FIGS. 3A and 3B are respectively a perspective view and a cross-sectional view schematically illustrating a light emitting element in accordance with an embodiment of the disclosure.
Figure 3B:
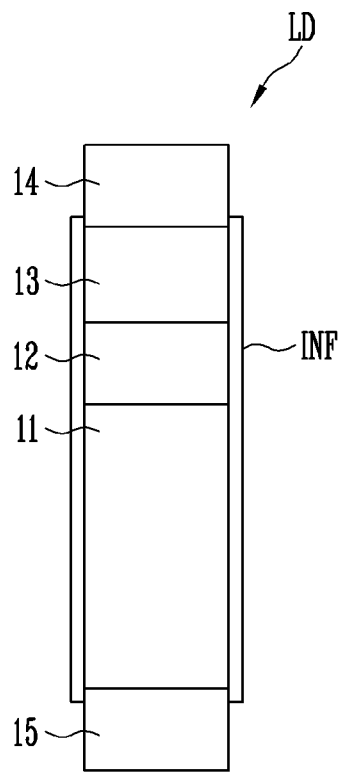

For example, as illustrated in FIGS. 2A and 2B, the light emitting element LD may further include at least one electrode layer 14 disposed on one end of the second conductivity type semiconductor layer 13. In an embodiment, as illustrated in FIGS. 3A and 3B, the light emitting element LD may further include at least one electrode layer 15 disposed on one end of the first conductivity type semiconductor layer 11.

Each of the electrode layers 14 and 15 may be an ohmic contact electrode, but the disclosure is not limited thereto. Each of the electrode layers 14 and 15 may include metal or metal oxide. For example, each of the electrode layers 14 and 15 may be formed of transparent electrode materials such as chromium (Cr), titanium (Ti), aluminum (Al), gold (Au), nickel (Ni), oxides or alloys thereof, indium tin oxide (ITO), indium zinc oxide (IZO), zinc oxide (ZnO), or indium tin zinc oxide (ITZO) alone or in combination. In an embodiment, the electrode layers 14 and 15 may be substantially transparent or translucent. Therefore, light generated from the light emitting element LD may be emitted to the outside after passing through the electrode layers 14 and 15.

In an embodiment, the insulating film INF may at least partially enclose the outer circumferential surfaces of the electrode layers 14 and 15 or may not enclose the outer circumferential surfaces. In other words, the insulating film INF may be selectively formed on the surfaces of the electrode layers 14 and 15. Furthermore, the insulating film INF may be formed to expose the opposite ends of the light emitting element LD that have different polarities and, for example, may expose at least an area of each of the electrode layers 14 and 15. As another example, in an embodiment, the insulating film INF may not be provided.

If the insulating film INF is provided on the surface of the light emitting element LD, particularly, on the surface of the active layer 12, the active layer 12 may be prevented from short-circuiting with at least one electrode which is not shown (e.g., at least one contact electrode of contact electrodes connected to the opposite ends of the light emitting element LD, etc.). Therefore, the electrical stability of the light emitting element LD may be secured. In the description of each embodiment of the disclosure, the term "connecting or connection (or coupling)" may comprehensively refer to physical and/or electrical connecting or connection (or coupling). Furthermore, the term "connecting or connection (or coupling)" may comprehensively refer to direct and/or indirect connecting or connection (or coupling) and integral or non-integral connecting or connection.

Furthermore, thanks to the insulating film INF formed on the surface of the light emitting element LD, occurrence of a defect in the surface of the light emitting element LD may be reduced and minimized, whereby the lifetime and efficiency of the light emitting element LD may be improved. If the insulating film INF is formed on the surface of each light emitting element LD, even in case that light emitting elements LD are disposed adjacent to each other, the light emitting elements LD may be prevented from undesirably short-circuiting.

In an embodiment, a surface treatment process may be performed to fabricate the light emitting element LD. For example, each light emitting element LD may be surface-treated so that, in case that the light emitting elements LD are mixed with a fluidic solution (or solvent) and supplied to each emission area (e.g., an emission area of each pixel), the light emitting elements LD may be evenly dispersed rather than unevenly aggregating or agglomerating in the solution.

In an unlimited embodiment pertaining thereto, the insulating film INF itself may be formed of a hydrophobic film by using a hydrophobic material, or an additional hydrophobic film formed of a hydrophobic material may be formed on the insulating film INF. In an embodiment, the hydrophobic material may be a material containing fluorine to exhibit hydrophobicity. In an embodiment, the hydrophobic material may be applied to the light emitting elements LD in the form of a self-assembled monolayer (SAM). The hydrophobic material may include octadecyl trichlorosilane, fluoroalkyl trichlorosilane, perfluoroalkyl triethoxysilane, etc. Furthermore, the hydrophobic material may be a commercially available fluorine containing material such as Teflon™ or Cytop™, or a corresponding material.

A light emitting device including the light emitting element LD described above may be used not only in a display device but also in various devices which require a light source. For instance, at least one subminiature light emitting element LD, e.g., subminiature light emitting elements LD each having a size ranging from the nanometer scale to the micrometer scale, may be disposed in each pixel area of the display panel to form a light source (or a light source unit) of the corresponding pixel including the subminiature light emitting elements LD. Furthermore, the field of application of the light emitting element LD according to the disclosure is not limited to a display device. For example, the light emitting element LD may be used in other types of devices such as a lighting device, which requires a light source.

Figure 4:
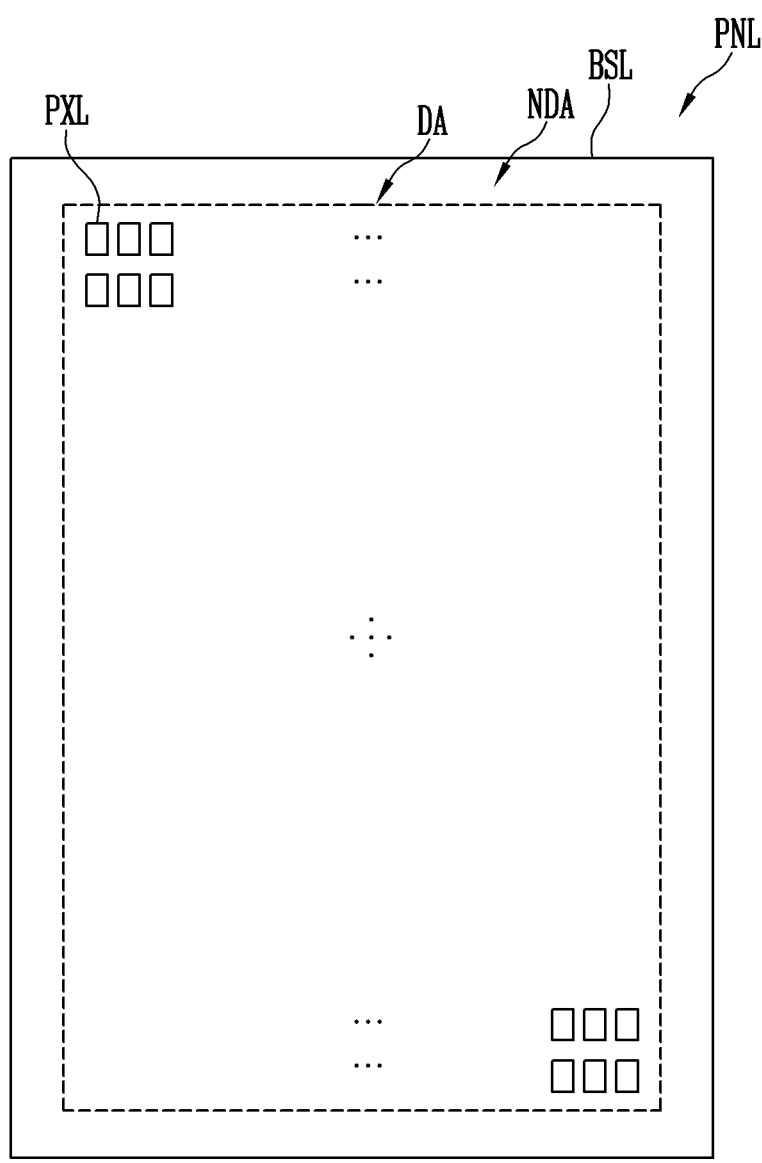
FIG. 4 is a plan view schematically illustrating a display device in accordance with an embodiment of the disclosure.

FIG. 4 is a schematic plan view illustrating a display device in accordance with an embodiment. In an embodiment, FIG. 4 illustrates a display device, particularly, a display panel PNL provided in the display device, as an example of a device which may use, as a light source, the light emitting element LD described with reference to FIGS. 1A to 3B. For example, each of pixels PXL of the display panel PNL may include at least one light emitting element LD.

For the sake of explanation, FIG. 4 simply illustrates the structure of the display panel PNL, focusing on a display area DA. In some embodiments, although not illustrated in the drawings, at least one driving circuit (e.g., at least one of a scan driver and a data driver) and/or lines may be further provided in the display panel PNL.

Referring to FIG. 4, the display panel PNL in accordance with an embodiment may include a base layer BSL and pixels PXL disposed on the base layer BSL. In detail, the display panel PNL and the base layer BSL for forming the display panel PNL may include a display area DA for displaying an image, and a non-display area NDA formed in an area other than the display area DA. The pixels PXL may be disposed in the display area DA of the base layer BSL.

In an embodiment, the display area DA may be disposed in a central area of the display panel PNL, and the non-display area NDA may be disposed in a perimetric area of the display panel PNL in such a way as to enclose the display area DA. The locations of the display area DA and the non-display area NDA are not limited thereto, and the locations thereof may be changed. The display area DA may form a screen in which an image is displayed.

The base layer BSL may form a base of the display panel PNL. In an embodiment, the base layer BSL may be a rigid or flexible substrate or film, and the material or properties thereof are not particularly limited. For example, the base layer BSL may be a rigid substrate made of glass or reinforced glass, a flexible substrate (or a thin film) formed of plastic or metal, or at least one insulating layer, and the material and/or properties thereof are not particularly limited.

Furthermore, the base layer BSL may be transparent, but the disclosure is not limited thereto. For instance, the base layer BSL may be a transparent, translucent, opaque, or reflective base.

An area of the base layer BSL may be defined as the display area DA in which the pixels PXL are disposed, and the other area thereof may be defined as the non-display area NDA. For example, the base layer BSL may include the display area DA including pixel areas in which the respective pixels PXL are formed, and the non-display area NDA disposed around the display area DA. Various lines and/or internal circuits which are electrically connected to the pixels PXL of the display area DA may be disposed in the non-display area NDA.

In an embodiment, the pixels PXL may be disposed in each pixel area of the display area DA. In an embodiment, the pixels PXL may be arranged in the display area DA in a stripe or PenTile® arrangement, but the disclosure is not limited thereto. For example, the pixels PXL may be arranged in the display area DA in various arrangements.

Each pixel PXL may include at least one light source which is driven by a predetermined control signal (e.g., a scan signal and a data signal) and/or a predetermined power voltage (e.g., a first power voltage and a second power voltage). For example, each of the pixels PXL may include a light emitting element LD in accordance with one of the embodiments of FIGS. 1A to 3B, e.g., at least one subminiature rod-type light emitting element LD having a small size corresponding to the nanometer scale or the micrometer scale. However, in embodiments, the type of the light emitting element LD which may be used as a light source of the pixel PXL is not limited thereto. For example, in an embodiment, each pixel PXL may include a light emitting element LD that has a core-shell structure and is fabricated by a growth method. In an embodiment, the light emitting element having the core-shell structure may be a subminiature light emitting element having a core-shell structure and a small size corresponding to the nanometer scale to the micrometer scale, but the size of the light emitting element having the core-shell structure is not limited thereto.

In an embodiment, each pixel PXL may be formed of an active pixel. However, the types, structures, and/or driving methods of the pixels PXL capable of being applied to the display device according to the disclosure are not particularly limited. For example, each pixel PXL may have the same structure as that of a pixel for passive or active light emitting display devices which have various structures and/or may be operated by various driving methods.

FIGS. 5A to 5F are circuit diagrams each schematically illustrating a pixel PXL in accordance with an embodiment. For example, FIGS. 5A to 5F illustrate different embodiments of the pixel PXL which may be applied to an active display device. However, the types of pixels PXL and display devices to which embodiments may be applied are not limited thereto. In an embodiment, each pixel PXL illustrated in FIGS. 5A to 5F may be one of the pixels PXL provided in the display panel PNL of FIG. 4. The pixels PXL may have substantially the same or similar structure.

Figure 5A:
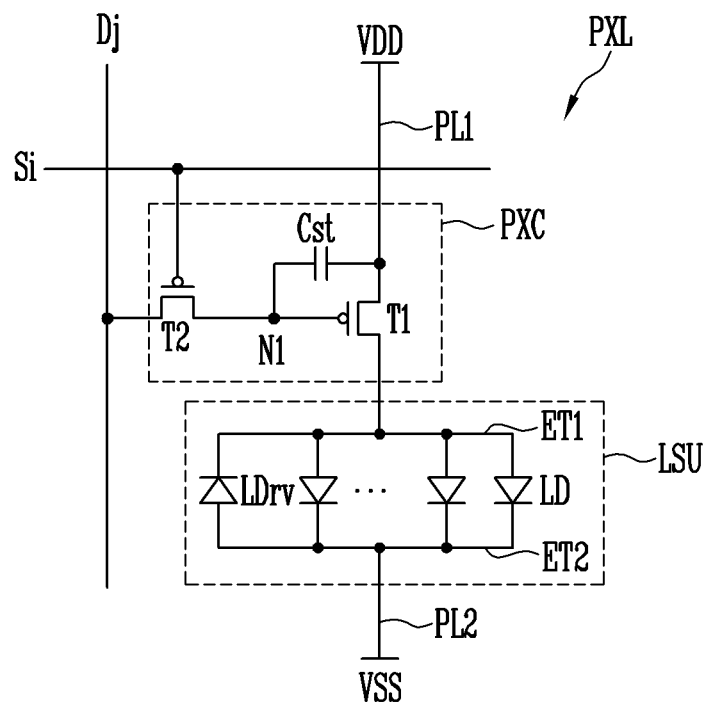
FIGS. 5A to 5F are circuit diagrams each schematically illustrating a pixel in accordance with an embodiment of the disclosure.

Referring to FIG. 5A, the pixel PXL in accordance with an embodiment may include a light source unit LSU configured to generate light having a luminance corresponding to a data signal. The pixel PXL may selectively further include a pixel circuit PXC configured to drive the light source unit LSU.

In an embodiment, the light source unit LSU may include light emitting elements LD that are electrically connected between a first power voltage VDD and a second power voltage VSS. For example, the light source unit LSU may include a first electrode ET1 electrically connected to the first power voltage VDD via the pixel circuit PXC and a first power line PL1, a second electrode ET2 electrically connected to the second power voltage VSS through a second power line PL2, and light emitting elements LD electrically connected in parallel to each other in the same direction between the first and second electrodes ET1 and ET2. In an embodiment, the first electrode ET1 may be an anode electrode, and the second electrode ET2 may be a cathode electrode.

In an embodiment, each of the light emitting elements LD may include a P-type end electrically connected to the first power voltage VDD through the first electrode ET1 and an N-type end electrically connected to the second power voltage VSS through the second electrode ET2. For example, the light emitting elements LD may be electrically connected in parallel between the first electrode ET1 and the second electrode ET2 in a forward direction. Therefore, each of the light emitting elements LD electrically connected in a forward direction between the first power voltage VDD and the second power voltage VSS may form a valid light source. A group of valid light sources may form the light source unit LSU of the pixel PXL.

In an embodiment, the first and second power voltages VDD and VSS may have different potentials to make it possible for the light emitting elements LD to emit light. For example, the first power voltage VDD may be set as a high-potential power voltage, and the second power voltage VSS may be set as a low-potential power voltage. Here, a difference in potential between the first and second power voltages VDD and VSS may be set to a threshold voltage of the light emitting elements LD or higher during at least a light emission period of the pixel PXL.

In an embodiment, the first ends (e.g., the P-type ends) of the light emitting elements LD that form each light source unit LSU may be electrically connected in common to the pixel circuit PXC through an electrode of the light source unit LSU (e.g., the first electrode ET1 (referred also as to "first pixel electrode" or "first alignment electrode") of each pixel PXL), and be electrically connected to the first power voltage VDD through the pixel circuit PXC and the first power line PL1. The second ends (e.g., the N-type ends) of the light emitting elements LD may be electrically connected in common to the second power voltage VSS through another electrode of the light source unit LSU (e.g., a second electrode ET2 (referred also as to "second pixel electrode" or "second alignment electrode") of each pixel PXL) and the second power line PL2.

The light emitting elements LD of the light source unit LSU may emit light having a luminance corresponding to driving current supplied thereto through the pixel circuit PXC. For example, during each frame period, the pixel circuit PXC may supply, to the light source unit LSU, driving current corresponding to a grayscale value of data of the corresponding frame. The driving current supplied to the light source unit LSU may be divided into parts that flow to the light emitting elements LD electrically connected in the forward direction. Therefore, each of the light emitting elements LD may emit light having a luminance corresponding to current applied thereto, so that the light source unit LSU may emit light having a luminance corresponding to the driving current.

In an embodiment, the light source unit LSU may further include at least one invalid light source, as well as including the light emitting elements LD that form each valid light source. For example, at least one reverse light emitting element LDrv may be further electrically connected between the first and second electrodes ET1 and ET2 of the light source unit LSU.

Each reverse light emitting element LDrv, along with the light emitting elements LD that form the valid light sources, may be electrically connected in parallel to each other between the first and second electrodes ET1 and ET2, and may be electrically connected between the first and second electrodes ET1 and ET2 in a direction opposite to that of the light emitting elements LD. For example, the N-type end of the reverse light emitting element LDrv may be electrically connected to the first power voltage VDD via the first electrode ET1 and the pixel circuit PXC. The P-type end of the reverse light emitting element LDrv may be electrically connected to the second power voltage VSS via the second electrode ET2. Even in case that a predetermined driving voltage (e.g., a normal directional driving voltage) is applied between the first and second electrodes ET1 and ET2, the reverse light emitting element LDrv remains deactivated. Therefore, current substantially does not flow through the reverse light emitting element LDrv.

The pixel circuit PXC may be electrically connected to a scan line Si and a data line Dj of the corresponding pixel PXL. For example, if the pixel PXL is disposed in an i-th row (where i is a natural number) and a j-th column (where j is a natural number) of the display area DA, the pixel circuit PXC of the pixel PXL may be electrically connected to an i-th scan line Si and a j-th data line Dj of the display area DA. In an embodiment, the pixel circuit PXC may include first and second transistors T1 and T2 and a storage capacitor Cst.

The first transistor T1 (also referred to as "driving transistor") is electrically connected between the first power voltage VDD and the light source unit LSU. A gate electrode of the first transistor T1 is electrically connected to a first node N1. The first transistor T1 may control driving current to be supplied to the light source unit LSU in response to the voltage of the first node N1.

The second transistor T2 (also referred to as "switching transistor") may be electrically connected between the data line Dj and the first node N1. A gate electrode of the second transistor T2 is electrically connected to the scan line Si. In case that a scan signal having a gate-on voltage (e.g., a low-level voltage) is supplied from the scan line Si, the second transistor T2 is turned on to electrically connect the first node N1 to the data line Dj.

During each frame period, a data signal of a corresponding frame is supplied to the data line Dj. The data signal is transmitted to the first node N1 via the second transistor T2. Therefore, a voltage corresponding to the data signal is charged to the storage capacitor Cst.

An electrode of the storage capacitor Cst is electrically connected to the first power voltage VDD, and another electrode thereof is electrically connected to the first node N1. The storage capacitor Cst may charge a voltage corresponding to a data signal to be supplied to the first node N1 during each frame period.

Although FIG. 5A illustrates that the transistors, e.g., the first and second transistors T1 and T2, included in the pixel circuit PXC have been illustrated as being formed of P-type transistors, the disclosure is not limited thereto. In other words, at least one of the first and second transistors T1 and T2 may be changed to an N-type transistor.

Figure 5B:
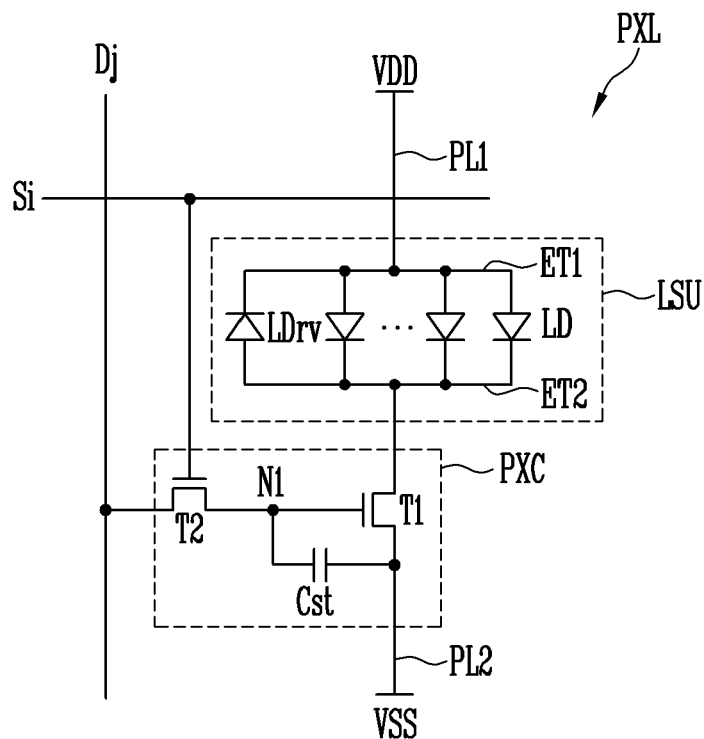

For example, as shown in FIG. 5B, both the first and second transistors T1 and T2 may be formed of N-type transistors. The gate-on voltage of the scan signal for writing the data signal, supplied to the data line Dj in each frame period, to the pixel PXL may be a high-level voltage (also referred to as "gate-high voltage"). Likewise, the voltage of the data signal for turning on the first transistor T1 may be a voltage having a level opposite to that of the embodiment of FIG. 5A. For example, in the embodiment of FIG. 5B, as a grayscale value that is to be expressed increases, a data signal having a higher voltage may be supplied.

In an embodiment, an interconnection position between the pixel circuit PXC and the light source unit LSU may be changed. For example, as illustrated in FIG. 5B, in case that both the first and second transistors T1 and T2 that form the pixel circuit PXC are N-type transistors, the pixel circuit PXC may be electrically connected between the light source unit LSU and the second power voltage VSS, and the storage capacitor Cst may be electrically connected between the first node N1 and the second power voltage VSS. However, the disclosure is not limited thereto. For example, in an embodiment, even if the pixel circuit PXC is formed of N-type transistors, the pixel circuit PXC may be electrically connected between the first power voltage VDD and the light source unit LSU, and the storage capacitor Cst may be electrically connected between the first node N1 and the first power voltage VDD.

The configuration and operation of the pixel PXL shown in FIG. 5B are substantially similar to those of the pixel PXL of FIG. 5A, except that the connection positions of some circuit elements and the voltage levels of control signals (e.g., a scan signal and a data signal) are changed depending on a change in type of the transistor. Therefore, detailed descriptions of the pixel PXL of FIG. 5B will be omitted.

The structure of the pixel circuit PXC is not limited to that in the embodiments shown in FIGS. 5A and 5B. In other words, the pixel circuit PXC may be formed of a pixel circuit which may have various structures and/or be operated by various driving methods. For example, the pixel circuit PXC may be configured in the same manner as that of an embodiment illustrated in FIG. 5C.

Figure 5C:
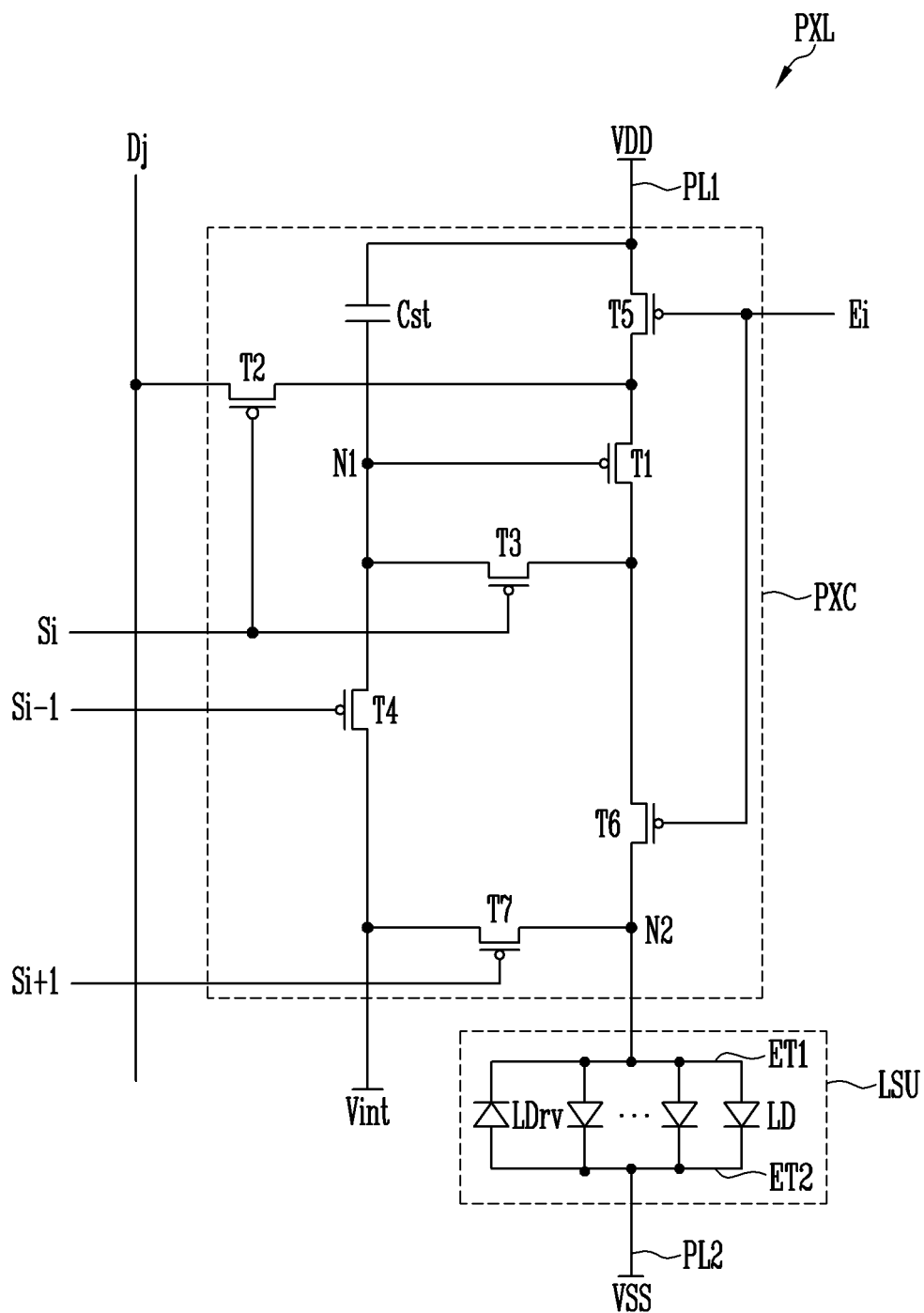

Referring to FIG. 5C, the pixel circuit PXC may be electrically connected not only to a scan line Si of a corresponding horizontal line but also to at least one another scan line (or at least one another control line). For example, the pixel circuit PXC of the pixel PXL disposed in the i-th row of the display area DA may be further electrically connected to an i−1-th scan line Si−1 and/or an i+1-th scan line Si+1. In an embodiment, the pixel circuit PXC may be electrically connected not only to the first and second power voltages VDD and VSS but also to a third power voltage. For instance, the pixel circuit PXC may also be electrically connected to an initialization power voltage Vint. In an embodiment, the pixel circuit PXC may include first to seventh transistors T1 to T7 and a storage capacitor Cst.

The first transistor T1 may be electrically connected between the first power voltage VDD and the light source unit LSU. For example, a first electrode (e.g., a source electrode) of the first transistor T1 may be electrically connected to the first power voltage VDD through the fifth transistor T5 and the first power line PL1, and a second electrode (e.g., a drain electrode) of the first transistor T1 may be electrically connected via the sixth transistor T6 to the first electrode ET1 of the light source unit LSU (e.g., the first contact electrode and/or the first pixel electrode of the corresponding pixel PXL). A gate electrode of the first transistor T1 is electrically connected to a first node N1. The first transistor T1 may control driving current to be supplied to the light source unit LSU in response to the voltage of the first node N1.

The second transistor T2 is electrically connected between the data line Dj and the first electrode of the first transistor T1. A gate electrode of the second transistor T2 is electrically connected to the corresponding scan line Si. In case that a scan signal having a gate-on voltage is supplied from the scan line Si, the second transistor T2 may be turned on to electrically connect the data line Dj to the first electrode of the first transistor T1. Therefore, if the second transistor T2 is turned on, a data signal supplied from the data line Dj may be transmitted to the first transistor T1.

The third transistor T3 is electrically connected between the other electrode of the first transistor T1 and the first node N1. A gate electrode of the third transistor T3 is electrically connected to the corresponding scan line Si. In case that a scan signal having a gate-on voltage is supplied from the scan line Si, the third transistor T3 may be turned on to electrically connect the first transistor T1 in the form of a diode.

The fourth transistor T4 may be electrically connected between the first node N1 and the initialization power voltage Vint. A gate electrode of the fourth transistor T4 is electrically connected to a preceding scan line, e.g., an i−1-th scan line Si−1. In case that a scan signal of a gate-on voltage is supplied to the i−1-th scan line Si−1, the fourth transistor T4 may be turned on so that the voltage of the initialization power voltage Vint may be transmitted to the first node N1. In an embodiment, in case that the first transistor T1 is a P-type transistor, the voltage of the initialization power voltage Vint for initializing the gate voltage of the first transistor T1 may be the lowest voltage of the data signal or less.

The fifth transistor T5 is electrically connected between the first power voltage VDD and the first transistor T1. A gate electrode of the fifth transistor T5 is electrically connected to a corresponding emission control line, e.g., an i-th emission control line Ei. The fifth transistor T5 may be turned off in case that an emission control signal having a gate-off voltage (e.g., a high-level voltage) is supplied to the emission control line Ei, and may be turned on in other cases.

The sixth transistor T6 is electrically connected between the first transistor T1 and the light source unit LSU. A gate electrode of the sixth transistor T6 is electrically connected to a corresponding emission control line, e.g., the i-th emission control line Ei. The sixth transistor T6 may be turned off in case that an emission control signal having a gate-off voltage is supplied to the emission control line Ei, and may be turned on in other cases.

The seventh transistor T7 is electrically connected between a second node N2, which is electrically connected to the first electrode of the light source unit LSU (e.g., the first pixel electrode ET1 of the corresponding pixel PXL), and the initialization power voltage Vint. A gate electrode of the seventh transistor T7 is electrically connected to one of scan lines of a subsequent stage (a subsequent horizontal pixel row), e.g., to the i+1-th scan line Si+1. In case that a scan signal of a gate-on voltage is supplied to the i+1-th scan line Si+1, the seventh transistor T7 may be turned on so that the voltage of the initialization power voltage Vint may be supplied to the first electrode of the light source unit LSU. During each initialization period in which the voltage of the initialization power voltage Vint is transmitted to the light source unit LSU, the voltage of the first electrode of the light source unit LSU may be initialized. The control signal for controlling the operation of the seventh transistor T7 may be changed in various ways. For example, in an embodiment, the gate electrode of the seventh transistor T7 may be electrically connected to a scan line of a corresponding horizontal line, for example, an i-th scan line Si. In case that a scan signal having a gate-on voltage is supplied to the i-th scan line Si, the seventh transistor T7 may be turned on so that the voltage of the initialization power voltage Vint may be supplied to the first electrode of the light source unit LSU.

The storage capacitor Cst may be electrically connected between the first power voltage VDD and the first node N1. The storage capacitor Cst may store a voltage corresponding to the data signal applied to the first node N1 during each frame period and/or to the threshold voltage of the first transistor T1.

Although in FIG. 5C the transistors, e.g., the first to seventh transistors T1 to T7, included in the pixel circuit PXC have been illustrated as being formed of P-type transistors, the disclosure is not limited thereto. For example, at least one of the first to seventh transistors T1 to T7 may be changed to an N-type transistor.

Figure 5D:
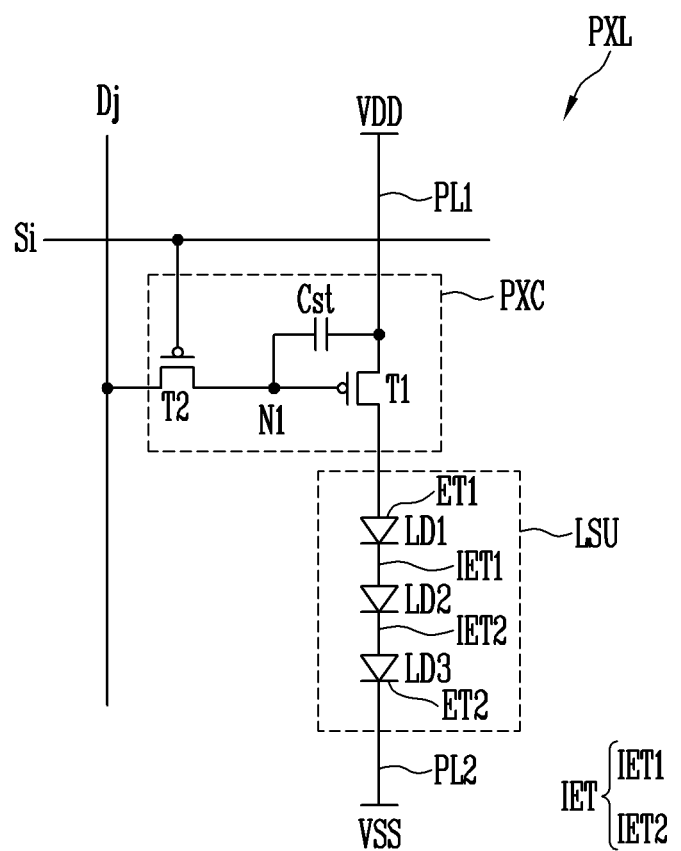
Figure 5E:
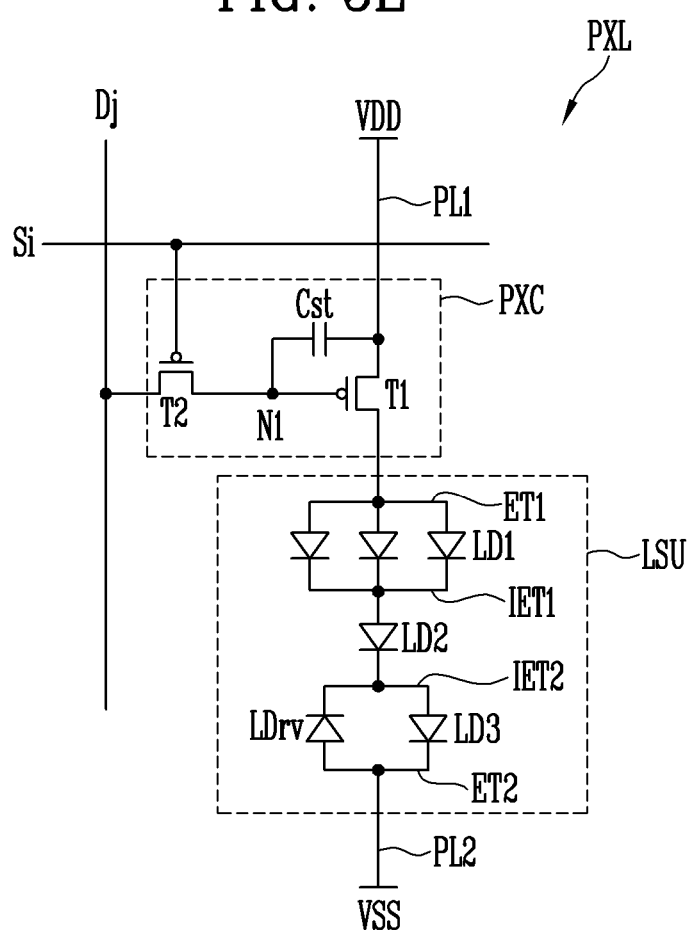
Figure 5F:
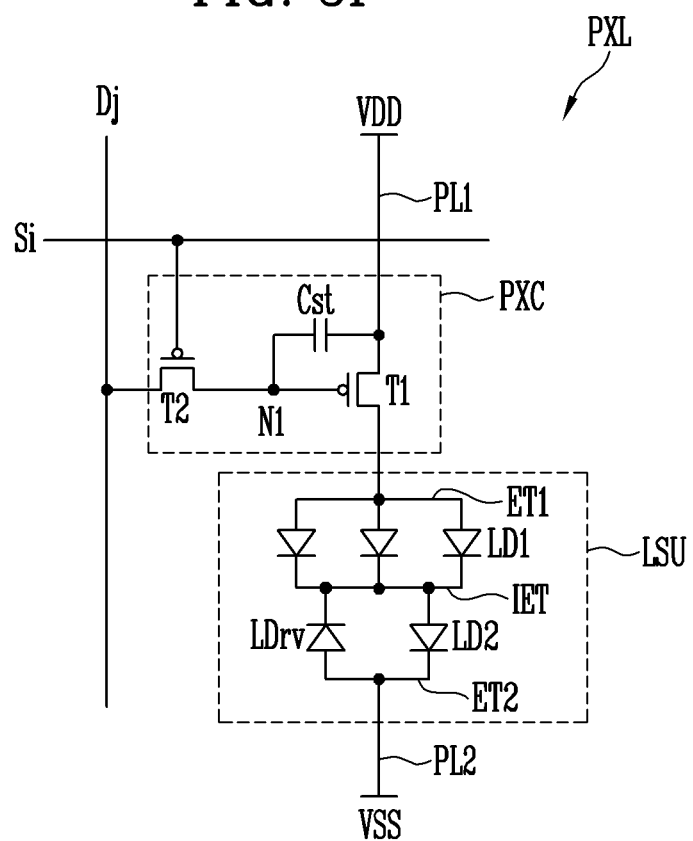

Although FIGS. 5A to 5C illustrate embodiments in which all valid light sources, for example, light emitting elements LD, constituting each light source unit LSU are electrically connected in parallel to each other, the disclosure is not limited thereto. For example, in an embodiment, as illustrated in FIGS. 5D to 5F, the light source unit LSU of each pixel PXL may include a serial connection structure. In the following descriptions of embodiments of FIGS. 5D to 5F, detailed descriptions of components (e.g., the pixel circuit PXC) similar or equal to those of the embodiments of FIGS. 5A to 5C will be omitted.

Referring to FIG. 5D, the light source unit LSU may include at least two light emitting elements electrically connected in series to each other. For example, the light source unit LSU may include a first light emitting element LD1, a second light emitting element LD2, and a third light emitting element LD3 which are electrically connected in series in a forward direction between the first power voltage VDD and the second power voltage VSS and thus form each valid light source. Hereinafter, in case that a specific light emitting element among the first, second, and third light emitting elements LD1, LD2, and LD3 is designated, the corresponding light emitting element will be referred to as "first light emitting element LD1," "second light emitting element LD2," or "third light emitting element LD3," The term "light emitting element LD" or "light emitting elements LD" will be used to arbitrarily designate at least one light emitting element of the first, second, and third light emitting elements LD1, LD2, and LD3 or collectively designate the first, second, and third light emitting elements LD1, LD2, and LD3.

The P-type end of the first light emitting element LD1 may be electrically connected to the first power voltage VDD through the first electrode ET1 of the light source unit LSU or the like. The N-type end of the first light emitting element LD1 may be electrically connected to the P-type end of the second light emitting element LD2 through a first intermediate electrode IET1. The P-type end of the second light emitting element LD2 may be electrically connected to the N-type end of the first light emitting element LD1. The N-type end of the second light emitting element LD2 may be electrically connected to the P-type end of the third light emitting element LD3 through a second intermediate electrode IET2. The P-type end of the third light emitting element LD3 may be electrically connected to the N-type end of the second light emitting element LD2. The N-type end of the third light emitting element LD3 may be electrically connected to the second power voltage VSS through the second electrode ET2 of the light source unit LSU and the second power line PL2. In this way, the first, second, and third light emitting elements LD1, LD2, and LD3 may be successively connected in series between the first and second electrodes ET1 and ET2 of the light source unit LSU.

Although FIG. 5D illustrates an embodiment where the light emitting elements LD are electrically connected to have a three-stage serial structure, the disclosure is not limited thereto. For example, in an embodiment, two light emitting elements LD may be electrically connected to have a two-stage serial structure, or four or more light emitting elements LD may be electrically connected to have a four- or more-stage serial structure.

In case that it is assumed that the same luminance is expressed (or displayed) with light emitting elements LD having the same conditions (e.g., the same size and/or number), in a light source unit LSU having a structure in which light emitting elements LD are electrically connected to each other in series, the voltage to be applied between the first and second electrodes ET1 and ET2 may be increased, and the amount of driving current flowing to the light source unit LSU may be reduced, compared to a light source unit LSU having a structure in which light emitting elements LD are electrically connected in parallel. Therefore, in case that the serial connection structure of the light emitting elements LD is used to form the light source unit LSU of each pixel PXL, panel current flowing through the display panel PNL may be reduced as the display device is driven. Therefore, power loss may be reduced, so that the efficiency may be improved, and the power consumption may be reduced. Furthermore, the size of driving current to be supplied to the light source unit LSU to express each grayscale may be reduced, so that the driving transistor of the pixel PXL (e.g., the first transistor T1) and/or an output terminal buffer of the driving circuit (e.g., an amplifier circuit of each channel) may be reduced in size.

In the light source unit LSU in which the light emitting elements LD are electrically connected only in parallel to each other, in case that a short-circuit defect occurs in at least one of the light emitting elements LD, driving current flows through the defective light emitting element, and thus the driving current may not smoothly flow through the other light emitting elements LD. As a result, a black spot defect may occur. However, in the light source unit LSU in which the light emitting elements LD are electrically connected in a serial structure having at least two stages, even in case that a short-circuit defect occurs in some serial stages, driving current may flow through the light emitting elements LD of the other serial stages so that the light emitting elements LD of the other serial stages may emit light.

In an embodiment, at least one serial stage may include light emitting elements LD electrically connected in parallel to each other. In this case, the light source unit LSU may have a serial/parallel combination structure. For example, the light source unit LSU may be configured as illustrated in the embodiment of FIG. 5E.

Referring to FIG. 5E, at least one serial stage that forms the light source unit LSU may include light emitting elements LD electrically connected in parallel to each other in a forward direction. For example, the light source unit LSU may include first light emitting elements LD1 disposed in a first serial stage (also referred to as "first stage" or "first row"), at least one second light emitting element LD2 disposed in a second serial stage (also referred to as "second stage" or "second row") subsequent to the first serial stage, and at least one third light emitting element LD3 disposed in a third serial stage (also referred to as "third stage" or "third row") subsequent to the second serial stage.

Although FIG. 5E illustrates an embodiment where first light emitting elements LD1 are electrically connected to each other in the forward direction in only the first serial stage, the disclosure is not limited thereto. For example, in an embodiment, in each of serial stages (e.g., all serial stages that form the corresponding light source unit LSU), light emitting elements LD may be electrically connected in the forward direction.

Although FIG. 5E illustrates the light source unit LSU including light emitting elements LD disposed in three serial stages, the disclosure is not limited thereto. For example, the light source unit LSU may include light emitting elements LD disposed in only two serial stages, as illustrated in FIG. 5F. For example, the light source unit LSU may include at least one first light emitting element LD1 disposed in a first serial stage and having a P-type end and an N-type end which are respectively electrically connected to a first electrode ET1 and an intermediate electrode IET, and at least one second light emitting element LD2 that is disposed in a second serial stage and has a P-type end and an N-type end which are respectively electrically connected to the intermediate electrode IET and a second electrode ET2.

The number of serial stages that form the light source unit LSU may be changed in various ways. For example, the light source unit LSU may include light emitting elements LD distributed in four or more serial stages. Furthermore, the number of light emitting elements LD electrically connected in the forward direction in each serial stage may be changed in various ways. In an embodiment, the numbers of light emitting elements LD included in the pixels PXL disposed in the display area (DA of FIG. 4) may be identical or similar to each other. For example, at the step of supplying the light emitting elements LD to each pixel PXL, the light emitting elements LD may be aligned in such a way that light emitting element ink (also referred to as "light emitting element solution") including the light emitting elements LD is controlled to be uniformly applied to an emission area of each pixel PXL, and an electric field is controlled to be applied to each pixel PXL under uniform conditions. In this way, the light emitting elements LD may be relatively uniformly supplied to and aligned in each pixel PXL.

In an embodiment, as illustrated in FIGS. 5E and 5F, each pixel PXL may further include at least one reverse light emitting element LDrv disposed in at least one serial stage. For example, at least one of serial stages may further include at least one reverse light emitting element LDrv electrically connected in a direction opposite to that of the light emitting elements LD.

Even in case that the reverse light emitting element LDrv is electrically connected to at least one serial stage, the driving current of the pixel PXL may flow successively via the serial stages if at least one valid light source (e.g., the first, second, and/or third light emitting elements LD1, LD2, and LD3) electrically connected in the forward direction in the serial stage is disposed. Therefore, the light source unit LSU may emit light at a luminance corresponding to the driving current.

As such, in case that the light source unit LSU of each pixel PXL is configured by electrically connecting light emitting elements LD having a serial connection structure (e.g., electrically connecting all of the light emitting elements LD only in series or in a serial/parallel combination structure), driving current/voltage conditions may be readily controlled to correspond to specifications of a desired product. For example, as shown in the embodiments of FIGS. 5D to 5F, in the light source unit LSU in which all of the light emitting elements LD are electrically connected in series or in a serial/parallel combination structure, the driving current may be reduced, and a defect rate resulting from a short-circuit defect may be reduced, compared to those of the light source unit LSU having a structure in which all of the light emitting elements LD are electrically connected in parallel to each other, as shown in the embodiments of FIGS. 5A to 5C. Furthermore, as shown in the embodiments of FIGS. 5E and 5F, in the light source unit LSU in which all of the light emitting elements LD are electrically connected in a serial/parallel combination structure, the driving voltage to be applied between the opposite ends of the light source unit LSU may be reduced, compared to that of the light source unit LSU having a structure in which all of the light emitting elements LD are electrically connected in series, as shown in the embodiment of FIG. 5D.

However, in the pixel PXL having the serial connection structure of the light emitting elements LD, the probability of occurrence of an open defect may be higher than that of the pixel PXL having only a parallel connection structure. For example, in the pixel PXL in which the light emitting elements LD are electrically connected in a serial structure or a serial/parallel combination structure to form the light source unit LSU, if there is no light emitting element LD validly connected in the forward direction between a pair of electrodes that forms any one serial stage, a current path along which the driving current can flow in the pixel PXL is blocked, whereby an open defect may occur. In the pixel PXL in which the open defect has occurred, the driving current cannot flow therethrough, so that all of the light emitting elements LD of the light source unit LSU may not emit light. Therefore, the pixel PXL may be revealed as a dark spot. Detailed descriptions of the open defect which may occur in the pixel PXL having the serial connection structure of the light emitting elements LD will be made below.

As shown in the foregoing embodiments, the pixel PXL may include a pixel circuit PXC and/or a light source unit LSU which may have various structures. The structure of the pixel PXL which may be applied to the disclosure is not limited to the embodiments illustrated in FIGS. 5A to 5F, and each pixel PXL may have various structures. For example, the pixel circuit PXC included in each pixel PXL may be formed of a pixel circuit which may have various structures and/or be operated by various driving methods. In an embodiment, each pixel PXL may be configured in a passive light emitting display device or the like. The pixel circuit PXC may be omitted, and each of the first and second electrodes ET1 and ET2 of the light source unit LSU may be directly connected to the scan line Si, the data line Dj, a power line, and/or a control line.

Figure 6A:
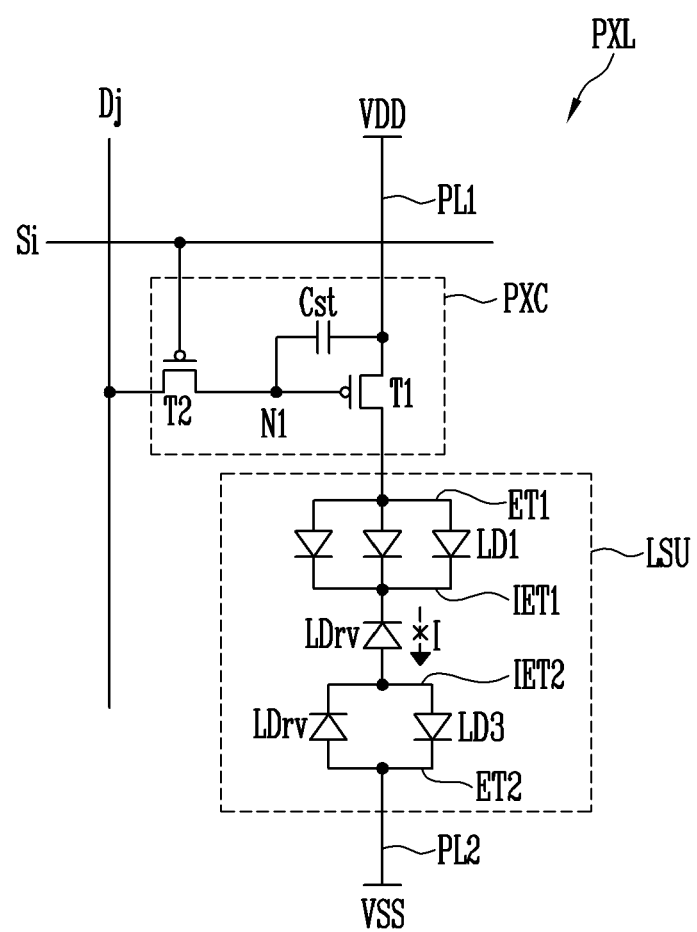
FIGS. 6A and 6B each are circuit diagrams schematically illustrating a pixel in accordance with an embodiment of the disclosure, and for example illustrate different embodiments of a pixel in which an open defect has occurred due to a floating electrode.
Figure 6B:
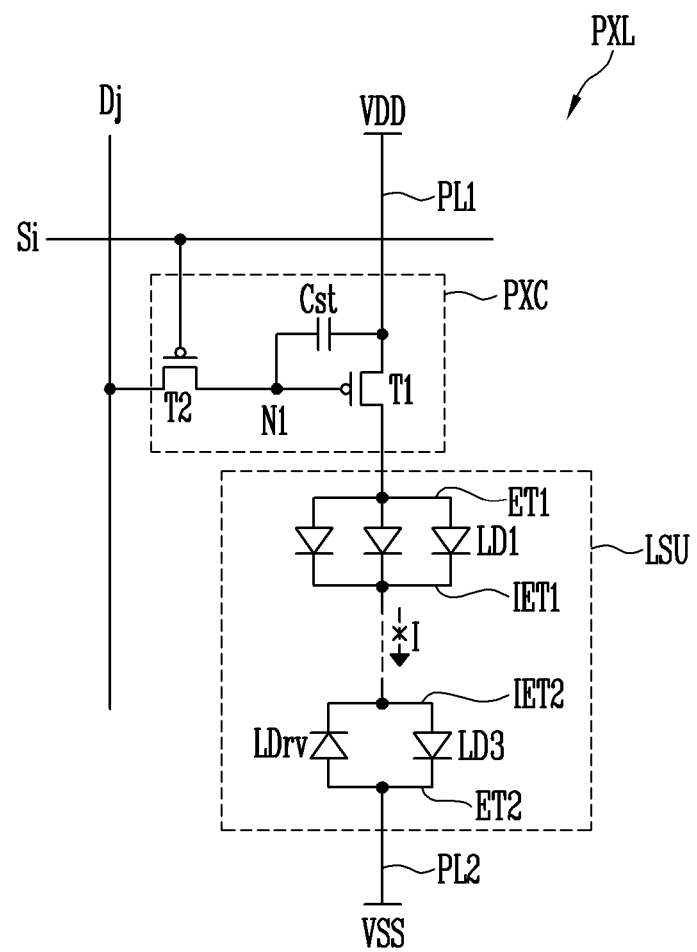

FIGS. 6A and 6B each are circuit diagrams illustrating a pixel PXL in accordance with an embodiment, and for example, illustrate different embodiments of a pixel PXL in which an open defect has occurred due to a floating electrode. In an embodiment, FIGS. 6A and 6B illustrate an example of an open defect which may occur in the pixel PXL according to the embodiment of FIG. 5E, and detailed descriptions similar or equal to those of the embodiments described above will be omitted.

Referring to FIGS. 5E, 6A, and 6B, if there is no light emitting element LD validly connected in the forward direction between a pair of electrodes that form at least one serial stage, an open defect may occur in the corresponding pixel PXL. Therefore, the pixel PXL may be revealed as a dark spot.

For example, as illustrated in FIG. 6A, there is no light emitting element LD electrically connected in the forward direction between first and second intermediate electrodes IET1 and IET2 that form the second serial stage, and only a reverse light emitting element LDrv may be electrically connected therebetween. The first and second intermediate electrodes IET1 and IET2 are not electrically connected to each other, so that the first and second intermediate electrodes IET1 and IET2 remain as floating electrodes that are electrically isolated. Therefore, in the second serial stage, a current path along which driving current I can flow may be blocked.

As another example, as illustrated in FIG. 6B, any light emitting element LD may not be validly connected between the first and second intermediate electrodes IET1 and IET2 that form the second serial stage. The first and second intermediate electrodes IET1 and IET2 are not electrically connected to each other, so that the first and second intermediate electrodes IET1 and IET2 remain as floating electrodes that are electrically isolated from each other. Therefore, in the second serial stage, a current path along which driving current I can flow may be blocked.

Although FIGS. 6A and 6B illustrate an example of the pixel PXL in which an open defect has occurred in the second serial stage, the current path along which the driving current I can flow may be blocked even in case that an open defect occurs in other serial stages. For example, one or more light emitting elements LD may not be validly connected in the forward direction between the first electrode ET1 and the first intermediate electrode IET1 that form the first serial stage. The first intermediate electrode IET1 remains as a floating electrode that is electrically isolated, so that an open defect may occur in the pixel PXL. Likewise, one or more light emitting elements LD may not be validly connected in the forward direction between the second intermediate electrode IET2 and the second electrode ET2 that form the third serial stage. The second intermediate electrode IET2 remains as a floating electrode that is electrically isolated, so that an open defect may occur in the pixel PXL.

In other words, in the pixel PXL having the serial connection structure of the light emitting elements LD, if one or more light emitting elements LD are not validly connected in the forward direction between a pair of electrodes that form each serial stage, there is the probability of occurrence of an open defect in the pixel PXL. Therefore, the following embodiments of the disclosure will propose various structures of pixels PXL in which the power efficiency can be enhanced with the serial connection structure of light emitting elements LD, and an open defect which may occur in the pixel PXL can be readily repaired.

Figure 7:
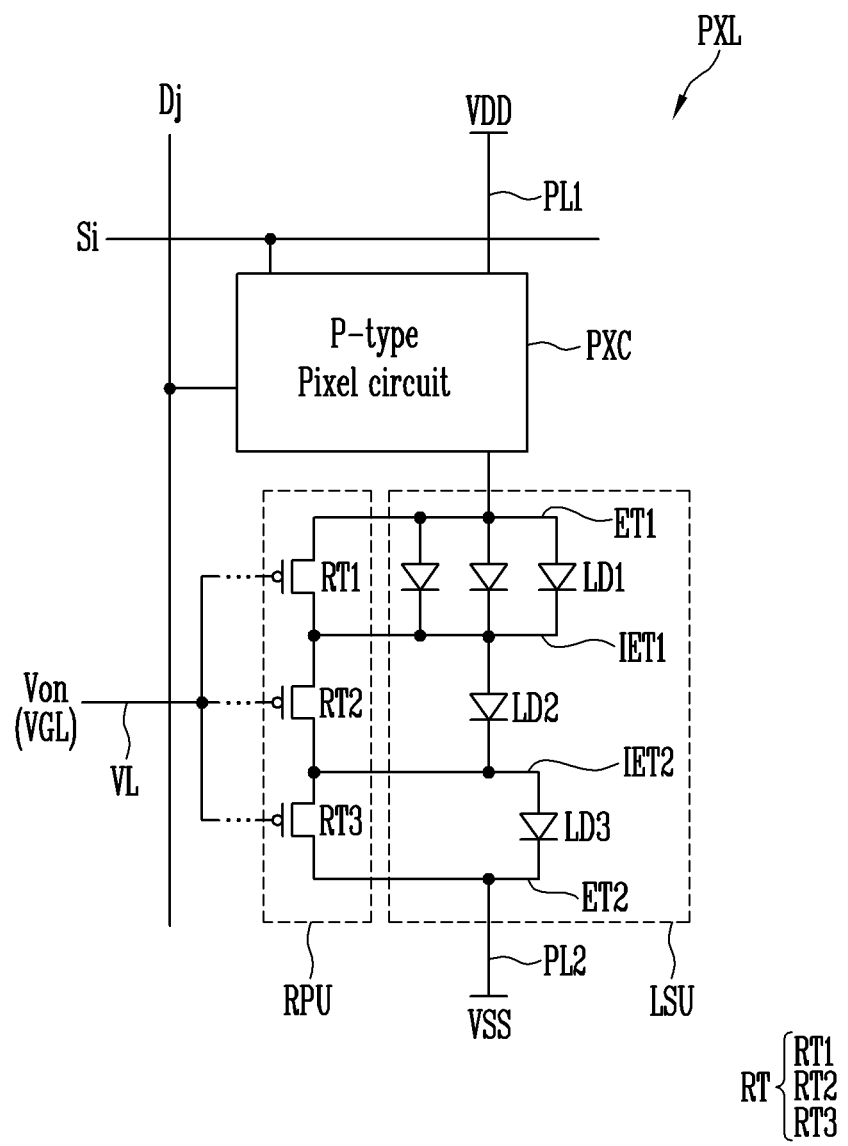
FIG. 7 is a circuit diagram schematically illustrating a pixel in accordance with an embodiment of the disclosure, and for example illustrates an embodiment of a pixel including a repair pattern circuit.
Figure 8A:
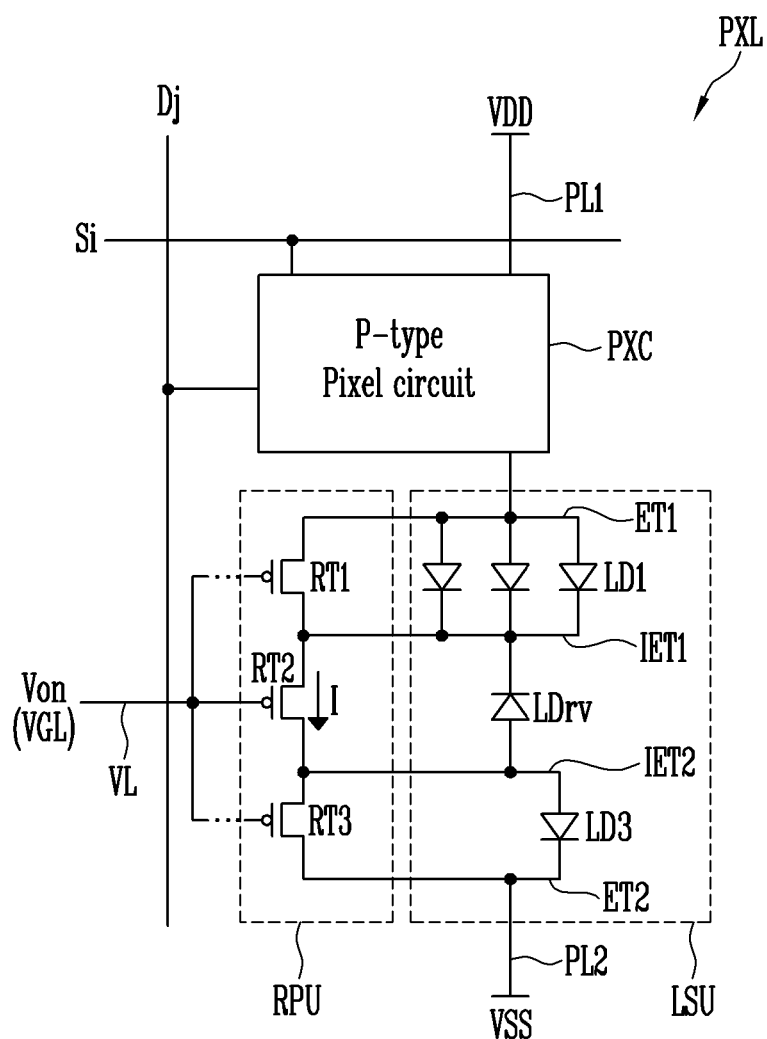
FIGS. 8A and 8B schematically illustrate embodiments of a pixel in which an open defect has been repaired, and for example illustrate embodiments of the pixel of FIG. 7 in which open defects that have occurred due to different reasons have been repaired.
Figure 8B:
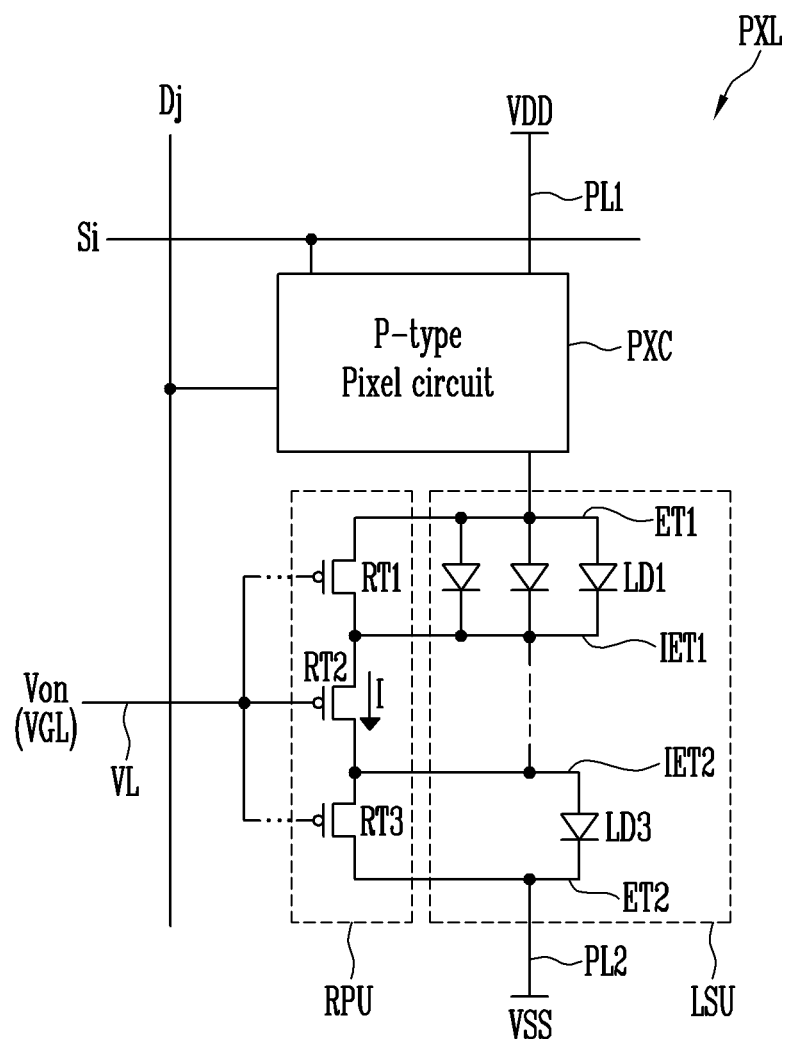

FIG. 7 is a circuit diagram schematically illustrating a pixel PXL in accordance with an embodiment, and for example illustrates an embodiment of the pixel PXL including a repair pattern circuit RPU. FIGS. 8A and 8B illustrate embodiments of the pixel PXL in which an open defect has been repaired, and for example illustrate embodiments of the pixel PXL of FIG. 7 in which open defects that have occurred due to different reasons have been repaired. For the sake of explanation, FIGS. 7 to 8B illustrate the structure of the light source unit LSU, focusing on a valid light source. Furthermore, illustration of a detailed structure of the pixel circuit PXC which may have various shapes as an element which may be selectively provided in each pixel PXL, will be omitted. In the description of the embodiment(s) of FIGS. 7 to 8B, like reference numerals will be used to designate components similar or equal to those of the previous embodiments, and detailed descriptions thereof will be omitted.

Referring to FIG. 7, the pixel PXL in accordance with an embodiment may further include a light source unit LSU and a repair pattern circuit RPU electrically connected to the light source unit LSU. The pixel PXL may selectively further include a pixel circuit PXC electrically connected between the light source unit LSU and the first power voltage VDD.

The pixel circuit PXC may be electrically connected between the first power line PL1 and the first electrode ET1 of the light source unit LSU. The location of the pixel circuit PXC may be changed in various ways depending on embodiments. For example, in an embodiment, the pixel circuit PXC may be electrically connected between the second electrode ET2 of the light source unit LSU and the second power line PL2.

In an embodiment, the pixel circuit PXC may be a P-type pixel circuit including P-type transistors. However, the disclosure is not limited thereto. For example, in an embodiment, the pixel circuit PXC may be formed of N-type transistors, or the pixel circuit PXC may include a combination of at least one P-type transistor and at least one N-type transistor.

The light source unit LSU may include light emitting elements LD disposed in at least two serial stages, and at least three electrodes provided to form the at least two serial stages. For example, it is assumed that the light source unit LSU includes first, second, and third light emitting elements LD1, LD2, and LD3 electrically connected to each other in a three-stage serial or serial/parallel structure. The light source unit LSU may include a pair of electrodes which form a first serial stage, a pair of electrodes which form a second serial stage, and a pair of electrodes which form a third serial stage. Two successive serial stages may share an intermediate electrode.

For example, the light source unit LSU may include a first electrode ET1 and a first intermediate electrode IET1 which form the first serial stage, the first intermediate electrode IET1 and a second intermediate electrode IET2 which form the second serial stage, and the second intermediate electrode IET2 and a second electrode ET2 which form the third serial stage. The first and second serial stages may share the first intermediate electrode IET1. The second and third serial stages may share the second intermediate electrode IET2.

At least one first light emitting element LD1 may be electrically connected in the forward direction between the first electrode ET1 and the first intermediate electrode IET1 of the first serial stage. For example, first light emitting elements LD1 may be electrically connected to each other in the forward direction between the first electrode ET1 and the first intermediate electrode IET1.

At least one second light emitting element LD2 may be electrically connected in the forward direction between the first intermediate electrode IET1 and the second intermediate electrode IET2 of the second serial stage. For example, a single second light emitting element LD2 may be electrically connected in the forward direction between the first and second intermediate electrodes IET1 and IET2. However, the number of second light emitting elements LD2 may be changed. For example, in an embodiment, second light emitting elements LD2 may be electrically connected to each other in the forward direction between the first and second intermediate electrodes IET1 and IET2.

At least one third light emitting element LD3 may be electrically connected in the forward direction between the second intermediate electrode IET2 of the third serial stage and the second electrode ET2. For example, a single third light emitting element LD3 may be electrically connected in the forward direction between the second intermediate electrode IET2 and the second electrode ET2. Here, the number of third light emitting elements LD3 may be changed. For example, in an embodiment, third light emitting elements LD3 may be electrically connected in the forward direction between the second intermediate electrode IET2 and the second electrode ET2.

The repair pattern circuit RPU may include repair patterns corresponding to each serial stage of the light source unit LSU. In an embodiment, each repair pattern may be a repair transistor.

For example, the repair pattern circuit RPU may include a first repair transistor RT1 electrically connected between the first electrode ET1 and the first intermediate electrode IET1 of the first serial stage, a second repair transistor RT2 electrically connected between the first intermediate electrode IET1 and the second intermediate electrode IET2 of the second serial stage, and a third repair transistor RT3 electrically connected between the second intermediate electrode IET2 and the second electrode ET2 of the third serial stage. Hereinafter, in case that a specific repair transistor among the first, second, and third repair transistors RT1, RT2, and RT3 is designated, the corresponding repair transistor will be referred to as "first repair transistor RT1," "second repair transistor RT2," or "third repair transistor RT3." The term "repair transistor RT" or "repair transistors RT" will be used to arbitrarily designate at least one repair transistor of the first, second, and third repair transistors RT1, RT2, and RT3 or collectively designate the first, second, and third repair transistors RT1, RT2, and RT3.

In an embodiment, the repair transistors RT and the transistors that form the pixel circuit PXC may be transistors having the same type. For example, in case that the pixel circuit PXC is a P-type pixel circuit including P-type transistors, each of the repair transistors RT may be formed of a P-type transistor. When desired, at least one repair transistor RT may be turned on by using a gate-on voltage Von (e.g., a gate-low voltage VGL) for turning on the transistors of the pixel circuit PXC (particularly, the switching transistors of each pixel PXL). For example, as needed, a gate electrode of at least one repair transistor RT may be electrically connected to a gate power line VL to which a predetermined gate-on voltage Von is to be supplied, so that the repair transistor RT may be turned on. In other words, if the repair transistors RT and the transistors that form the pixel circuit PXC are formed of transistors having the same type, at least one repair transistor RT may be turned on, as needed, by using a control signal or driving power to be used to drive the pixel circuit PXC.

Each repair transistor RT may be disposed and electrically connected between a pair of electrodes that form a corresponding serial stage. For example, a source electrode and a drain electrode of the first repair transistor RT1 may be respectively electrically connected to the first electrode ET1 and the first intermediate electrode IET1. Likewise, a source electrode and a drain electrode of the second repair transistor RT2 may be respectively electrically connected to the first intermediate electrode IET1 and the second intermediate electrode IET2. A source electrode and a drain electrode of the third repair transistor RT3 may be respectively electrically connected to the second intermediate electrode IET2 and the second electrode ET2.

In an embodiment, in case that at least one light emitting element LD is electrically connected in the forward direction to each serial stage (for example, in case that an open defect does not occur), the gate electrode of each of the repair transistors RT may float and remain electrically isolated. For example, the gate electrode of each of the repair transistors RT may be disposed around the gate-on power line VL and may float and be electrically isolated without being electrically connected to the gate-on power line VL. For example, the gate electrode of each of the repair transistors RT may be disposed to overlap the gate-on power line VL and be electrically separated from the gate-on power line VL by at least one insulating layer.

In case that there is no light emitting element LD electrically connected in the forward direction between a pair of electrodes that form a serial stage, the pair of electrodes may not be electrically connected, and an open defect may thus occur. In an embodiment, the repair transistor RT that corresponds to the serial stage in which the open defect has occurred may be turned on.

In detail, in case that each repair transistor RT is turned on, a pair of electrodes that form the corresponding serial stage may be electrically connected through the repair transistor RT. Therefore, even in case that an open defect or the like occurs in the corresponding serial stage, the driving current may flow through the repair transistor RT corresponding to the corresponding serial stage, so that the light emitting elements LD of the other serial stages may be driven. Therefore, the open defect in the pixel PXL may be repaired, and the pixel PXL may be prevented from being revealed as a dark spot.

For example, as illustrated in the embodiments of FIGS. 8A and 8B, in case that any light emitting element LD is not validly connected in the forward direction between the first and second intermediate electrodes IET1 and IET2 that form the second serial stage (e.g., in case that as illustrated in FIG. 8A, only a reverse light emitting element LDrv is electrically connected between the first and second intermediate electrodes IET1 and IET2, or as illustrated in FIG. 8B, any light source (light emitting element LD or reverse light emitting element LDrv) is not validly connected between the first and second intermediate electrodes IET1 and IET2), the gate electrode of the second repair transistor RT2 may be electrically connected to the gate-on power line VL. Therefore, a gate-on voltage Von may be supplied to the gate electrode of the second repair transistor RT2, so that the second repair transistor RT2 may be turned on. If the second repair transistor RT2 is turned on, the first and second intermediate electrodes IET1 and IET2 are electrically connected to each other through the second repair transistor RT2. Therefore, the driving current I supplied to the light source unit LSU may flow through the second repair transistor RT2, so that the pixel PXL may be prevented from being revealed as a dark spot.

Figure 9:
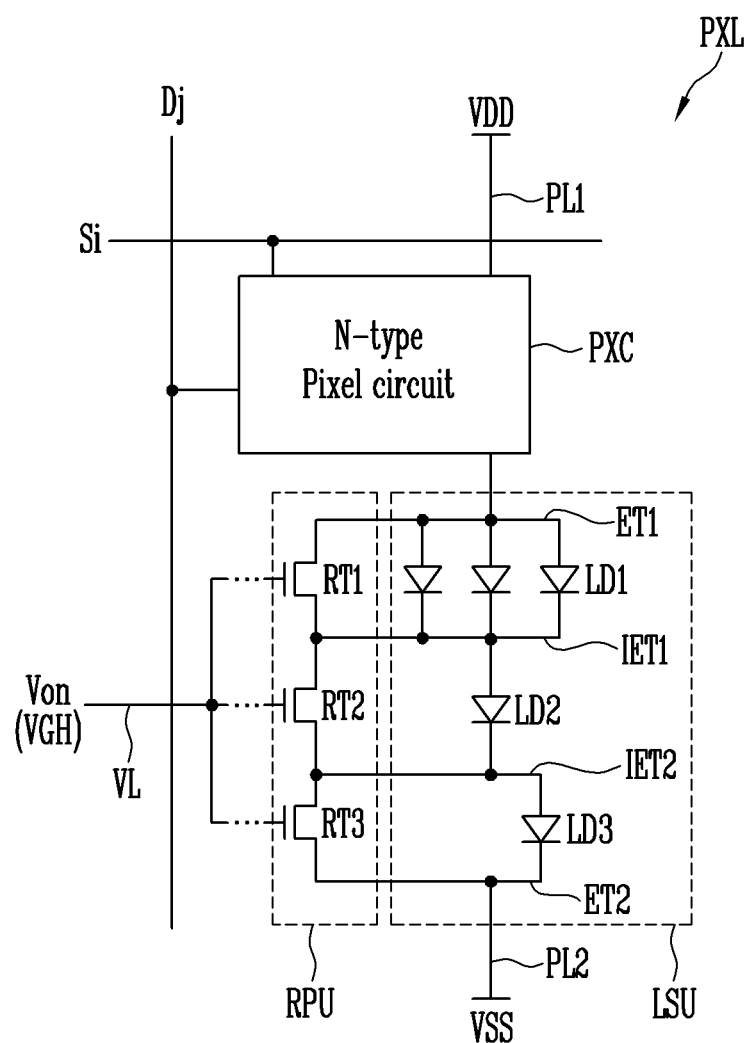
FIG. 9 is a circuit diagram schematically illustrating a pixel in accordance with an embodiment of the disclosure, and for example illustrates an embodiment of a pixel including a repair pattern circuit.
Figure 10A:
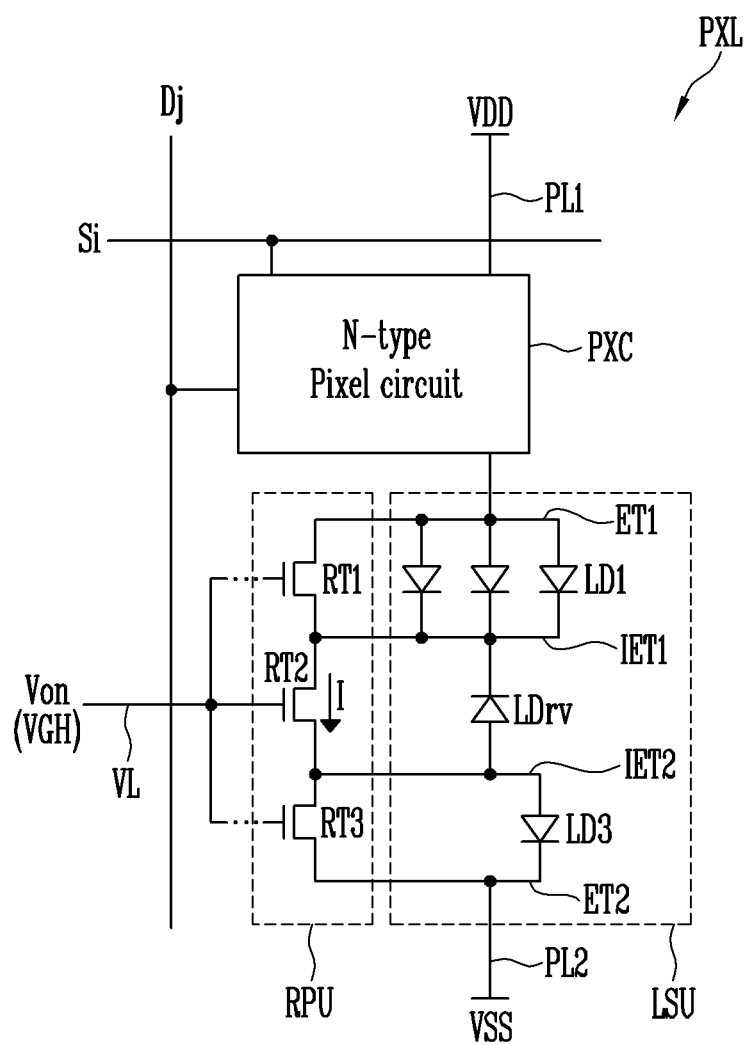
FIGS. 10A and 10B schematically illustrate embodiments of a pixel in which an open defect has been repaired, and for example illustrate embodiments of the pixel of FIG. 9 in which open defects that have occurred due to different reasons have been repaired.
Figure 10B:
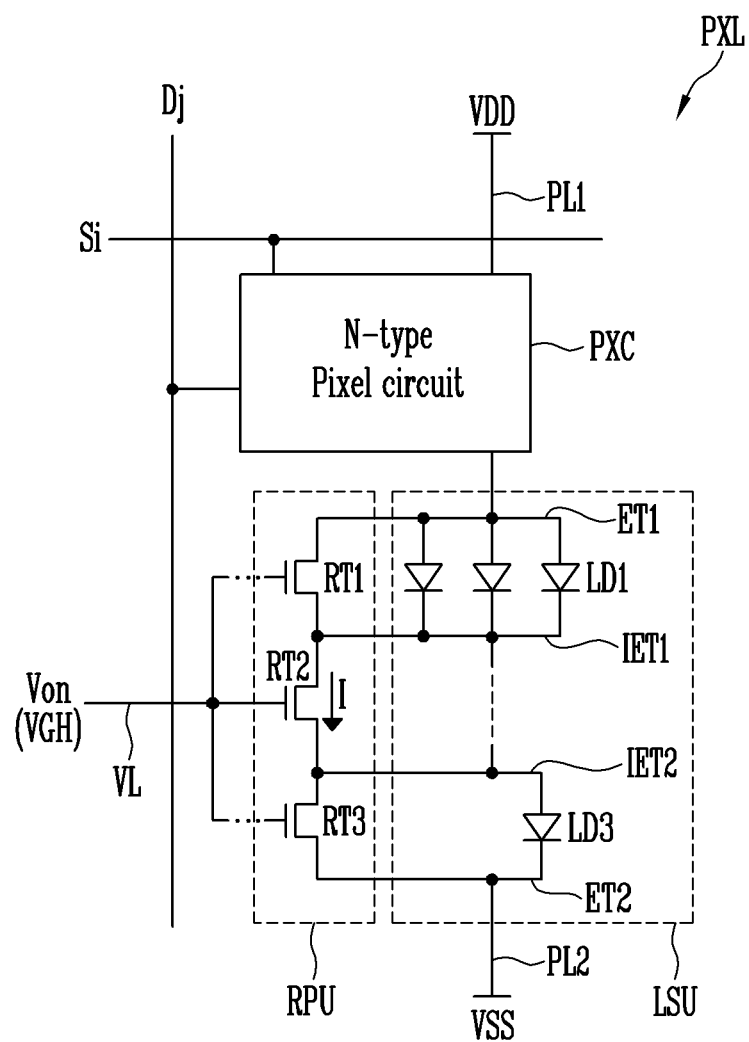

FIG. 9 is a schematic diagram of an equivalent circuit illustrating a pixel PXL in accordance with an embodiment, and for example, illustrates an embodiment of the pixel PXL including a repair pattern circuit RPU. FIGS. 10A and 10B illustrate embodiments of the pixel PXL in which an open defect has been repaired, and for example illustrate embodiments of the pixel PXL of FIG. 9 in which open defects that have occurred due to different reasons have been repaired. In the description of the embodiment(s) of FIGS. 9 to 10B, like reference numerals will be used to designate components similar or equal to those of the previous embodiments (e.g., the embodiments of FIGS. 7 to 8B), and detailed descriptions thereof will be omitted.

Referring to FIGS. 9 to 10B, the pixel circuit PXC may be an N-type pixel circuit including N-type transistors. In an embodiment, the pixel circuit PXC may be electrically connected between the first power line PL1 and the first electrode ET1 of the light source unit LSU, but the connection position of the pixel circuit PXC may be changed in various ways. For example, in an embodiment, the pixel circuit PXC may be electrically connected between the second electrode ET2 of the light source unit LSU and the second power line PL2.

In case that the pixel circuit PXC is an N-type pixel circuit including N-type transistors, each of the repair transistors RT may be formed of an N-type transistor. A drain electrode and a source electrode of the first repair transistor RT1 may be respectively and electrically connected to the first electrode ET1 and the first intermediate electrode IET1. Likewise, a drain electrode and a source electrode of the second repair transistor RT2 may be respectively and electrically connected to the first intermediate electrode IET1 and the second intermediate electrode IET2. A drain electrode and a source electrode of the third repair transistor RT3 may be respectively and electrically connected to the second intermediate electrode IET2 and the second electrode ET2. Therefore, if the repair transistors RT and the transistors included in the pixel circuit PXC are formed to have the same type, when desired, at least one repair transistor RT may be turned on using a gate-on voltage Von (e.g., a gate-high voltage VGH) for turning on the transistors of the pixel circuit PXC (particularly, the switching transistors of each pixel PXL).

In the foregoing embodiment, in case that at least one light emitting element LD is electrically connected in the forward direction to each serial stage (for example, in case that an open defect does not occur), the gate electrode of each of the repair transistors RT may float and remain electrically isolated. For example, the gate electrode of each of the repair transistors RT may be disposed around the gate-on power line VL and may float and be electrically isolated without being electrically connected to the gate-on power line VL.

In case that any light emitting element LD is not validly connected in the forward direction between a pair of electrodes that form a serial stage, the repair transistor RT corresponding to the related serial stage may be turned on to allow an open defect to be repaired. For example, as illustrated in the embodiments of FIGS. 10A and 10B, in case that any light emitting element LD is not validly connected in the forward direction between the first and second intermediate electrodes IET1 and IET2 that form the second serial stage, an open defect that occurs in the second serial stage may be repaired by electrically connecting the gate electrode of the second repair transistor RT2 to the gate-on power line VL.

Figure 11:
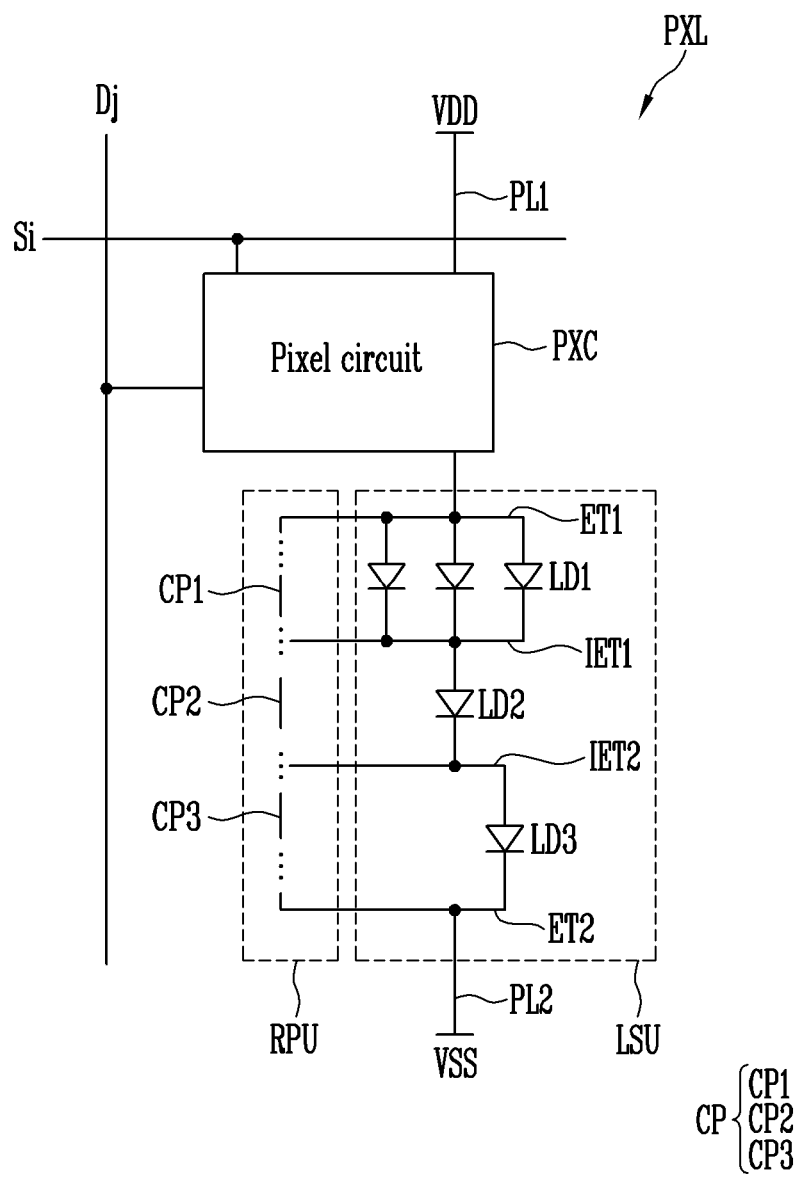
FIG. 11 is a circuit diagram schematically illustrating a pixel in accordance with an embodiment of the disclosure, and for example illustrates an embodiment of a pixel including a repair pattern circuit.
Figure 12A:
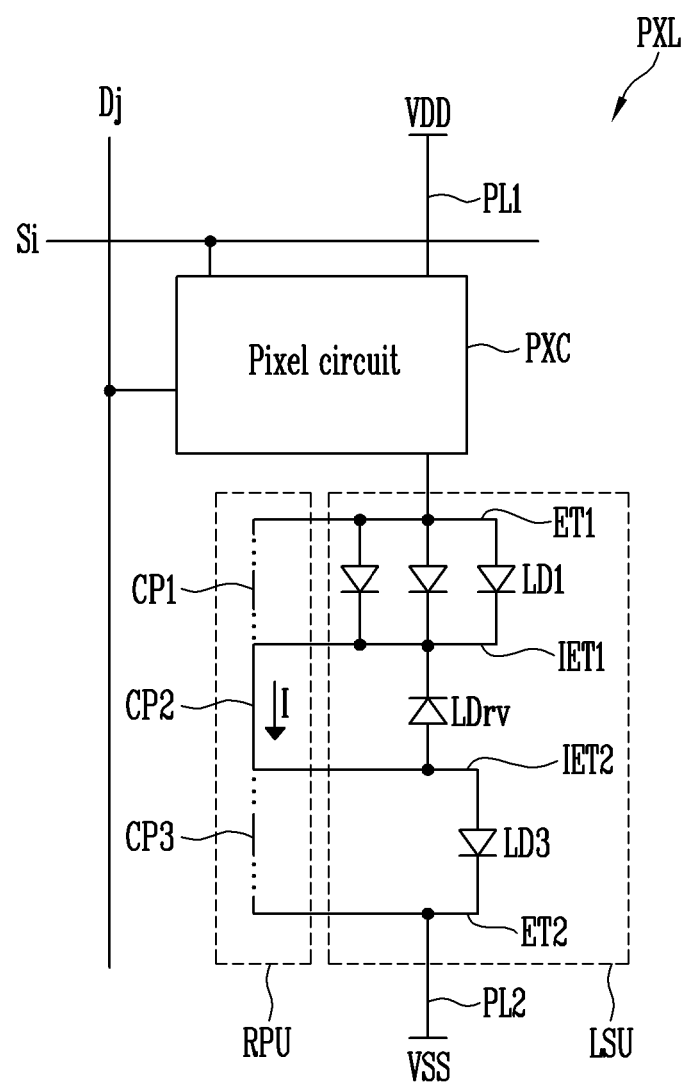
FIGS. 12A and 12B schematically illustrate embodiments of a pixel in which an open defect has been repaired, and for example illustrate embodiments of the pixel of FIG. 11 in which open defects that have occurred due to different reasons have been repaired.
Figure 12B:
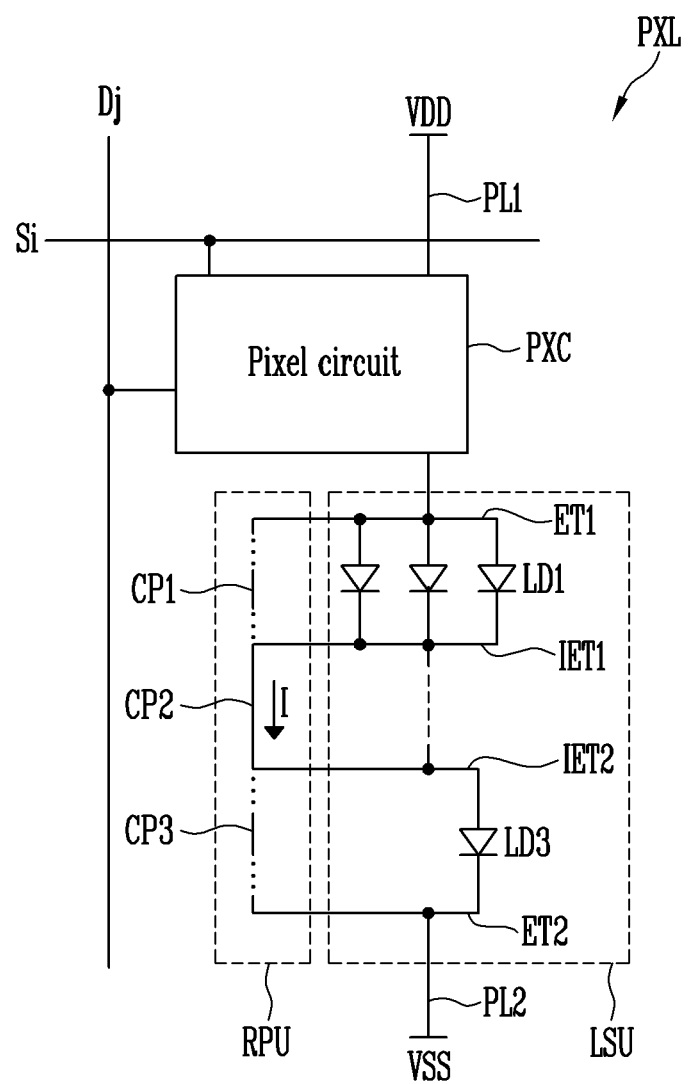

FIG. 11 is a circuit diagram illustrating a pixel PXL in accordance with an embodiment, and for example illustrates an embodiment of the pixel PXL including a repair pattern circuit RPU. FIGS. 12A and 12B illustrate embodiments of the pixel PXL in which an open defect has been repaired, and for example, illustrate embodiments of the pixel PXL of FIG. 11 in which open defects that have occurred due to different reasons have been repaired. In the description of the embodiment(s) of FIGS. 11 to 12B, like reference numerals will be used to designate components similar or equal to those of the previous embodiments (e.g., the embodiments of FIGS. 7 to 10B), and detailed descriptions thereof will be omitted.

Referring to FIGS. 11 to 12B, the pixel circuit PXC may be N-type and/or P-type transistors. The type or configuration of the pixel circuit PXC is not particularly limited, and in some embodiments, it may be omitted.

The repair pattern circuit RPU may include repair patterns corresponding to each serial stage of the light source unit LSU. In an embodiment, each repair pattern may be a conductive pattern.

For example, the repair pattern circuit RPU may include a first conductive pattern CP1 disposed between the first electrode ET1 and the first intermediate electrode IET1 of the first serial stage, a second conductive pattern CP2 disposed between the first intermediate electrode IET1 and the second intermediate electrode IET2 of the second serial stage, and a third conductive pattern CP3 disposed between the second intermediate electrode IET2 and the second electrode ET2 of the third serial stage. Hereinafter, in case that a specific conductive pattern among the first, second, and third conductive patterns CP1, CP2, and CP3 is designated, the corresponding conductive pattern will be referred to as "first conductive pattern CP1," "second conductive pattern CP2," or "third conductive pattern CP3." The term "conductive pattern CP" or "conductive patterns CP" will be used to arbitrarily designate at least one conductive pattern of the first, second, and third conductive patterns CP1, CP2, and CP3, or collectively designate the first, second, and third conductive patterns CP1, CP2, and CP3.

In an embodiment, as illustrated in FIG. 11, in case that at least one light emitting element LD is electrically connected in the forward direction to each serial stage (for example, in case that an open defect does not occur), each conductive pattern CP may float and remain electrically isolated.

In case that any light emitting element LD is not validly connected in the forward direction between a pair of electrodes that form a serial stage, the conductive pattern CP corresponding to the related serial stage may be electrically connected between the pair of electrodes to allow an open defect to be repaired. For example, as illustrated in the embodiments of FIGS. 12A and 12B, in case that any light emitting element LD is not validly connected in the forward direction between the first and second intermediate electrodes IET1 and IET2 that form the second serial stage, an open defect that occurs in the second serial stage may be repaired by electrically connecting the second conductive pattern CP2 between the first and second intermediate electrodes IET1 and IET2.

Figure 13:
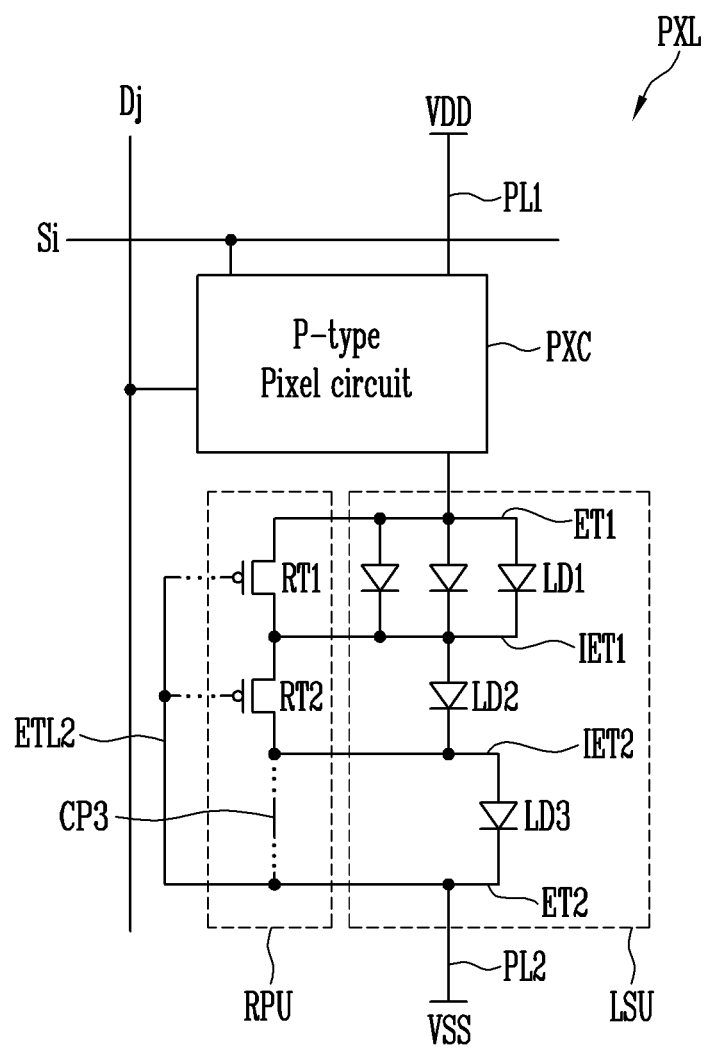
FIGS. 13 and 14 are circuit diagrams each schematically illustrating a pixel in accordance with an embodiment of the disclosure, and for example illustrate different embodiments of a pixel including a repair pattern circuit.
Figure 14:
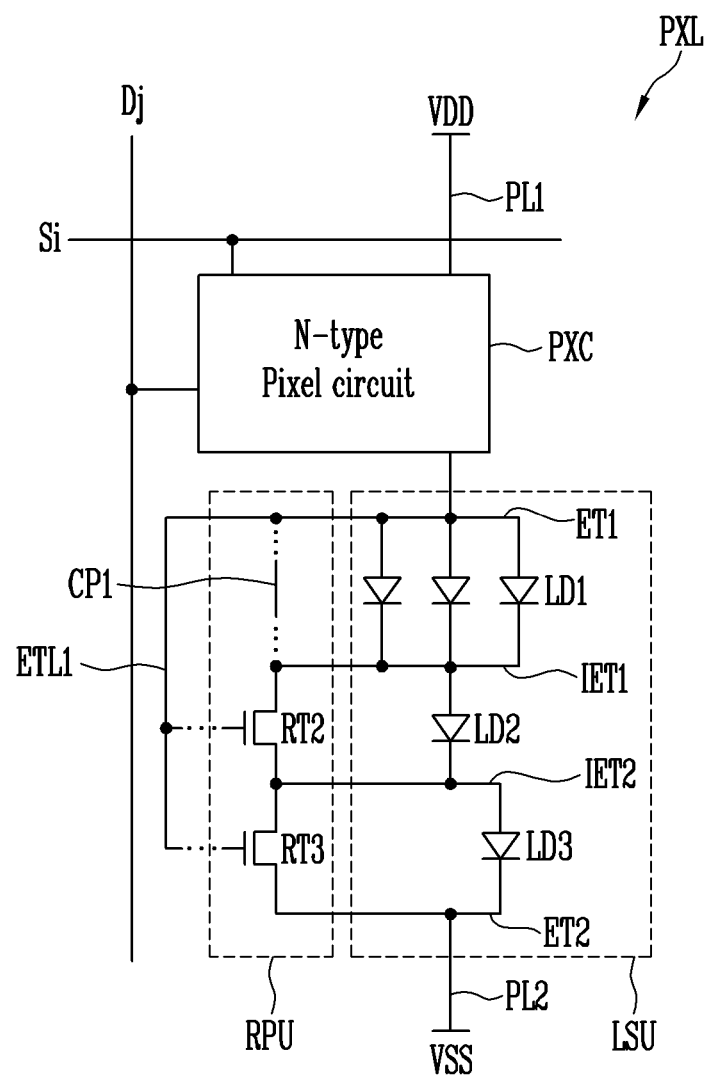

FIGS. 13 and 14 are circuit diagrams illustrating a pixel PXL in accordance with an embodiment, and for example, illustrate different embodiments of the pixel PXL including a repair pattern circuit RPU. In the description of the embodiments of FIGS. 13 and 14, like reference numerals will be used to designate components similar or equal to those of the previous embodiments (e.g., the embodiments of FIGS. 7 to 12B), and detailed descriptions thereof will be omitted.

Referring to FIGS. 13 and 14, the repair pattern circuit RPU may include repair patterns corresponding to each serial stage. Furthermore, the repair patterns may include a combination of at least one repair transistor RT and at least one conductive pattern CP.

In an embodiment, as illustrated in FIG. 13, the repair pattern circuit RPU may include first and second repair transistors RT1 and RT2 which respectively correspond to the first and second serial stages, and a third conductive pattern CP3 which corresponds to the third serial stage. Here, the combination of the repair transistor RT and the conductive pattern CP that form the repair pattern circuit RPU may be changed in various ways.

In an embodiment, in case that the pixel circuit PXC is a P-type pixel circuit, the repair transistors RT may be formed of P-type transistors. As needed, a type of control signal or control power for turning on the repair transistors RT may be changed in various ways. For example, in an embodiment, as illustrated in the embodiments of FIGS. 7 to 10B, the repair transistors RT may be selectively turned on by using a gate-on voltage Von which is supplied to the gate-on power line VL. In an embodiment, as shown in FIG. 13, in case that the repair transistors RT are P-type transistors, a second electrode line ETL2 electrically connected to the second electrode ET2 may be disposed around the gate electrodes of the repair transistors RT, and the second electrode line ETL2 may be selectively and electrically connected with the gate electrodes of the repair transistors RT, when desired (for example, in case that an open defect is repaired). In other words, in some embodiments, the repair transistors RT may be selectively turned on using the second power voltage VSS.

In an embodiment, as illustrated in FIG. 14, the repair pattern circuit RPU may include a first conductive pattern CP1 corresponding to the first serial stage and second and third repair transistors RT2 and RT3 which respectively correspond to the second and third serial stages. In other words, the combination of the repair transistor RT and the conductive pattern CP that form the repair pattern circuit RPU may be changed in various ways depending on embodiments.

In an embodiment, in case that the pixel circuit PXC is an N-type pixel circuit, the repair transistors RT may be formed of N-type transistors. As needed, a type of control signal or control power for turning on the repair transistors RT may be changed in various ways. For example, in an embodiment, as illustrated in the embodiments of FIGS. 7 to 10B, the repair transistors RT may be selectively turned on by using a gate-on voltage Von which is supplied to the gate-on power line VL. In an embodiment, as shown in FIG. 14, in case that the repair transistors RT are N-type transistors, a first electrode line ETL1 electrically connected to the first electrode ET1 may be disposed around the gate electrodes of the repair transistors RT, and the first electrode line ETL1 may be selectively and electrically connected with the gate electrodes of the repair transistors RT, when desired (for example, in case that an open defect is repaired). In other words, in some embodiments, the repair transistors RT may be selectively turned on using the first power voltage VDD.

Figure 15:
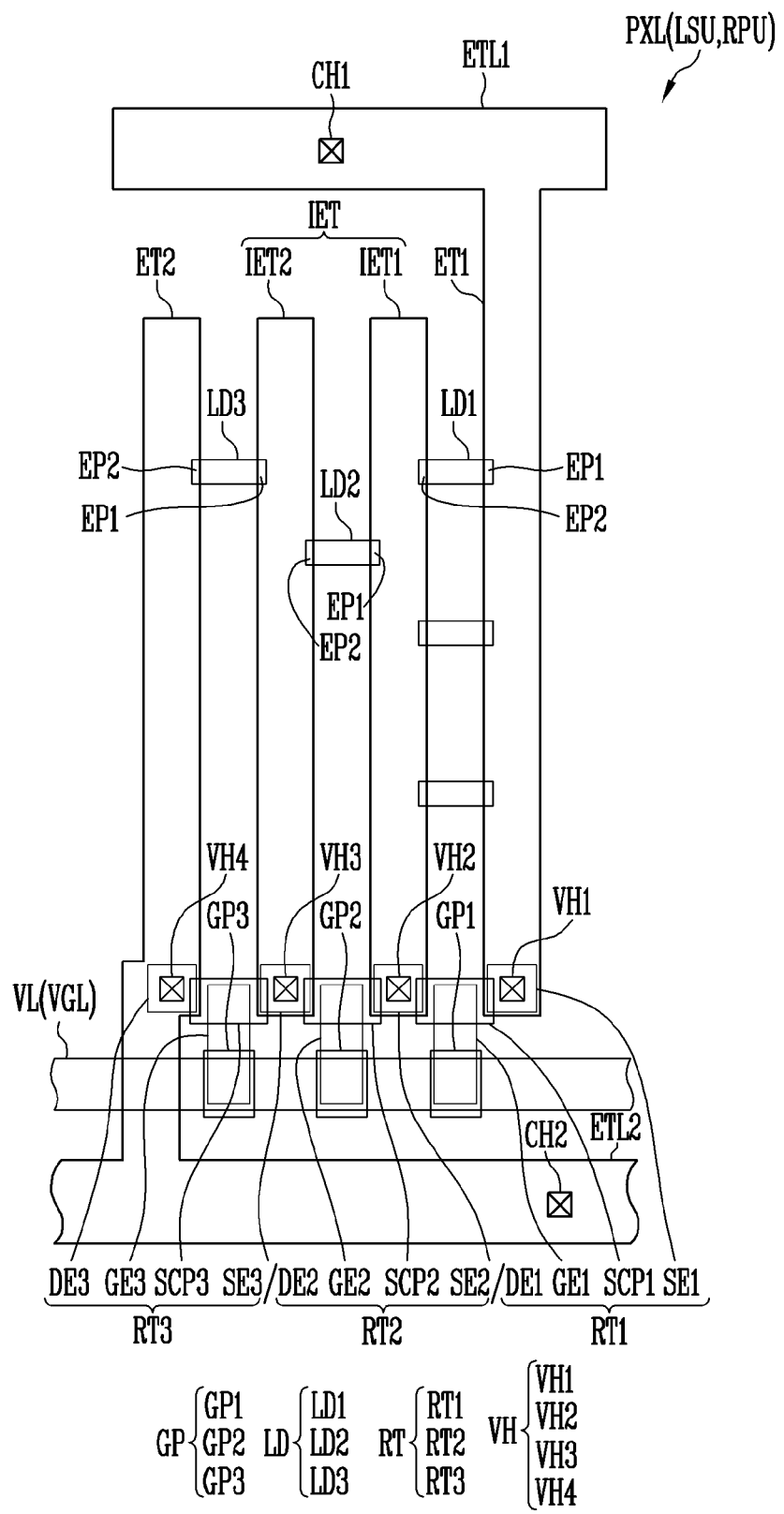
FIGS. 15 and 16 are plan views each schematically illustrating a pixel in accordance with an embodiment of the disclosure.
Figure 16:
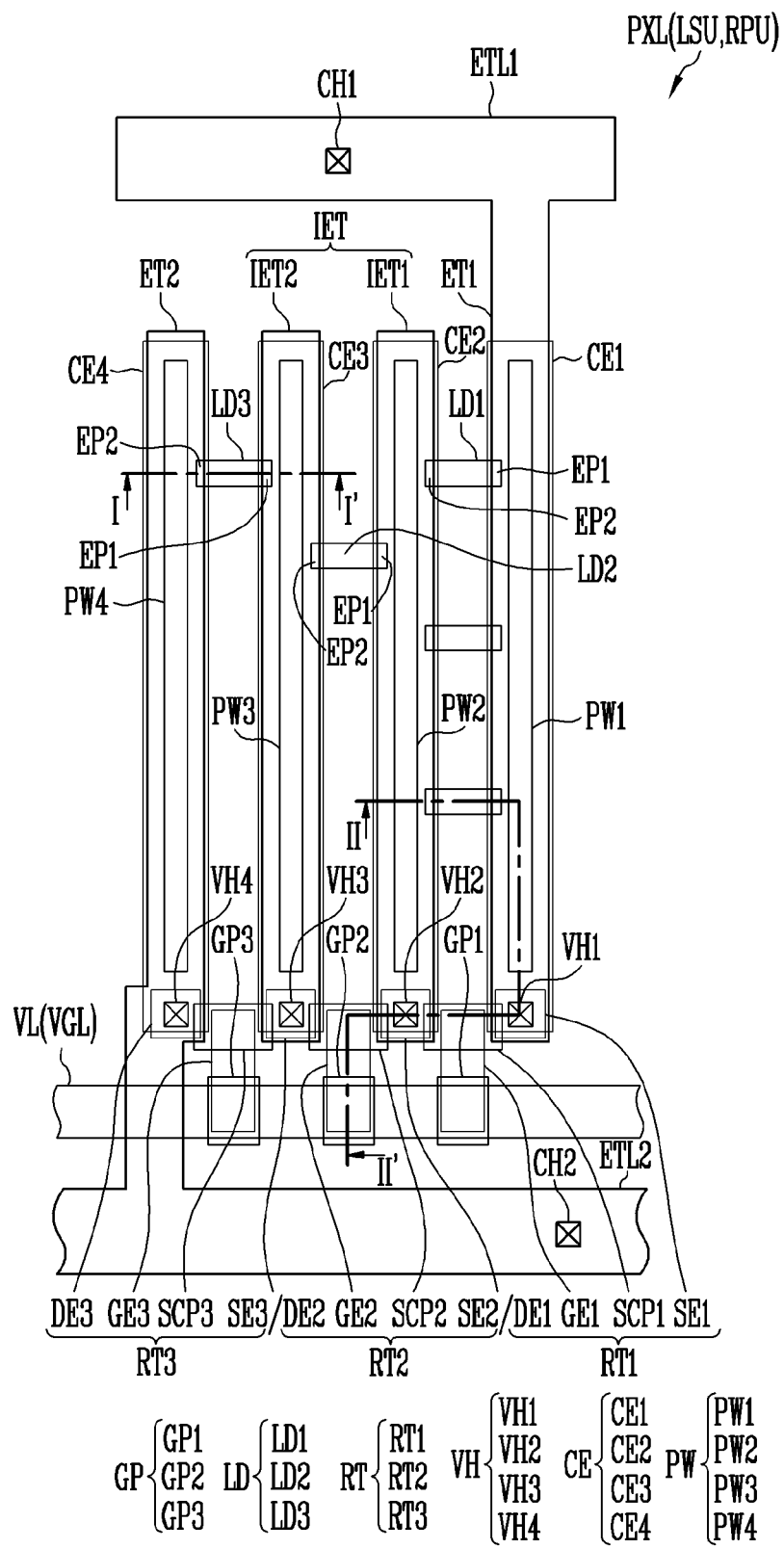

FIGS. 15 and 16 are schematic plan views each illustrating a pixel PXL in accordance with an embodiment. The pixel PXL of FIG. 16 may further include partition walls or banks PW and contact electrodes CE, compared to the pixel PXL of FIG. 15. In an embodiment, each pixel PXL illustrated in FIGS. 15 and 16 may be one of the pixels PXL illustrated in FIGS. 4 to 14. For example, each pixel PXL illustrated in FIGS. 15 and 16 may be a pixel PXL in accordance with the embodiment of FIG. 7. Furthermore, in an embodiment, the pixels PXL disposed in the display area DA (see FIG. 4) may have substantially identical or similar structures.

In an embodiment, FIGS. 15 and 16 illustrate the structure of the pixel PXL, focusing on the light source unit LSU and the repair pattern circuit RPU of the pixel PXL in accordance with each embodiment. Here, the pixel PXL may further include circuit elements which form each pixel circuit (e.g., the pixel circuit PXC of FIGS. 4 to 14). In an embodiment, the circuit elements and the repair pattern circuit RPU may be disposed on a layer different from that of the light source unit LSU. For example, the circuit elements and the repair pattern circuit RPU may be disposed on a circuit element layer (also referred to as "pixel circuit layer") located on a surface of the base layer BSL, and the light source unit LSU may be disposed on a display element layer disposed on the circuit element layer.

Furthermore, in an embodiment, FIGS. 15 and 16 illustrate an embodiment in which each light source unit LSU is electrically connected, through first and second contact holes CH1 and CH2, to a power line (e.g., first and/or second power lines PL1 and/or PL2), a circuit element (e.g., at least one circuit element that forms the pixel circuit PXC), and/or a signal line (e.g., a scan line Si and/or a data line Dj), but the disclosure is not limited thereto. For example, in an embodiment, at least one of the first and second electrodes ET1 and ET2 of each pixel PXL may be directly and electrically connected to a power line and/or a signal line without using, e.g., a contact hole and/or an intermediate line.

First, referring to FIGS. 4 to 15, the pixel PXL in accordance with an embodiment may include a first electrode ET1 and a second electrode ET2 which are spaced from each other, at least one intermediate electrode IET disposed between the first and second electrodes ET1 and ET2, and light emitting elements LD electrically connected between a pair of adjacent electrodes among the first and second electrodes ET1 and ET2 and the at least one intermediate electrode IET. Furthermore, the pixel PXL may include repair patterns which are disposed and/or electrically connected between a pair of adjacent electrodes among the first and second electrodes ET1 and ET2 and the at least one intermediate electrode IET to overlap the pair of adjacent electrodes. In the pixel PXL in accordance with the foregoing embodiment, the first electrode ET1, at least one intermediate electrode IET, and the second electrode ET2 may be successively connected in series via each light emitting element LD or a repair pattern, and form electrodes of each serial stage.

For example, the pixel PXL may include a first electrode ET1, a first intermediate electrode IET1, a second intermediate electrode IET2, and a second electrode ET2 which are spaced apart from each other in a first direction DR1 and successively arranged. In an embodiment, the first direction DR1 may be a horizontal direction (or a row direction), but the disclosure is not limited thereto. For example, in an embodiment, the first direction DR1 may be a vertical direction (or a column direction) or a diagonal direction.

In an embodiment, the first electrode ET1 and the first intermediate electrode IET1 that are adjacent to each other may make a pair and form electrodes of the first serial stage. Likewise, the first intermediate electrode IET1 and the second intermediate electrode IET2 that are adjacent to each other may make a pair and form electrodes of the second serial stage. The second intermediate electrode IET2 and the second electrode ET2 that are adjacent to each other may make a pair and form electrodes of the third serial stage.

In an embodiment, the first electrode ET1, the first intermediate electrode IET1, the second intermediate electrode IET2, and the second electrode ET2 each may extend in a second direction DR2 intersecting the first direction DR1. For example, the first electrode ET1, the first intermediate electrode IET1, the second intermediate electrode IET2, and the second electrode ET2 each may have a bar shape extending in the second direction DR2 and be disposed parallel to each other. In an embodiment, the second direction DR2 may be a vertical direction (or a column direction), but the disclosure is not limited thereto. For example, in an embodiment, the second direction DR2 may be a horizontal direction (or a row direction) or a diagonal direction.

However, the shapes, orientations, and/or relative disposition structure of the electrodes that form the light source unit LSU are not limited thereto and may be changed in various ways. For example, a pair of electrodes that form each serial stage of the light source unit LSU may be disposed at positions spaced apart from each other in a double helix structure. Furthermore, at least one of the first electrode ET1, the first intermediate electrode IET1, the second intermediate electrode IET2, and the second electrode ET2 may have a structure which is bent or curved in one area.

In an embodiment, the first electrode ET1, the first intermediate electrode IET1, the second intermediate electrode IET2, and the second electrode ET2 may be disposed at regular intervals. Therefore, the light emitting elements LD may be more uniformly aligned in the pixel PXL. However, the disclosure is not limited thereto. For example, in an embodiment, the electrodes that form the light source unit LSU may be disposed, by predetermined areas, at different intervals and/or with different sizes, or at random intervals and/or with random sizes.

In an embodiment, the first electrode ET1 may be electrically connected to the first electrode line ETL1 (also referred to as "first alignment line" or "first connection line") and may be electrically connected to the pixel circuit PXC and/or the first power voltage VDD through the first electrode line ETL1. In an embodiment, the first electrode ET1 and the first electrode line ETL1 may be integrally or non-integrally connected to (or integral or non-integral with) each other. In case that the first electrode ET1 and the first electrode line ETL1 are integrally connected to each other, the first electrode ET1 and the first electrode line ETL1 may be regarded as different areas of a single electrode, line, or pattern.

In an embodiment, the second electrode ET2 may be electrically connected to the second electrode line ETL2 (also referred to as "second alignment line" or "second connection line") and may be electrically connected to the second power voltage VSS through the second electrode line ETL2. In an embodiment, the second electrode ET2 and the second electrode line ETL2 may be integrally or non-integrally and electrically connected to each other. In case that the second electrode ET2 and the second electrode line ETL2 are integrally connected to each other, the second electrode ET2 and the second electrode line ETL2 may be regarded as being different areas of a single electrode, line, or pattern.

In an embodiment, each of the first and second electrode lines ETL1 and ETL2 may extend in a direction intersecting the first and second electrodes ET1 and ET2. For example, each of the first and second electrode lines ETL1 and ETL2 may extend in the first direction DR1 and be disposed parallel to each other with the electrodes of the corresponding light source unit LSU interposed therebetween.

The first electrode line ETL1 may be electrically connected between the first power line PL1 and the first electrode ET1. The first electrode line ETL1 may receive the first power voltage VDD (or a first driving signal such as a scan signal, a data signal or a control signal) supplied from the first power line PL1 during a period in which the display device is driven, and may transmit the first power voltage VDD to the first electrode ET1. In an embodiment, the first electrode line ETL1 may be electrically connected to a first contact hole CH1, a circuit element (e.g., at least one transistor that forms the pixel circuit PXC), a power line (e.g., the first power line PL1), and/or a signal line (e.g., a scan line Si, a data line Dj, or a control line). For example, the first electrode line ETL1 may be electrically connected to a circuit element disposed thereunder through the first contact hole CH1 and be electrically connected to the first power line PL1 through the circuit element. For example, each pixel PXL may further include a pixel circuit PXC electrically connected between the first electrode line ETL1 and the first power voltage VDD. In an embodiment, the pixel circuit PXC may be disposed under each light source unit LSU and be electrically connected to the first electrode line ETL1 of the light source unit LSU through the first contact hole CH1. In an embodiment, the first electrode line ETL1 may be electrically connected, via the first contact hole CH1 or the like, to a signal line to which a first driving signal is supplied. In an embodiment, the first electrode line ETL1 may be directly and electrically connected to the first power line PL1 or a signal line without using the first contact hole CH1 and/or the circuit element. The first electrode line ETL1 may be integrally or non-integrally connected to the first power line PL1 or the signal line.

In an embodiment, the first electrode line ETL1 electrically connected to the respective first electrodes ET1 of the pixels PXL may be first electrically connected in common to pixels PXL and be supplied with a first alignment signal (or a first alignment voltage) at the step of aligning the light emitting elements LD. Thereafter, the first electrode line ETL1 between the pixels PXL may be open, so that the pixels PXL may be fabricated to be individually operable. For example, the first electrode lines ETL1 of the pixels PXL may be separated from each other between the adjacent pixels PXL.

The second electrode line ETL2 may be electrically connected between the second power line PL2 and the second electrode ET2. The second electrode line ETL2 may receive the second power voltage VSS (or a second driving signal such as a scan signal, a data signal or a control signal) during a period in which the display device is driven, and may transmit the second power voltage VSS to the second electrode ET2. In an embodiment, the second electrode line ETL2 may be electrically connected to a second contact hole CH2, a circuit element (e.g., at least one transistor that forms the pixel circuit PXC), a power line (e.g., the second power line PL2), and/or a signal line (e.g., a scan line Si, a data line Dj, or a control line). For example, the second electrode line ETL2 may be electrically connected, through the second contact hole CH2, to the second power line PL2 disposed thereunder. In an embodiment, the second electrode line ETL2 may be directly connected to the second power line PL2 or a signal line without using, e.g., the second contact hole CH2, and/or the circuit element. The second electrode line ETL2 may be integrally or non-integrally connected to the second power line PL2 or the signal line.

The second electrode line ETL2 may be supplied with a second alignment signal (or a second alignment voltage) at the step of aligning the light emitting elements LD. During a period in which the display device is actually driven, the second electrode line ETL2 may be supplied with the second power voltage VSS or a second driving signal.

For example, the first and second electrode lines ETL1 and ETL2 may be alignment lines which are supplied with alignment signals to be applied to each light source unit LSU at the step of aligning the light emitting elements LD in each pixel PXL to fabricate the display device and are disposed in a path along which alignment current corresponding to the alignment signal flows. Furthermore, the first and second electrode lines ETL1 and ETL2 may be connection lines which are supplied with predetermined driving voltages to be applied to each light source unit LSU at the step of driving the display device (e.g., when in use) and are disposed in a path along which driving current of each pixel PXL flows.

In an embodiment, each intermediate electrode IET, e.g., each of the first and second intermediate electrodes IET1 and IET2, may be first electrically connected to the first or second electrode lines ETL1 and ETL2 and thus supplied with a predetermined first or second alignment signal at the step of aligning the light emitting elements LD. After the alignment of the light emitting elements LD has been completed, each intermediate electrode IET may be separated from the first or second electrode line ETL1 and ETL2, and thus the first, second, and third light emitting elements LD1, LD2, and LD3 may be electrically connected in series to each other.

At least one light emitting element LD may be electrically connected in the forward direction between each pair of adjacent electrodes. For example, at least one first light emitting element LD1 may be electrically connected in the forward direction between the first electrode ET1 and the first intermediate electrode IET1. For example, each first light emitting element LD1 may include a first end EP1 electrically connected to the first electrode ET1 and a second end EP2 electrically connected to the first intermediate electrode IET1. The first and second ends EP1 and EP2 may be respectively P-type and N-type ends. Likewise, at least one second light emitting element LD2 may be electrically connected in the forward direction between the first intermediate electrode IET1 and the second intermediate electrode IET2. For example, each second light emitting element LD2 may include a first end EP1 electrically connected to the first intermediate electrode IET1 and a second end EP2 electrically connected to the second intermediate electrode IET2. The first and second ends EP1 and EP2 may be respectively P-type and N-type ends. Each third light emitting element LD3 may include a first end EP1 electrically connected to the second intermediate electrode IET2 and a second end EP2 electrically connected to the second electrode ET2. The first and second ends EP1 and EP2 may be respectively P-type and N-type ends.

In case that an open defect occurs in at least one serial stage, any light emitting element LD may not be connected in the forward direction between a pair of electrodes that form the serial stage. The pair of electrodes that form the corresponding serial stage may be electrically connected to each other by a corresponding repair pattern (e.g., one of the first, second, and third repair transistors RT1, RT2, and RT3).

In an embodiment, each of the light emitting elements LD may be a light emitting element which is made of material having an inorganic crystal structure and has a subminiature size, e.g., a size ranging from the nanometer scale to the micrometer scale. For example, each light emitting element LD may be a subminiature rod-type light emitting element having a size ranging from the nanometer scale to the micrometer scale, as illustrated in FIGS. 1A to 3B. The size, type, shape, or the like of the light emitting elements LD may be changed in various ways. For example, in an embodiment, each light emitting element LD may be a light emitting element that has a core-shell structure and is fabricated by a growth method. Although the light emitting element having the core-shell structure is a micro light emitting element having a size ranging from the nanometer scale to the micrometer scale, the disclosure is not limited thereto.

Although FIG. 15 illustrates that, in an area where a pair of electrodes constituting each serial stage (e.g., a pair of adjacent electrodes of the first electrode ET1, the first and second intermediate electrodes IET1 and IET2, and the second electrode ET2) are disposed to face each other, the respective light emitting elements LD are uniformly and horizontally arranged in the first direction DR1 between the pair of electrodes, the disclosure is not limited thereto. For example, at least one of the light emitting elements LD may be arranged and/or electrically connected in a diagonal direction or the like between a pair of electrodes. Although not shown in FIG. 15, at least one invalid light source (e.g., at least one light emitting element that is not validly connected in the forward direction between a pair of electrodes) may be further disposed around electrodes that form the light source unit LSU.

In an embodiment, the light emitting elements LD may be prepared to be dispersed in a solution and supplied to each pixel area (e.g., each emission area enclosed by a bank (also referred to as "pixel defining layer") disposed between adjacent pixels PXL). In an embodiment, the light emitting elements LD may be supplied to each pixel area by an inkjet method, a slit coating method, or various other methods. For example, the light emitting elements LD may be mixed with a volatile solvent and be supplied to the emission area of each pixel PXL. Here, if predetermined alignment signals (or alignment voltages) are respectively applied to the first and second electrodes ET1 and ET2 and the first and second intermediate electrodes IET1 and IET2, an electric field is formed between adjacent electrodes, and the light emitting elements LD are aligned between the electrodes. After the light emitting elements LD have been aligned, the solvent may be removed by a volatilization method or other methods. Therefore, the light emitting elements LD may be reliably disposed in each pixel PXL.

The repair pattern circuit RPU may include repair patterns which overlap the electrodes of the light source unit LSU. The repair patterns may be repair transistors RT. For example, the repair pattern circuit RPU may include a first repair transistor RT1 which is disposed between the first electrode ET1 and the first intermediate electrode IET1 of the first serial stage to overlap the first electrode ET1 and the first intermediate electrode IET1, a second repair transistor RT2 which is disposed between the first intermediate electrode IET1 and the second intermediate electrode IET2 of the second serial stage to overlap the first and second intermediate electrodes IET1 and IET2, and a third repair transistor RT3 which is disposed between the second intermediate electrode IET2 and the second electrode ET2 of the third serial stage to overlap the second intermediate electrode IET2 and the second electrode ET2.

Each repair transistor RT may include a gate electrode which overlaps the gate-on power line VL to which a voltage (e.g., a gate-low voltage VGL) capable of turning on the repair transistor RT is to be supplied. For example, the first, second, and third repair transistors RT1, RT2, and RT3 may respectively include first, second, and third gate electrodes GE1, GE2, and GE3 which overlap different areas of the gate-on power line VL. Hereinafter, in case that a specific gate electrode among the first, second, and third gate electrodes GE1, GE2, and GE3 is designated, the corresponding gate electrode will be referred to as "first gate electrode GE1," "second gate electrode GE2," or "third gate electrode GE3." The term "gate electrode GE" or "gate electrodes GE" will be used to arbitrarily designate at least one gate electrode of the first, second, and third gate electrodes GE1, GE2, and GE3 or collectively designate the first, second, and third gate electrodes GE1, GE2, and GE3.

In an embodiment, in case that at least one light emitting element LD is validly connected to each serial stage in a forward direction, the gate electrodes GE of the repair transistors RT may be separated from the gate-on power line VL with an insulating layer (not shown) interposed therebetween. For example, the gate electrodes GE of the repair transistors RT and the gate-on power line VL may be disposed together in the circuit element layer disposed under the light source unit LSU and be separately disposed on different layers of the circuit element layer with at least one insulating layer interposed therebetween.

In case that any light emitting element LD is not validly connected in the forward direction between a pair of electrodes that form a serial stage, the gate electrode GE of the repair transistor RT corresponding to the related serial stage may be electrically connected with the gate-on power line VL. For example, in case that an open defect occurs in at least one serial stage, the gate electrode GE of the repair transistor RT corresponding to the serial stage may be electrically connected to the gate-on power line VL by a connection process using a laser (referred also to as "laser short"). Therefore, in case that the display device is driven, the repair transistor RT electrically connected to the gate-on power line VL may remain turned on.

Furthermore, each repair transistor RT may include a semiconductor pattern which overlaps an area of each corresponding gate electrode GE, and source and drain electrodes electrically connected to opposite ends of the semiconductor pattern. For example, the first repair transistor RT1 may include a first semiconductor pattern SCP1 which overlaps an area of the first gate electrode GE1, and a first source electrode SE1 and a first drain electrode DE1 which are electrically connected to different ends of the first semiconductor pattern SCP1. Likewise, the second repair transistor RT2 may include a second semiconductor pattern SCP2 which overlaps an area of the second gate electrode GE2, and a second source electrode SE2 and a second drain electrode DE2 which are electrically connected to different ends of the second semiconductor pattern SCP2. The third repair transistor RT3 may include a third semiconductor pattern SCP3 which overlaps an area of the third gate electrode GE3, and a third source electrode SE3 and a third drain electrode DE3 which are electrically connected to different ends of the third semiconductor pattern SCP3.

Hereinafter, in case that a specific semiconductor pattern among the first, second, and third semiconductor patterns SCP1, SCP2, and SCP3 is designated, the corresponding semiconductor pattern will be referred to as "first semiconductor pattern SCP1," "second semiconductor pattern SCP2," or "third semiconductor pattern SCP3." The term "semiconductor pattern SCP" or "semiconductor patterns SCP" will be used to arbitrarily designate at least one semiconductor pattern of the first, second, and third semiconductor patterns SCP1, SCP2, and SCP3, or collectively designate the first, second, and third semiconductor patterns SCP1, SCP2, and SCP3. Likewise, in case that a specific source electrode among the first, second, and third source electrodes SE1, SE2, and SE3 is designated, the corresponding source electrode will be referred to as "first source electrode SE1," "second source electrode SE2," or "third source electrode SE3". The term "source electrode SE" or "source electrodes SE" will be used to arbitrarily designate at least one source electrode of the first, second, and third source electrodes SE1, SE2, and SE3 or collectively designate the first, second, and third source electrodes SE1, SE2, and SE3. Likewise, in case that a specific drain electrode among the first, second, and third drain electrodes DE1, DE2, and DE3 is designated, the corresponding drain electrode will be referred to as "first drain electrode DE1," "second drain electrode DE2," or "third drain electrode DE3." The term "drain electrode DE" or "drain electrodes DE" will be used to arbitrarily designate at least one drain electrode of the first, second, and third drain electrodes DE1, DE2, and DE3 or collectively designate the first, second, and third drain electrodes DE1, DE2, and DE3.

The semiconductor pattern SCP of each of the repair transistors RT may be enabled in case that a gate-on voltage (e.g., a gate-low voltage VGL) supplied to each gate electrode GE is supplied thereto, and thus may form each corresponding conductive channel. The source electrode SE and the drain electrode DE of each of the repair transistors RT may be electrically connected to a pair of electrodes which form a corresponding serial stage. In other words, the source electrode SE and the drain electrode DE of each of the repair transistors RT may electrically connect a pair of electrodes, which form a corresponding serial stage, to different ends of each corresponding semiconductor pattern SCP.

In an embodiment, the first source electrode SE1 and the first drain electrode DE1 of the first repair transistor RT1 may be electrically connected to the first electrode ET1 and the first intermediate electrode IET1 through a via hole VH, for example, a first via hole VH1 and a second via hole VH2, respectively. Likewise, the second source electrode SE2 and the second drain electrode DE2 of the second repair transistor RT2 may be electrically connected to the first intermediate electrode IET1 and the second intermediate electrode IET2 through the second via hole VH2 and a third via hole VH3, respectively. The third source electrode SE3 and the third drain electrode DE3 of the third repair transistor RT3 may be electrically connected to the second intermediate electrode IET2 and the second electrode ET2 through the third via hole VH3 and a fourth via hole VH4, respectively.

In an embodiment, two repair transistors RT adjacent to each other may share at least one electrode. For example, the first drain electrode DE1 of the first repair transistor RT1 and the second source electrode SE2 of the second repair transistor RT2 may be integral with each other. Likewise, the second drain electrode DE2 of the second repair transistor RT2 and the third source electrode SE3 of the third repair transistor RT3 may be integral with each other.

In an embodiment, the pixel PXL may further include guide patterns which overlap the repair transistors RT, particularly, the gate electrodes GE of the repair transistors RT. For example, the pixel PXL may include guide patterns formed in areas where the respective gate electrodes GE of the repair transistors RT overlap the gate-on power line VL. For example, the pixel PXL may include a first guide pattern GP1 formed in an area where the first gate electrode GE1 of the first repair transistor RT1 overlaps the gate-on power line VL, a second guide pattern GP2 formed in an area where the second gate electrode GE2 of the second repair transistor RT2 overlaps the gate-on power line VL, and a third guide pattern GP3 formed in an area where the third gate electrode GE3 of the third repair transistor RT3 overlaps the gate-on power line VL. Hereinafter, in case that a specific guide pattern among the first, second, and third guide patterns GP1, GP2, and GP3 is designated, the corresponding guide pattern will be referred to as "first guide pattern GP1," "second guide pattern GP2," or "third guide pattern GP3." The term "guide pattern GP" or "guide patterns GP" will be used to arbitrarily designate at least one guide pattern of the first, second, and third guide patterns GP1, GP2, and GP3, or collectively designate the first, second, and third guide patterns GP1, GP2, and GP3.

In an embodiment, the guide patterns GP along with the electrodes and the light emitting elements LD that form the light source unit LSU may be disposed in the display element layer. For example, the guide patterns GP each may be formed of a single layer or multiple layers which are formed on the same layer by the same process as that of at least one of the electrodes and the insulating layers that are disposed in the light source unit LSU. Furthermore, the guide patterns GP may be formed of at least one conductive or insulating pattern, and the material thereof is not particularly limited.

If the guide patterns GP are disposed in the pixel PXL, an open defect which occurs in the pixel PXL may be more readily repaired. For example, in case that a repair transistor RT corresponding to at least one serial stage is electrically connected to the gate-on power line VL to repair the open defect, a location at which a laser beam is to be applied to electrically connect the repair transistor RT with the gate-on power line VL may be readily discerned or identified.

Referring to FIG. 16, the pixel PXL may selectively further include banks PW disposed under respective areas of the electrodes that form the light source unit LSU, and/or contact electrodes CE disposed over the respective electrodes. For example, the pixel PXL may include a first bank PW1, a second bank PW2, a third bank PW3, and a fourth bank PW4 which are respectively disposed under the first electrode ET1, the first intermediate electrode IET1, the second intermediate electrode IET2, and the second electrode ET2. Furthermore, the pixel PXL may include a first contact electrode CE1, a second contact electrode CE2, a third contact electrode CE3, and a fourth contact electrode CE4 which are respectively disposed over the first electrode ET1, the first intermediate electrode IET1, the second intermediate electrode IET2, and the second electrode ET2.

In an embodiment, each bank PW may be formed to have an individual pattern under each corresponding electrode (e.g., any one electrode of the first electrode ET1, the first intermediate electrode IET1, the second intermediate electrode IET2, and the second electrode ET2) and overlap an area of the corresponding electrode. If the banks PW are disposed under the electrodes, the respective electrodes may protrude upward in areas where the banks PW are disposed. Therefore, light emitted from the first and second ends EP1 and EP2 of the light emitting elements LD disposed between the electrodes may be controlled to more effectively travel in the frontal direction of the display device.

In an embodiment, each contact electrode CE may be formed to have an individual pattern over each corresponding electrode (e.g., any one electrode of the first electrode ET1, the first intermediate electrode IET1, the second intermediate electrode IET2, and the second electrode ET2) and overlap an area of the corresponding electrode. The contact electrodes CE each may electrically connect a corresponding electrode with the first or second end EP1 or EP2 of at least one light emitting element LD adjacent to the corresponding electrode. If the contact electrodes CE are disposed over the electrodes, the light emitting elements LD may be more reliably connected between a pair of electrodes that form each serial stage.

FIGS. 17A to 17D each are a schematic cross-sectional view illustrating a pixel PXL in accordance with an embodiment, and for example illustrate different embodiments of a cross-section of the pixel PXL corresponding to line I-I' of FIG. 16. In an embodiment, the pixels PXL disposed in the display area DA (see FIG. 4) may have a substantially identical or similar cross-sectional structure. Hereinafter, an embodiment of the cross-sectional structure of each pixel PXL will be described with reference to FIGS. 17A to 17D along with FIGS. 4 to 16.

Referring to FIGS. 4 to 17D, the pixel PXL in accordance with an embodiment and the display device including the pixel PXL may include a circuit element layer PCL and a display element layer DPL which are successively disposed on a surface of the base layer BSL.

In an embodiment, the circuit element layer PCL may include at least one circuit element which is electrically connected to the light emitting elements LD, and repair patterns. For example, the circuit element layer PCL may include circuit elements which form the pixel circuit PXC of each pixel PXL. Furthermore, the circuit element layer PCL may further include repair transistors RT of each pixel PXL, and detailed descriptions thereof will be made below.

In an embodiment, the circuit element layer PCL may include transistors T and a storage capacitor Cst which are disposed in each pixel area to form each pixel circuit PXC. Furthermore, the circuit element layer PCL may further include at least one power line and/or at least one signal line, etc. which are connected to each pixel circuit PXC and/or each light source unit LSU.

For the sake of explanation, FIGS. 17A to 17D representatively illustrate only a transistor T among the circuit elements and the lines that are disposed in the circuit element layer PCL. Here, the planar/sectional structure of the circuit element layer PCL may be changed in various ways. The position and cross-sectional structure of each transistor T may be changed in various ways depending on embodiments.

Furthermore, the circuit element layer PCL may include insulating layers disposed between respective electrodes and/or lines. In an embodiment, the circuit element layer PCL may include a buffer layer BFL, a gate insulating layer GIL, a first passivation layer PSV1, and a second passivation layer PSV2 which are successively stacked on a surface of the base layer BSL. In some embodiments, the circuit element layer PCL may further include at least one light shielding pattern (not shown) disposed under at least some transistors T.

The buffer layer BFL may prevent impurities from diffusing into each circuit element. The buffer layer BFL may be formed of a single layer, or may be formed of multiple layers having at least two layers. In case that the buffer layer BFL has a multilayer structure, the respective layers may be formed of the same material or different materials. In an embodiment, the buffer layer BFL may be omitted.

Each transistor T may include a gate electrode GE, a semiconductor pattern SCP, a source electrode SE, and a drain electrode DE. Although FIGS. 17A to 17D illustrate an embodiment in which each transistor T includes source and drain electrodes SE and DE that are formed separately from the semiconductor pattern SCP, the disclosure is not limited thereto. For example, in an embodiment, the source and/or drain electrodes SE and/or DE provided in at least one transistor T may be integral with the corresponding semiconductor pattern SCP.

The gate electrode GE may be disposed on the buffer layer BFL. For example, the gate electrode GE may be disposed between the gate insulating layer GIL and the base layer BSL on which the buffer layer BFL is formed.

At least one gate insulating layer GIL may be disposed on the gate electrode GE. For example, the gate insulating layer GIL may be formed over the gate electrodes GE to completely cover (or overlap) the gate electrodes GE of the transistors T that are disposed in the circuit element layer PCL.

The gate insulating layer GIL may be formed of a single layer or multiple layers and include at least one inorganic insulating material and/or organic insulating material. For example, the gate insulating layer GIL may include various kinds of organic/inorganic insulating materials including silicon nitride (SiN$_x$) and silicon oxide (SiO$_x$), etc. The material of the gate insulating layer GIL is not particularly limited.

The semiconductor pattern SCP may be disposed to overlap the gate electrode GE with the gate insulating layer GIL interposed therebetween. For example, the semiconductor pattern SCP may be disposed on the gate insulating layer GIL to overlap each gate electrode GE. The semiconductor pattern SCP may include a first area (also referred to as "source area") which contacts each source electrode SE, a second area (also referred to as "drain area") which contacts each drain electrode DE, and a channel area disposed between the first and second areas. Although FIGS. 17A to 17D illustrate a bottom-gate transistor T in which the gate electrode GE is disposed under the semiconductor pattern SCP, the disclosure is not limited thereto. For example, in an embodiment, the gate electrode GE may form a top-gate transistor T in which the gate electrode GE is disposed over the semiconductor pattern SCP.

In an embodiment, the semiconductor pattern SCP may be a semiconductor pattern formed of polysilicon, amorphous silicon, an oxide semiconductor, etc. Furthermore, the channel area of the semiconductor pattern SCP may be an intrinsic semiconductor, which is an undoped semiconductor pattern. Each of the first and second areas of the semiconductor pattern SCP may be a semiconductor pattern doped with a dopant having a predetermined impurity.

The source and drain electrodes SE and DE may be disposed on the first and second areas of each semiconductor pattern SCP. Although FIGS. 17A to 17D illustrate embodiments where the source and drain electrodes SE and DE are directly disposed on the first and second areas of the semiconductor pattern SCP, the disclosure is not limited thereto. For example, in an embodiment, the source and drain electrodes SE and DE may be disposed on the semiconductor pattern SCP with at least one insulating layer interposed therebetween and be electrically connected to different areas of the semiconductor pattern SCP through respective contact holes formed in the insulating layer.

At least one passivation layer may be disposed on the transistor T including the gate electrode GE, the semiconductor pattern SCP, and the source and drain electrodes SE and DE. For example, at least one passivation layer may be disposed over the transistors T, the storage capacitor Cst, and various lines that are disposed on the circuit element layer PCL, so as to entirely cover (or overlap) the transistors T, the storage capacitor Cst, and the various lines.

In an embodiment, the passivation layer may include first and second passivation layers PSV1 and PSV2 which are formed of different kinds of insulating layers. For example, the passivation layer may include a first passivation layer PSV1 formed of at least one inorganic layer and a second passivation layer PSV2 formed of at least one organic layer. As the passivation layer includes at least one organic layer, the surface of the circuit element layer PCL may be substantially planarized.

In an embodiment, at least one transistor T disposed in the circuit element layer PCL may be electrically connected to at least one pixel electrode. For example, the first transistor T1 of the pixel PXL shown in FIG. 5E may be electrically connected to the first electrode ET1 of the corresponding pixel PXL through a contact hole (e.g., the first contact hole CH1) passing through the first and second passivation layers PSV1 and PSV2 and through the first electrode line ETL1 provided over the first and second passivation layers PSV1 and PSV2.

In an embodiment, at least one signal line and/or at least one power line that is electrically connected to each pixel PXL may be disposed on a layer identical to that of an electrode of each of the circuit elements that form the pixel circuit PXC. For example, the scan line Si of each pixel PXL and the gate electrodes GE of the transistors T may be disposed on the same layer. The data line Dj of each pixel PXL and the source and drain electrodes SE and DE of the transistors T may be disposed on the same layer. Furthermore, the first and/or second power lines PL1 and PL2 and the gate electrodes GE or the source and drain electrodes SE and DE of the transistors T may be disposed on the same layer. In an embodiment, in case that the circuit element layer PCL further includes at least one conductive layer, which is not shown, (e.g., any one conductive layer on which an electrode of the storage capacitor Cst is disposed and which is disposed on a layer different from that of the gate electrodes GE and the source and drain electrodes SE and DE), at least one signal line and/or at least one power line electrically connected to each pixel PXL may be disposed on the conductive layer.

In an embodiment, the display element layer DPL may include a light source unit LSU of each of the pixels PXL. For example, the display element layer DPL may include electrodes which form the light source unit LSU of each pixel PXL, and light emitting elements LD arranged between the electrodes. For example, the display element layer DPL may include the first and second electrodes ET1 and ET2 of each pixel PXL, the first and second electrode lines ETL1 and ETL2 respectively connected to the first and second electrodes ET1 and ET2, at least one intermediate electrode IET disposed between the first and second electrodes ET1 and ET2, and light emitting elements LD electrically connected between a pair of adjacent electrodes among the electrodes.

Furthermore, the display element layer DPL may selectively further include banks PW configured to protrude respective areas of the electrodes upward and contact electrodes CE configured to more reliably connect the light emitting elements LD between the electrodes. The display element layer DPL may further include, e.g., at least one conductive layer and/or at least one insulating layer.

In an embodiment, the display element layer DPL may include the banks PW, the electrodes of each serial stage including the first and second electrodes ET1 and ET2 and the intermediate electrodes IET, the first insulating layer INS1, the light emitting elements LD, the insulating pattern INP, the contact electrodes CE, and a second insulating layer INS2, which are successively disposed and/or formed over the circuit element layer PCL. Furthermore, the display element layer DPL may selectively further include an overcoat layer OC over the second insulating layer INS2.

The banks PW may be disposed at positions spaced apart from each other in the emission area of each pixel PXL. The banks PW may protrude in a height direction from the surface of the base layer BSL on which the circuit element layer PCL is formed. In an embodiment, the banks PW may have substantially the same height, but the disclosure is not limited thereto.

In an embodiment, each bank PW may be disposed between each corresponding electrode (e.g., one of the first and second electrodes ET1 and ET2 and the intermediate electrodes IET) and the circuit element layer PCL. Furthermore, each bank PW may be disposed around at least one light emitting element LD adjacent thereto to face an end (e.g., the first or second end EP1 or EP2) of the at least one light emitting element LD.

Figure 17A:
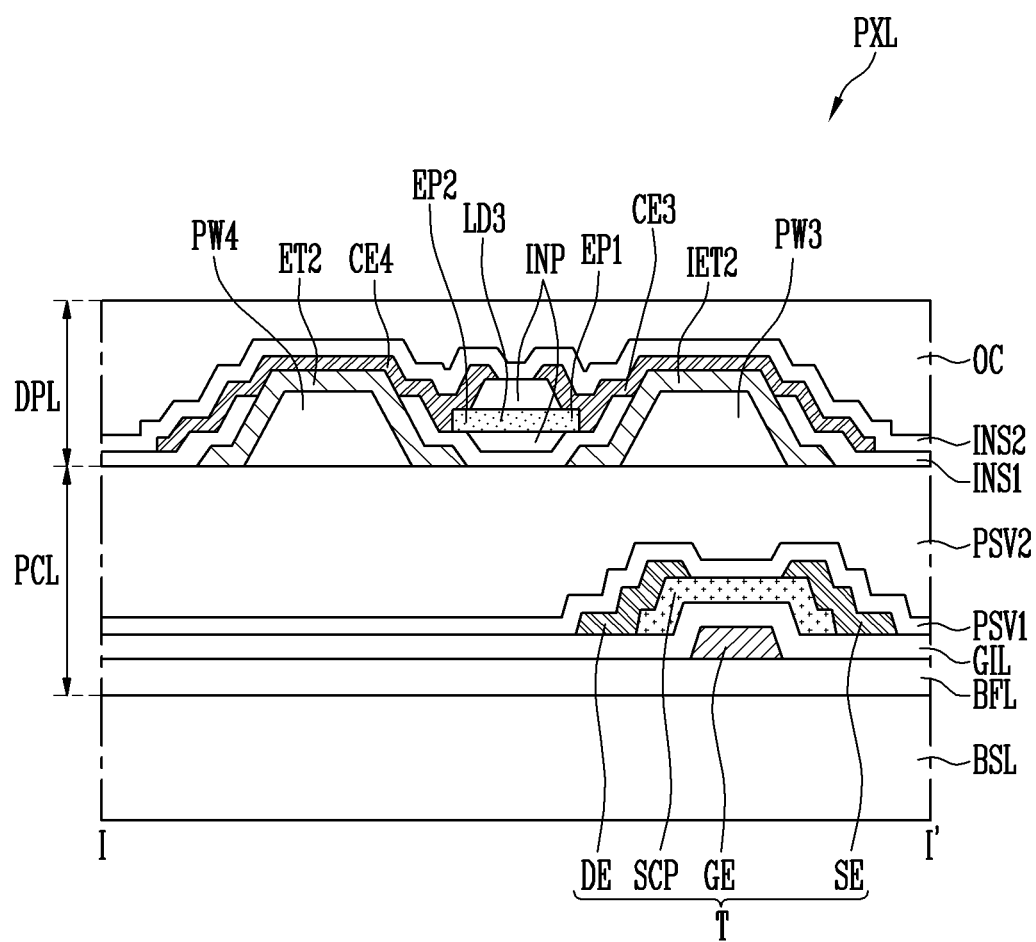
FIGS. 17A to 17D each are a cross-sectional view schematically illustrating a pixel in accordance with an embodiment of the disclosure, and for example illustrate different embodiments of a cross-section of the pixel corresponding to line I-I' of FIG. 16.
Figure 17B:
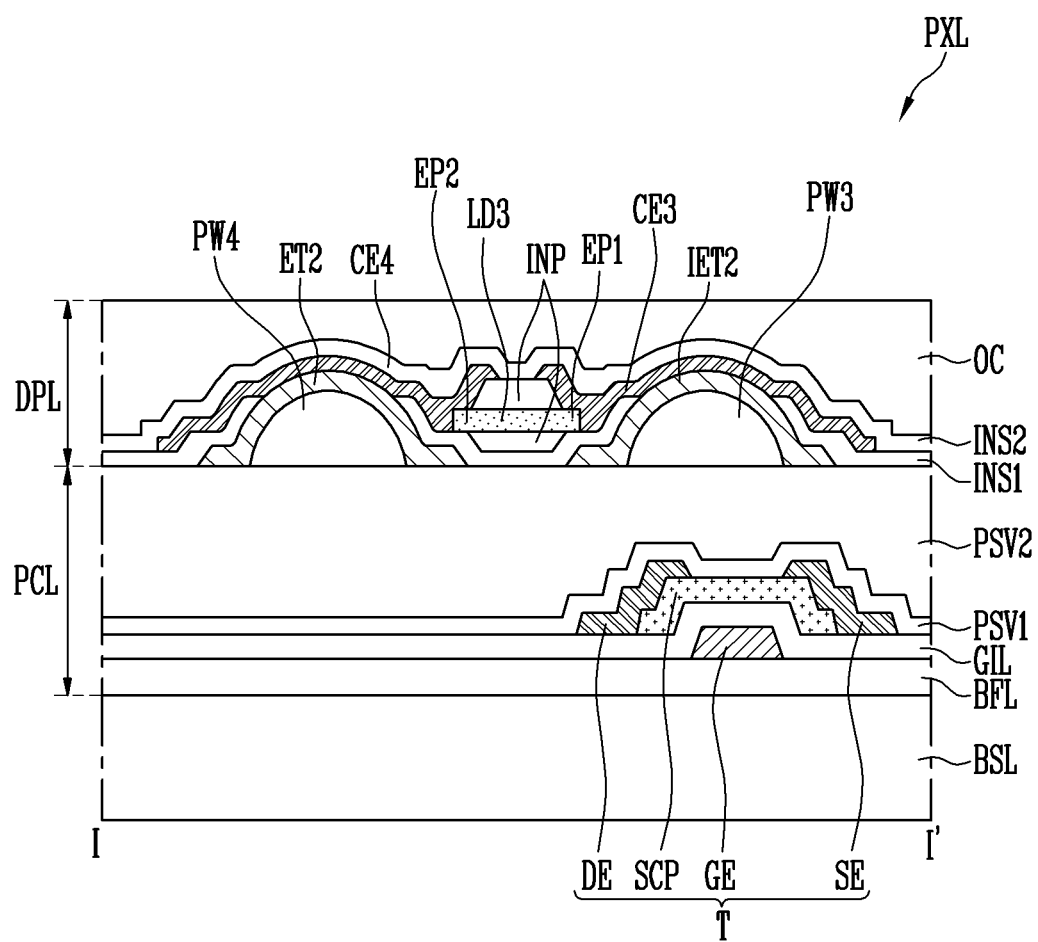
Figure 17C:
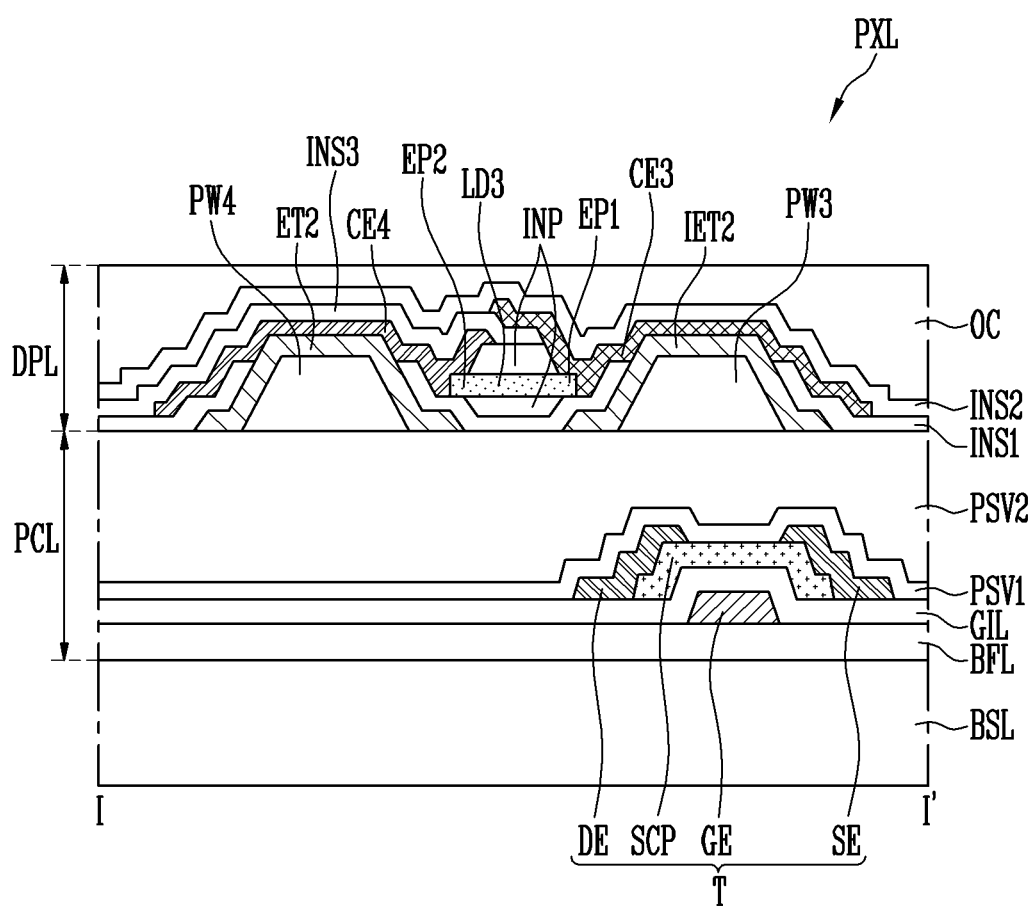
Figure 17D:
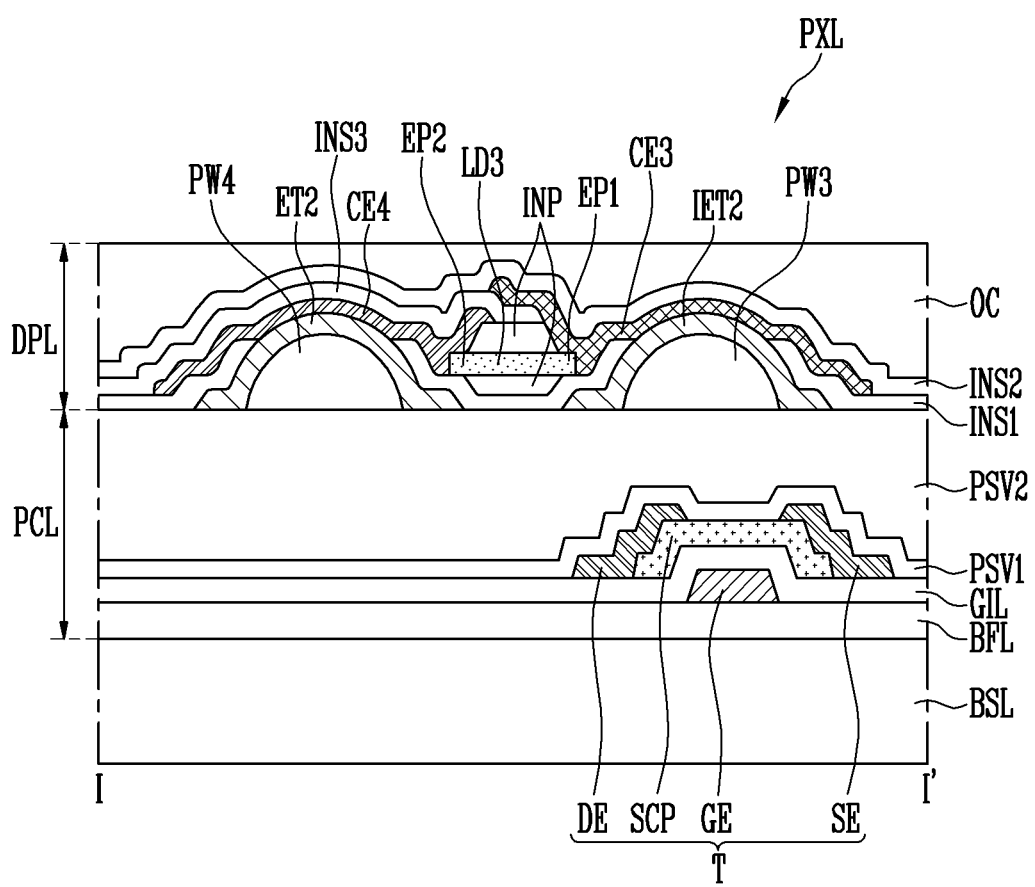

Depending on embodiments, the banks PW may have various shapes. In an embodiment, the banks PW each may have a trapezoidal cross-section, a width of which reduces upward, as illustrated in FIGS. 17A and 17C. In this case, each bank PW may have an inclined surface on at least one side surface thereof. In an embodiment, as illustrated in FIGS. 17B and 17D, the banks PW each may have a semi-circular or semi-elliptical cross-section, a width of which gradually reduces upward. In this case, each bank PW may have a curved surface on at least one side surface thereof. Furthermore, the respective electrodes and/or insulating layers disposed over the banks PW may have a shape corresponding to that of the banks PW. Furthermore, the respective electrodes and/or insulating layers disposed over the banks PW may have inclined surfaces or curved surfaces in areas corresponding to those of the banks PW. In other words, in the disclosure, the shape of the banks PW is not particularly limited, and it may be changed in various ways.

The banks PW may include insulating material including at least one inorganic and/or organic material. For example, the banks PW may include at least one inorganic layer including various inorganic insulating materials such as silicon nitride ($SiN_x$) or silicon oxide ($SiO_x$). As another example, the banks PW each may include at least one organic layer and/or at least one photoresist layer containing various kinds of organic insulating materials, or may be formed as a single or multilayer insulator containing organic/inorganic materials in combination. In an embodiment, the material of the banks PW may be changed in various ways.

In an embodiment, the banks PW each may function as a reflector. For example, the banks PW, along with the first and second electrodes ET1 and ET2 and the intermediate electrodes IET provided thereover, may function as reflectors that guide light emitted from each light emitting element LD in a desired direction, thereby enhancing the light efficiency of the pixel PXL.

The electrodes, for example, the first and second electrodes ET1 and ET2 and the intermediate electrodes IET, which form each serial stage of the light source unit LSU may be disposed over the banks PW. In an embodiment, the electrodes may have a shape corresponding to that of each bank PW. For example, each electrode may have an inclined surface or curved surface corresponding to that of each corresponding bank PW and protrude in a height direction of the base layer BSL.

Each of the first and second electrodes ET1 and ET2 and the intermediate electrodes IET may include at least one conductive material. For example, each of the first and second electrodes ET1 and ET2 and the intermediate electrodes IET may include at least one material among at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), etc., or an alloy thereof, conductive oxide such as indium tin oxide (ITO), indium zinc oxide (IZO), zinc oxide (ZnO), antimony zinc oxide (AZO), indium tin zinc oxide (ITZO), tin oxide ($SnO_2$), and a conductive polymer such as poly(3,4-ethylenedioxythiophene) (PEDOT), but the disclosure is not limited thereto. For example, each of the first and second electrodes ET1 and ET2 and the intermediate electrodes IET may include other conductive materials such as a carbon nanotube and graphene. In other words, each of the first and second electrodes ET1 and ET2 and the intermediate electrodes IET may include at least one of various conductive materials to have conductivity, and the material thereof is not particularly limited. Furthermore, each of the first and second electrodes ET1 and ET2 and the intermediate electrodes IET may have the same conductive material, or at least one different conductive material.

Each of the first and second electrodes ET1 and ET2 and the intermediate electrodes IET may have a single-layer or multi-layer structure. For example, each of the first and second electrodes ET1 and ET2 and the intermediate electrodes IET may include at least one reflective electrode layer. Each of the first and second electrodes ET1 and ET2 and the intermediate electrodes IET may selectively further include at least one of at least one transparent electrode layer disposed over and/or under the reflective electrode layer, and at least one conductive capping layer covering an upper portion of the reflective electrode layer and/or the transparent electrode layer.

In an embodiment, the reflective electrode layer of each of the first and second electrodes ET1 and ET2 and the intermediate electrodes IET may be formed of a conductive material having a uniform reflectivity. For example, the reflective electrode layer may include at least one of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), etc., or an alloy thereof, but the disclosure is not limited thereto. In other words, reflective electrode layer may be formed of various reflective conductive materials. Each of the first and second electrodes ET1 and ET2 and the intermediate electrodes IET that includes the reflective electrode layer may enable light emitted from the opposite ends of each of the light emitting elements LD, e.g., the first and second ends EP1 and EP2, to travel in a direction (e.g., in a frontal direction) in which an image is displayed. Particularly, if the first and second electrodes ET1 and ET2 and the intermediate electrodes IET have inclined or curved surfaces corresponding to the respective banks PW and are disposed to face the first and second ends EP1 and EP2 of the light emitting elements LD, light emitted from the first and second ends EP1 and EP2 of each of the light emitting elements LD may be reflected by the first and second electrodes ET1 and ET2 and the intermediate electrodes IET and thus further reliably travel in the frontal direction of the display panel PNL (e.g., in an upward direction of the base layer BSL). Therefore, the efficiency of light emitted from the light emitting elements LD may be enhanced.

Furthermore, the transparent electrode layer of each of the first and second electrodes ET1 and ET2 and the intermediate electrodes IET may be formed of various transparent conductive materials. For example, the transparent electrode layer may include ITO, IZO, or ITZO, but the disclosure is not limited thereto. In an embodiment, each of the first and second electrodes ET1 and ET2 and the intermediate electrodes IET may have a triple-layer structure having a stacked structure of ITO/Ag/ITO. Therefore, if the first and second electrodes ET1 and ET2 and the intermediate electrodes IET each are formed in a multilayer structure including at least two layers, voltage drop due to signal delay (RC delay) may be minimized. Therefore, a desired voltage can be effectively transmitted to the light emitting elements LD.

If the first and second electrodes ET1 and ET2 and the intermediate electrodes IET each include a conductive capping layer covering the reflective electrode layer and/or the transparent electrode layer, it is possible to prevent the reflective electrode layer of each of the first and second electrodes ET1 and ET2 and the intermediate electrodes IET from being damaged by defects caused during the manufacturing process of the pixel PXL. However, the conductive capping layer may be selectively included in the first and second electrodes ET1 and ET2 and the intermediate electrodes IET and may be omitted depending on embodiments. Furthermore, the conductive capping layer may be considered as a component of each of the first and second electrodes ET1 and ET2 and the intermediate electrodes IET, or may be considered as a separate component disposed on the first and second electrodes ET1 and ET2 and the intermediate electrodes IET.

The first insulating layer INS1 may be disposed on areas of the first and second electrode ET1 and ET2 and the intermediate electrodes IET. For example, the first insulating layer INS1 may be formed to cover (or overlap) areas of the first and second electrodes ET1 and ET2 and the intermediate electrodes IET and may include an opening that exposes other areas of the first and second electrodes ET1 and ET2 and the intermediate electrodes IET. For example, the first insulating layer INS1 may allow respective areas of the first and second electrodes ET1 and ET2 and the intermediate electrodes IET to be exposed on the respective banks PW. In an embodiment, the first insulating layer INS1 may be omitted. The light emitting elements LD may be directly disposed on the second passivation layer PSV2 and/or an end of each of the first and second electrodes ET1 and ET2 and the intermediate electrodes IET.

In an embodiment, the first insulating layer INS1 may be formed to cover (or overlap) the overall surfaces of the first and second electrodes ET1 and ET2 and the intermediate electrodes IET. After the light emitting elements LD are supplied and aligned on the first insulating layer INS1, the first insulating layer INS1 may be partially opened to expose the first and second electrodes ET1 and ET2 and the intermediate electrodes IET in an area over each bank PW. In an embodiment, the first insulating layer INS1 may be patterned in the form of an individual pattern which is sectionally disposed only under the light emitting elements LD after the supply and alignment of the light emitting elements LD have been completed.

In other words, the first insulating layer INS1 may be interposed between the light emitting elements LD and the electrodes including the first and second electrodes ET1 and ET2 and the intermediate electrodes IET and may expose at least one area of each of the first and second electrodes ET1 and ET2. The first insulating layer INS1 may be formed to cover (or overlap) the electrodes after the electrodes have been formed, and prevent the electrodes from being damaged during a subsequent process. Furthermore, the first insulating layer INS1 may stably support each light emitting element LD.

The first insulating layer INS1 may be formed of a single layer or multiple layers and include at least one inorganic insulating material and/or organic insulating material. For example, the first insulating layer INS1 may include various kinds of organic/inorganic insulating materials including silicon nitride ($SiN_x$), silicon oxide ($SiO_x$), aluminum oxide ($Al_2O_3$), etc. The material of the first insulating layer INS1 is not particularly limited.

Light emitting elements LD may be supplied to and aligned in each pixel area, particularly, the emission area of each pixel PXL, in which the first insulating layer INS1 is formed. For example, light emitting elements LD may be supplied to an emission area of each pixel PXL by an inkjet method, a slit coating method, or other various methods. The light emitting elements LD may be aligned between the electrodes with directionality by predetermined alignment signals (or alignment voltages) applied to the electrodes including the first and second electrodes ET1 and ET2 and the intermediate electrodes IET.

In an embodiment, at least some of the light emitting elements LD may be horizontally disposed between a pair of electrodes such that the opposite ends thereof, e.g., the first and second ends EP1 and EP2 thereof, overlap the pair of electrodes. For example, at least one light emitting element LD may be disposed between a pair of electrodes that form each serial stage. Furthermore, in an embodiment, other some of the light emitting elements LD may be disposed in a diagonal direction between a pair of electrodes. In an embodiment, at least some of the light emitting elements LD may be disposed between a pair of electrodes not to overlap the pair of electrodes, and be electrically connected to the pair of electrodes through the respective contact electrodes CE.

The insulating pattern INP may be disposed on areas of the light emitting elements LD. For example, the insulating pattern INP may expose the first and second ends EP1 and EP2 of the light emitting elements LD and be partially disposed over only the areas of the light emitting elements LD including respective central areas of the light emitting elements LD. Although the insulating pattern INP is formed as an independent pattern in the emission area of each pixel PXL, the disclosure is not limited thereto. The insulating pattern INP may be omitted in some embodiments. The opposite ends of the contact electrodes CE adjacent to each other may be directly disposed on the light emitting elements LD.

The insulating pattern INP may be formed of a single layer or multiple layers and include at least one inorganic insulating material and/or organic insulating material. For example, the insulating pattern INP may include various kinds of organic/inorganic insulating materials including silicon nitride ($SiN_x$), silicon oxide ($SiO_x$), aluminum oxide ($Al_2O_3$), photoresist (PR) material, etc. The material of the insulating pattern INP is not particularly limited.

After the alignment of the light emitting elements LD has been completed, the insulating pattern INP is formed on the light emitting elements LD so that the light emitting elements LD may be prevented from being removed from the aligned position. Furthermore, in case that space is present between the first insulating layer INS1 and the light emitting elements LD, the space may be filled with the insulating material introduced thereinto during a process of forming the insulating pattern INP. Therefore, the light emitting elements LD may be more stably supported.

The opposite ends of the light emitting elements LD, e.g., the first and second ends EP1 and EP2, which are not covered with the insulating pattern INP, may be respectively covered with the contact electrodes CE. For example, respective ends of the adjacent contact electrodes CE may be disposed, at positions spaced apart from each other, on the first and second ends EP1 and EP2 of at least one adjacent light emitting element LD, with the insulating pattern INP interposed therebetween.

In an embodiment, the contact electrodes CE may be simultaneously formed on the same layer on a surface of the base layer BSL, as illustrated in FIGS. 17A and 17B. Therefore, a process of fabricating the pixel PXL and the display device including the pixel PXL may be simplified.

In an embodiment, the contact electrodes CE may be divided into groups and successively formed on different layers on a surface of the base layer BSL by groups. For example, as illustrated in FIGS. 17C and 17D, a pair of adjacent contact electrodes CE may be successively formed on different layers on a surface of the base layer BSL. An additional third insulating layer INS3 may be disposed between the pair of contact electrodes CE. In other words, the positions and relative disposition relationship of the contact electrodes CE may be changed in various ways.

Furthermore, the contact electrodes CE may be disposed over the first and second electrodes ET1 and ET2 and the intermediate electrodes IET to cover respective exposed areas of the first and second electrodes ET1 and ET2 and the intermediate electrode IET. For example, the contact electrodes CE may be disposed on respective areas of the first and second electrodes ET1 and ET2 and the intermediate electrodes IET to respectively contact the first and second electrodes ET1 and ET2 and the intermediate electrode IET. Therefore, the contact electrodes CE may be electrically connected to the first and second electrodes ET1 and ET2 and the intermediate electrodes IET that are disposed over the respective contact electrodes CE, so that the first and second electrodes ET1 and ET2 and the intermediate electrodes IET each may be electrically connected to the first or second end EP1 or EP2 of at least one adjacent light emitting element LD through the contact electrodes CE.

In an embodiment, the contact electrodes CE may be formed of various transparent conductive materials. For example, the contact electrodes CE may include at least one of various conductive materials, e.g., ITO, IZO, and ITZO and may be substantially transparent or semi-transparent to satisfy a predetermined transmittancy. Therefore, light emitted from the light emitting elements LD through the first and second ends EP1 and EP2 may be emitted out of the display device through the contact electrodes CE.

The second insulating layer INS2 may be disposed on the contact electrodes CE. For example, to cover the banks PW, the first and second electrodes ET1 and ET2, the intermediate electrodes IET, the light emitting elements LD, the insulating pattern INP, and the contact electrodes CE, the second insulating layer INS2 may be formed and/or disposed on the overall surface of the display area DA of the base layer BSL on which the banks PW, the first and second electrodes ET1 and ET2, the intermediate electrodes IET, the light emitting elements LD, the insulating pattern INP, and the contact electrodes CE are formed. The second insulating layer INS2 may include at least one inorganic layer and/or organic layer.

In an embodiment, the second insulating layer INS2 may include a thin-film encapsulation layer having a multilayer structure, but the disclosure is not limited thereto. In some embodiments, at least one overcoat layer OC may be further disposed over the second insulating layer INS2.

In an embodiment, the second insulating layer INS2 and the overcoat layer OC each may be formed of a single layer or multiple layers and include at least one inorganic insulating material and/or organic insulating material. For example, the second insulating layer INS2 and the overcoat layer OC may include various kinds of organic/inorganic insulating materials including silicon nitride ($SiN_x$) or silicon oxide ($SiO_x$).

Figure 18:
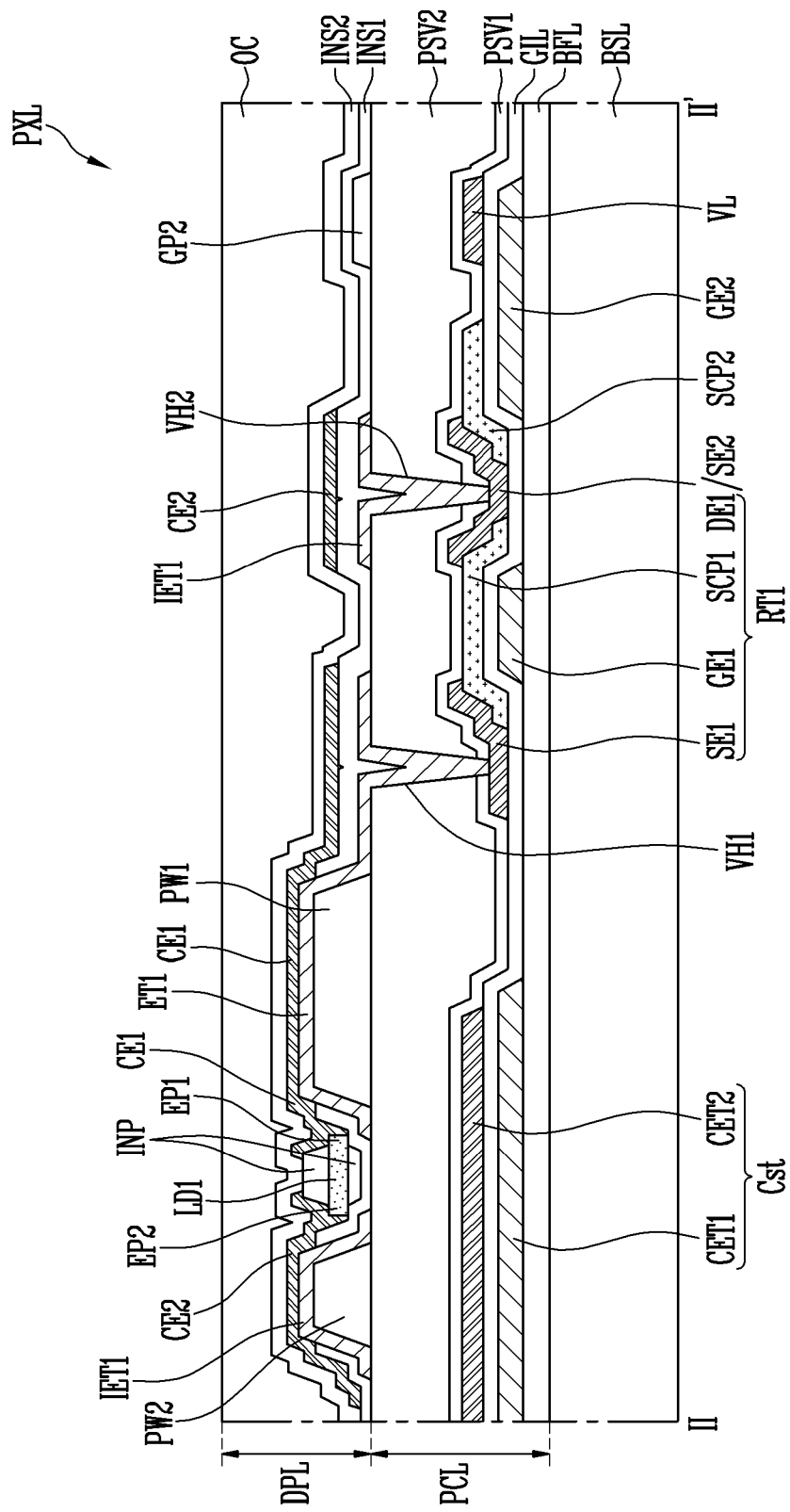
FIG. 18 is a cross-sectional view schematically illustrating a pixel in accordance with an embodiment of the disclosure and for example illustrates an embodiment of a cross-section of the pixel corresponding to line II-IF of FIG. 16.

FIG. 18 is a schematic cross-sectional view illustrating a pixel PXL in accordance with an embodiment and, for example illustrates an embodiment of a cross-section of the pixel PXL corresponding to line II-IF of FIG. 16. In the description of the embodiment of FIG. 18, like reference numerals will be used to designate components similar or equal to those of the previous embodiments, and detailed descriptions thereof will be omitted.

Referring to FIGS. 4 to 18, the circuit element layer PCL may include circuit elements including the storage capacitor Cst and constituting the pixel circuit PXC of each pixel PXL and may further include repair patterns. For example, the circuit element layer PCL may include repair transistors RT corresponding to each serial stage of the light source unit LSU.

In an embodiment, the repair transistors RT may have substantially identical or similar cross-sectional structures. In an embodiment, the repair transistors RT may have a cross-sectional structure substantially identical or similar to that of the transistors T constituting the pixel circuit PXC. For example, each repair transistor RT may include a gate electrode GE disposed on the buffer layer BFL, a semiconductor pattern SCP disposed to overlap an area of the gate electrode GE with a gate insulating layer GIL interposed therebetween, and source and drain electrodes SE and DE respectively disposed on different ends of the semiconductor pattern SCP and configured to electrically connect the different ends of the semiconductor pattern SCP between a pair of electrodes constituting a corresponding serial stage.

In an embodiment, the storage capacitor Cst may include first and second capacitor electrodes CET1 and CET2 spaced apart from each other with at least one insulating layer interposed therebetween. In an embodiment, at least one of the first and second capacitor electrodes CET1 and CET2 and at least one electrode constituting each of the repair transistors RT and the transistors T of the pixel circuit PXC may be simultaneously formed on the same layer. For example, the first capacitor electrode CET1 and the gate electrodes GE of the transistors T of the pixel circuit PXC and the repair transistors RT may be simultaneously formed on the same layer. The second capacitor electrode CET2 and the source and drain electrodes SE and DE of the transistors T of the pixel circuit PXC and the repair transistors RT may be simultaneously formed on the same layer. However, the disclosure is not limited thereto. For example, in an embodiment, the circuit element layer PCL may further include at least one insulating layer and at least one conductive layer, which is not shown. At least one of the first and second capacitor electrodes CET1 and CET2 may be disposed on a layer different from that of the gate electrodes GE, the source electrodes SE, and the drain electrodes DE that constitute each of the repair transistors RT and the transistors T of the pixel circuit PXC.

In an embodiment, the gate-on power line VL may be disposed on a layer separated from a gate layer on which the gate electrodes GE are disposed, with at least one insulating layer interposed therebetween. For example, the gate-on power line VL may be disposed on a source/drain layer on which the source and drain electrodes SE and DE are disposed. However, the disclosure is not limited to the foregoing structure, and the position of the gate-on power line VL may be changed in various ways. In an embodiment, the gate-on power line VL may be disposed in a horizontal direction in the display area DA and may be disposed on a layer different from that of the data lines Dj so as to avoid a short-circuit with the data lines Dj. For example, the source and drain electrodes SE and DE and the gate-on power line VL may be disposed on a first source/drain layer. The data lines Dj may be disposed on a second source/drain layer separated from the first source/drain layer, with at least one interlayer insulating layer (not shown) interposed therebetween. In an embodiment, the source and drain electrodes SE and DE and the data lines Dj may be disposed on the first source/drain layer. The gate-on power line VL may be disposed on the second source/drain layer separated from the first source/drain layer.

In an embodiment, the display element layer DPL may further include guide patterns GP corresponding to the respective repair transistors RT. For example, the display element layer DPL may include a first guide pattern GP1 configured to overlap the first gate electrode GE1 and the gate-on power line VL, a second guide pattern GP2 configured to overlap the second gate electrode GE2 and the gate-on power line VL, and a third guide pattern GP3 configured to overlap the third gate electrode GE3 and the gate-on power line VL.

In an embodiment, the guide patterns GP may include a conductive or insulating pattern disposed on the same layer as that of at least one electrode of a plurality of electrodes that include the first and second electrodes ET1 and ET2 and the intermediate electrodes IET and are disposed in the display element layer DPL, or disposed on the same layer as that of at least one insulating layer (or the insulating pattern) disposed in the display element layer DPL. Furthermore, each guide pattern GP may be formed of at least one conductive or insulating pattern configured of a single layer or multiple layers, and the material thereof is not particularly limited.

For example, the guide patterns GP may be formed on the same layer during the same process as that of the first and second electrodes ET1 and ET2 and the intermediate electrodes IET (e.g., a reflective electrode layer, a transparent electrode layer, and/or a conductive capping layer that form the first and second electrodes ET1 and ET2 and the intermediate electrodes IET). In an embodiment, the guide patterns GP may be formed on the same layer during the same process as that of the contact electrodes CE. In an embodiment, the guide patterns GP may be simultaneously formed on the same layer as that of the guide patterns GP, the banks PW, or the insulating pattern INP. There is no need to perform a separate process for forming the guide patterns GP, and at the step of forming the light source unit LSU, the guide patterns GP may be formed along with the light source unit LSU.

Figure 19:
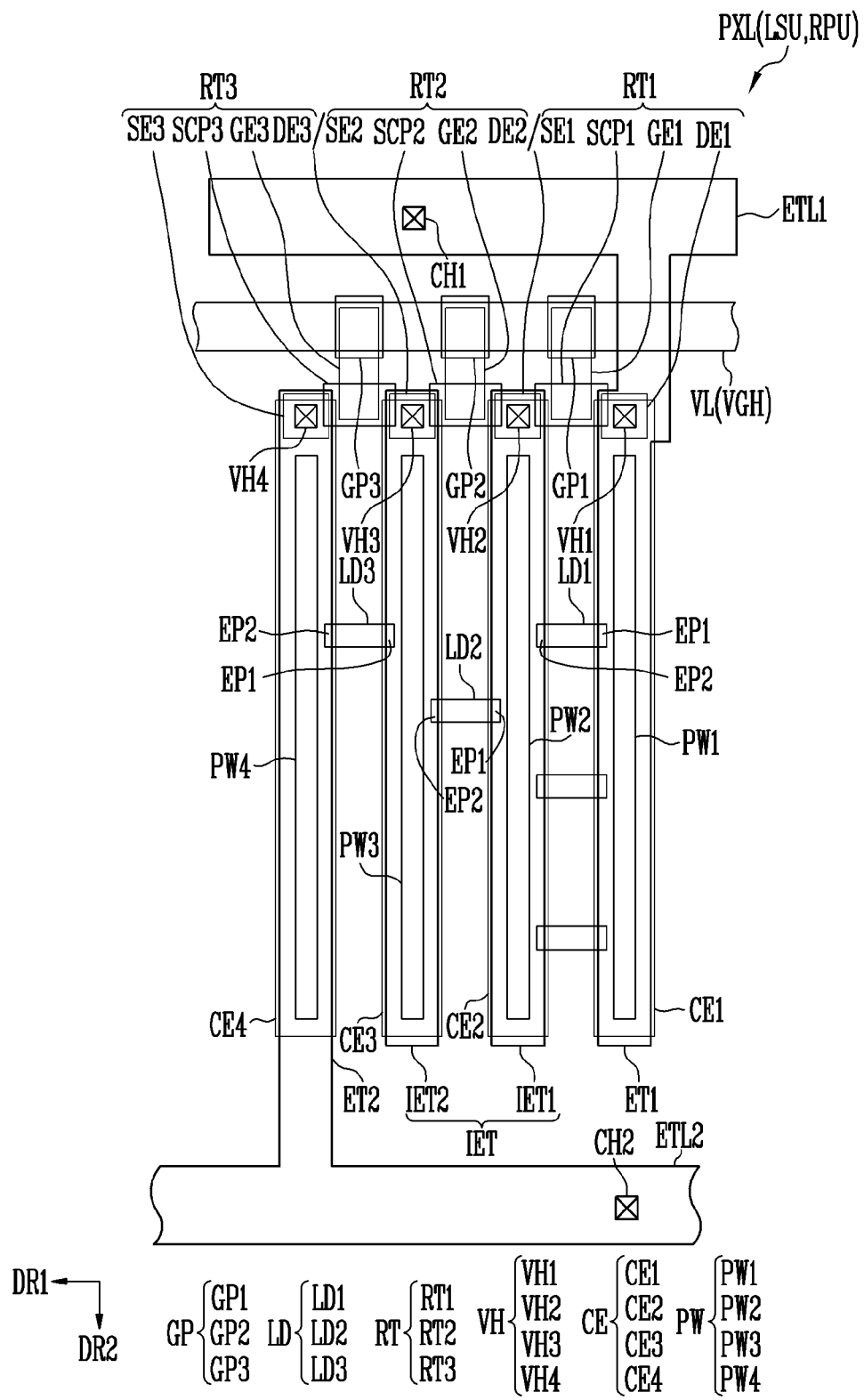
FIG. 19 is a plan view schematically illustrating a pixel in accordance with an embodiment of the disclosure, and for example illustrates a modification of the embodiment of FIG. 16.

FIG. 19 is a schematic plan view illustrating a pixel PXL in accordance with an embodiment, and for example, illustrates a modification of the embodiment of FIG. 16. In an embodiment, the pixel PXL illustrated in FIG. 19 may be any one of the pixels PXL illustrated in FIGS. 4 to 14. For example, the pixel PXL illustrated in FIG. 19 may be a pixel PXL in accordance with the embodiment of FIG. 9. Furthermore, in an embodiment, the pixels PXL disposed in the display area DA (see FIG. 4) may have substantially identical or similar structures. In the description of the embodiment of FIG. 19, like reference numerals will be used to designate components similar or equal to those of the previous embodiments (e.g., the embodiment of FIG. 16), and detailed descriptions thereof will be omitted.

Compared to the embodiment of FIGS. 7 and 16, in the embodiment of FIGS. 9 and 19, the gate-on power line VL and the repair transistors RT that overlap each other may be disposed around the first or second electrode line ETL1 and ETL2. In an embodiment, the gate-on power line VL and the repair transistors RT may be disposed around an electrode line to which a power or signal having a potential more similar to that of the gate-on power line VL and the repair transistors RT is supplied, among the first and second electrode lines ETL1 and ETL2. For example, the gate-on power line is disposed adjacent to one of the first and second electrode lines that is supplied with a power or signal having a potential closer to a potential of a power or signal of the gate-on power line than the other of the first and second electrode lines. Therefore, electrical stability of the pixel PXL including the repair transistors RT may be secured.

For example, in case that, as illustrated in the embodiments of FIGS. 7 and 16, the repair transistors RT are P-type transistors, and the gate-on power line VL is supplied with a gate-low voltage VGL capable of reliably turning on the repair transistors RT (e.g., a voltage lower than the potential of the second power voltage VSS to be transmitted to the second electrode ET2 by a threshold voltage of the repair transistors RT or higher), the gate-on power line VL and the repair transistors RT may be disposed around the second electrode line ETL2. For example, the gate-on power line VL may be disposed between the electrodes of the light source unit LSU and the second electrode line ETL2. The repair transistors RT may be disposed on ends of the electrodes that are adjacent to the second electrode line ETL2.

As another example, in case that, as illustrated in the embodiments of FIGS. 9 and 19, the repair transistors RT are N-type transistors, and the gate-on power line VL is supplied with a gate-high voltage VGH capable of reliably turning on the repair transistors RT (e.g., a voltage higher than the potential of the first power voltage VDD to be transmitted to the first electrode ET1 by the threshold voltage of the repair transistors RT or higher), the gate-on power line VL and the repair transistors RT may be disposed around the first electrode line ETL1. For example, the gate-on power line VL may be disposed between the electrodes of the light source unit LSU and the first electrode line ETL1. The repair transistors RT may be disposed on ends of the electrodes that are adjacent to the first electrode line ETL1.

Figure 20A:
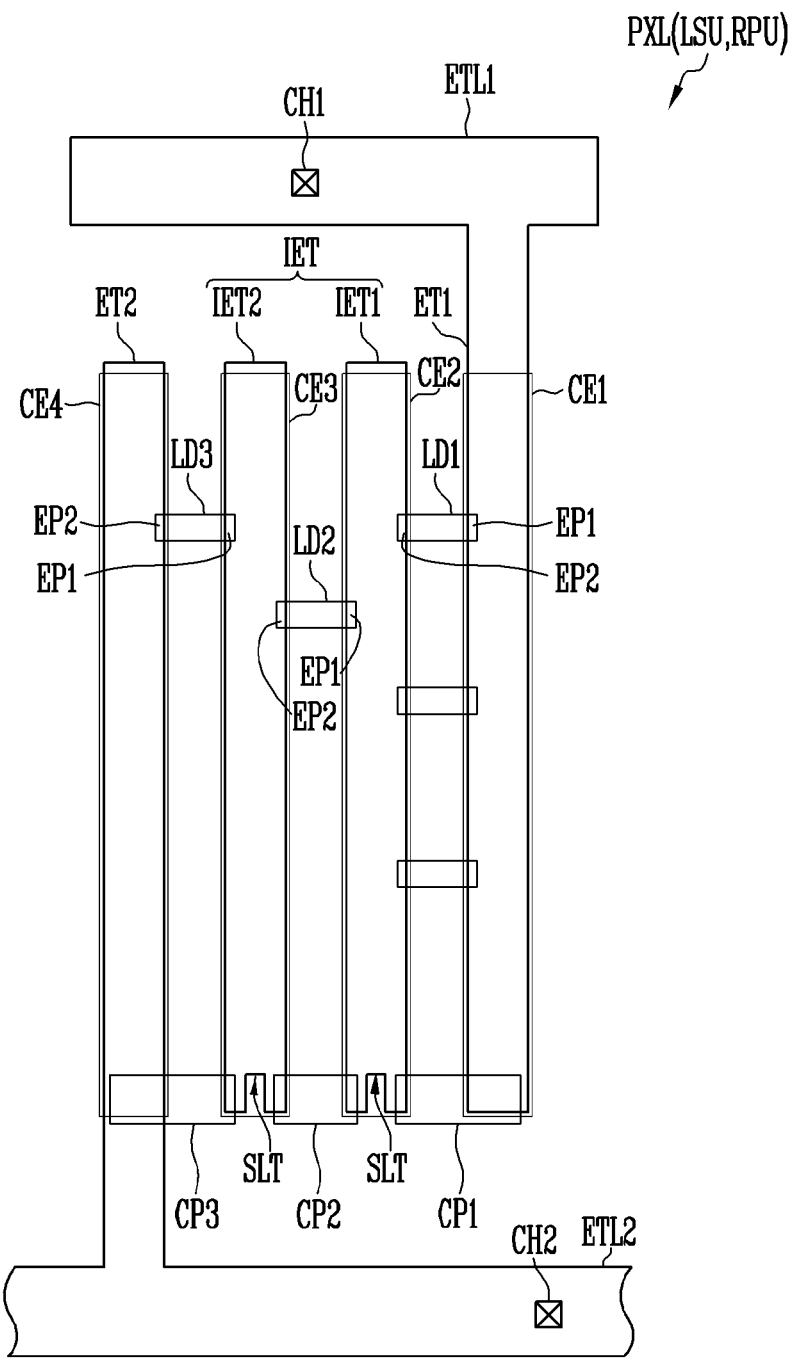
FIGS. 20A to 20C are plan views each schematically illustrating a pixel in accordance with an embodiment of the disclosure.
Figure 20B:
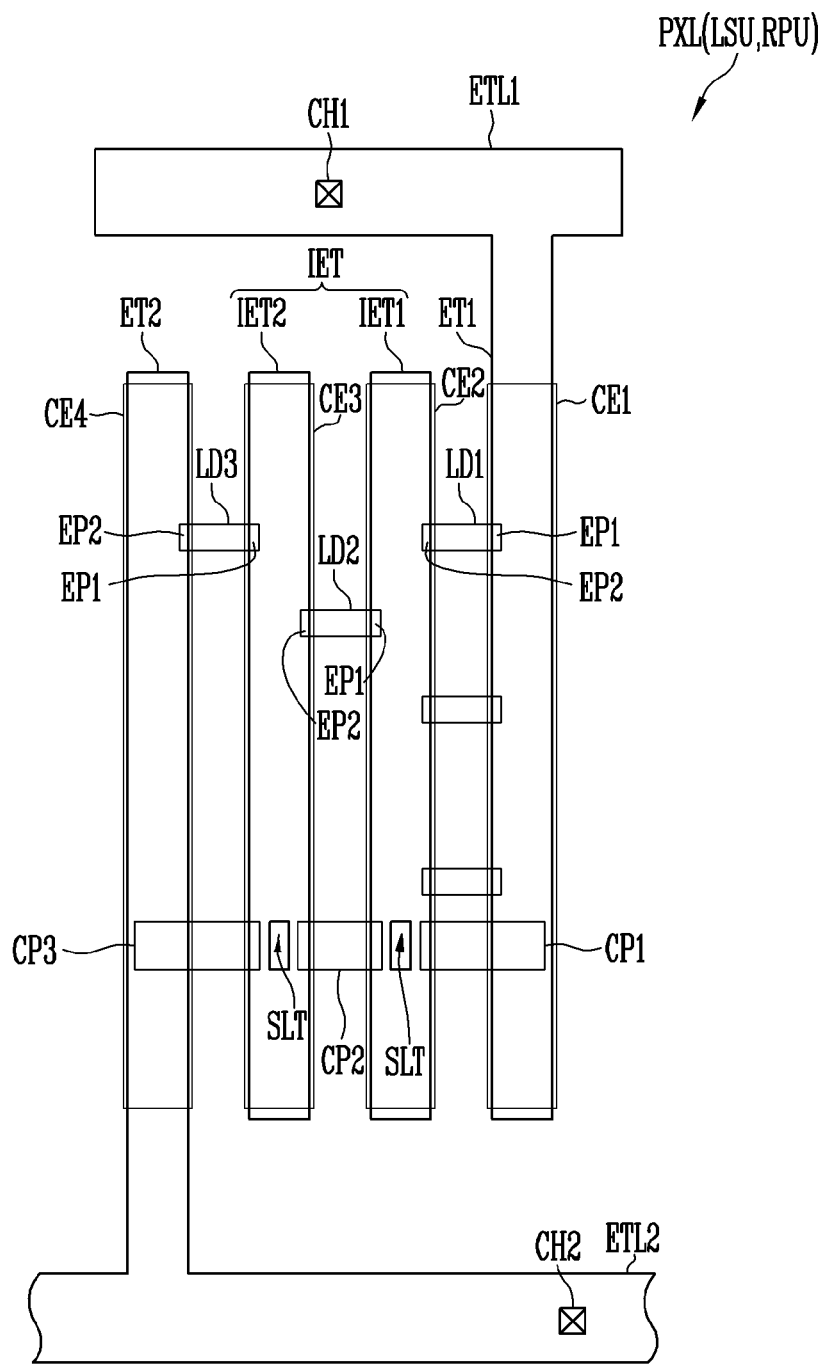
Figure 20C:
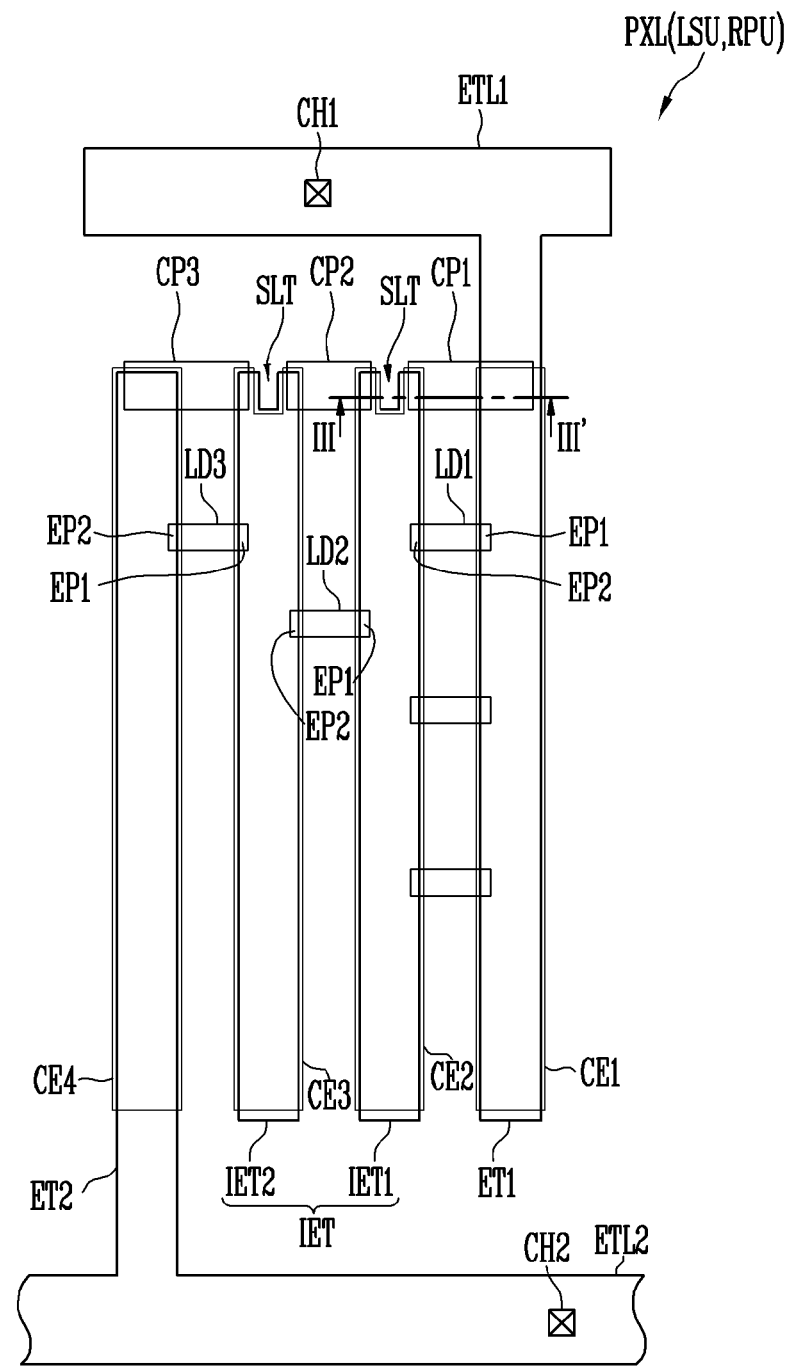
Figure 21:
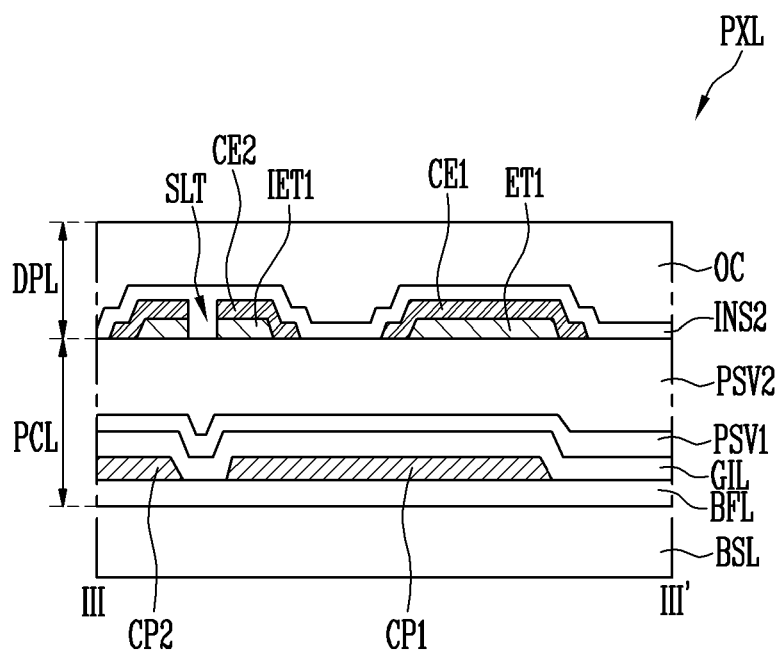
FIG. 21 is a cross-sectional view schematically illustrating a pixel in accordance with an embodiment of the disclosure and for example illustrates an embodiment of a cross-section of the pixel corresponding to line of FIG. 20C.

FIGS. 20A to 20C are schematic plan diagrams each illustrating a pixel PXL in accordance with an embodiment. FIG. 21 is a schematic cross-sectional view illustrating a pixel PXL in accordance with an embodiment and, for example illustrates an embodiment of a cross-section of the pixel PXL corresponding to line of FIG. 20C.

To disclose embodiments having more various structures, FIGS. 20A to 20C and 21 illustrate an embodiment where, among the components that are selectively disposed in the light source unit LSU according to the embodiments of FIGS. 16 to 19, the contact electrodes CE are provided, but the banks PW are not provided. However, the disclosure is not limited thereto. For example, in the pixel PXL according to the embodiment of FIGS. 20A to 20C and 21, the banks PW may be selectively further disposed under the electrodes that form the light source unit LSU.

In an embodiment, each pixel PXL illustrated in FIGS. 20A to 20C and 21 may be a pixel PXL illustrated in FIGS. 4 to 14. For example, each pixel PXL illustrated in FIGS. 20A to 20C and 21 may be a pixel PXL in accordance with the embodiment of FIG. 11. Furthermore, in an embodiment, the pixels PXL disposed in the display area DA (see FIG. 4) may have substantially identical or similar structures. In the description of the embodiment(s) of FIGS. 20A to 20C and 21, like reference numerals will be used to designate components similar or equal to those of the previous embodiments, and detailed descriptions thereof will be omitted.

Referring to FIGS. 11, 20A to 20C, and 21, the repair patterns that constitute the repair pattern circuit RPU of each pixel PXL may be conductive patterns CP corresponding to each serial stage. In an embodiment, each conductive pattern CP may be disposed to intersect a pair of electrodes corresponding thereto. For example, each conductive pattern CP may be disposed between a pair of electrodes such that opposite ends thereof overlap the pair of electrodes.

For example, in case that the light source unit LSU includes four electrodes, e.g., the first electrode ET1, the first intermediate electrode IET1, the second intermediate electrode IET2, and the second electrode ET2, which are sequentially disposed and form three serial stages, the repair pattern circuit RPU may include a first conductive pattern CP1 corresponding to a first serial stage, a second conductive pattern CP2 corresponding to a second serial stage, and a third conductive pattern CP3 corresponding to a third serial stage. In an embodiment, the first conductive pattern CP1 may be disposed between the first electrode ET1 and the first intermediate electrode IET1 such that the opposite ends thereof overlap the first electrode ET1 and the first intermediate electrode IET1. Likewise, the second conductive pattern CP2 may be disposed between the first intermediate electrode IET1 and the second intermediate electrode IET2 such that the opposite ends thereof overlap the first intermediate electrode IET1 and the second intermediate electrode IET2. The third conductive pattern CP3 may be disposed between the second intermediate electrode IET2 and the second electrode ET2 such that the opposite ends thereof overlap the second intermediate electrode IET2 and the second electrode ET2.

In an embodiment, in case that at least one light emitting element LD is validly connected to each serial stage in the forward direction, each conductive pattern CP may remain separated from a pair of electrodes corresponding thereto. For example, each conductive pattern CP may be disposed in the circuit element layer PCL and be separated from the electrodes of the light source unit LSU with at least one passivation layer (for example, the first and/or second passivation layers PSV1 and/or PSV2) interposed therebetween. For example, each conductive pattern CP along with the gate electrodes GE may be disposed on the gate layer of the circuit element layer PCL, but the position thereof is not limited thereto. For example, in an embodiment, each conductive pattern CP along with the source and drain electrodes SE and DE may be disposed on the source/drain layer (or the first source/drain layer) of the circuit element layer PCL.

Here, the positions of the conductive patterns CP are not limited to being in the circuit element layer PCL, and the positions of the conductive patterns CP may be changed in various ways. For example, in an embodiment, the conductive patterns CP may also be disposed in the display element layer DPL.

In an embodiment, each intermediate electrode IET may overlap two adjacent conductive patterns CP. For example, the first intermediate electrode IET1 may overlap an end of each of the first and second conductive patterns CP1 and CP2. The second intermediate electrode IET2 may overlap an end of each of the second and third conductive patterns CP2 and CP3. In an embodiment, two adjacent conductive patterns CP may be spaced apart from each other and be disposed adjacent to each other.

In an embodiment, if an open defect occurs in at least one serial stage, a pair of electrodes corresponding to the serial stage may be electrically connected through the conductive pattern CP provided between the electrodes. For example, if an open defect occurs in the second serial stage, the second conductive pattern CP2 may be electrically connected between the first and second intermediate electrodes IET1 and IET2 by a connection process using a layer. A laser beam is required to be applied to an area where the second conductive pattern CP2 overlaps each of the first and second intermediate electrodes IET1 and IET2. A slit SLT may be formed in each intermediate electrode IET so that a position at which the laser beam is to be applied may be readily discerned. For example, each intermediate electrode IET may overlap at least two repair patterns (e.g., two conductive patterns CP corresponding to two successive serial stages) spaced apart from each other and include the slit SLT disposed between the at least two repair patterns.

In case that it is assumed that an open defect occurs in the second serial stage, the second conductive pattern CP2 may be used to electrically connect the first and second intermediate electrodes IET1 and IET2, and allow the open defect to be repaired. For example, the first intermediate electrode IET1 may be electrically connected to an end of the second conductive pattern CP2 by applying a laser beam to a left side of the slit SLT formed in the first intermediate electrode IET1. The second intermediate electrode IET2 may be electrically connected to another end of the second conductive pattern CP2 by applying a laser beam to a right side of the slit SLT formed in the second intermediate electrode IET2. In other words, each intermediate electrode IET may include a slit SLT disposed around the conductive patterns CP as a guide for readily discerning a position at which the intermediate electrode IET is required to be short-circuited with the conductive patterns CP to allow an open defect to be repaired.

Although FIGS. 20A and 20C illustrate an embodiment where the slit SLT is formed in only each intermediate electrode IET, the disclosure is not limited thereto. For example, in an embodiment, the slit SLT may be formed in the contact electrodes CE (e.g., the second and third contact electrodes CE2 and CE3) disposed over each intermediate electrode IET, or the slit SLT may be formed in all of the intermediate electrodes IET and the contact electrodes CE.

Each of the first and second electrodes ET1 and ET2 disposed on the opposite ends of the light source unit LSU and/or the contact electrodes CE (e.g., the first and fourth contact electrodes CE1 and CE4) disposed on the first and second electrodes ET1 and ET2 may selectively include a guide pattern, including the slit SLT. In other words, the first and second electrodes ET1 and ET2 and the contact electrodes CE may or may not include each guide pattern.

As described in the foregoing embodiment, if the repair patterns are formed as the conductive patterns CP, the structure of the repair pattern circuit RPU may be more simplified, and a range in which the positions of the conductive patterns CP can be selected may be increased. For example, the conductive patterns CP may be disposed on ends of the electrodes that constitute the light source unit LSU, as described in the embodiments shown in FIGS. 20A and 20C, or may be disposed on intermediate portions of the electrodes, as described in the embodiment shown in FIG. 20B.

Figure 22:
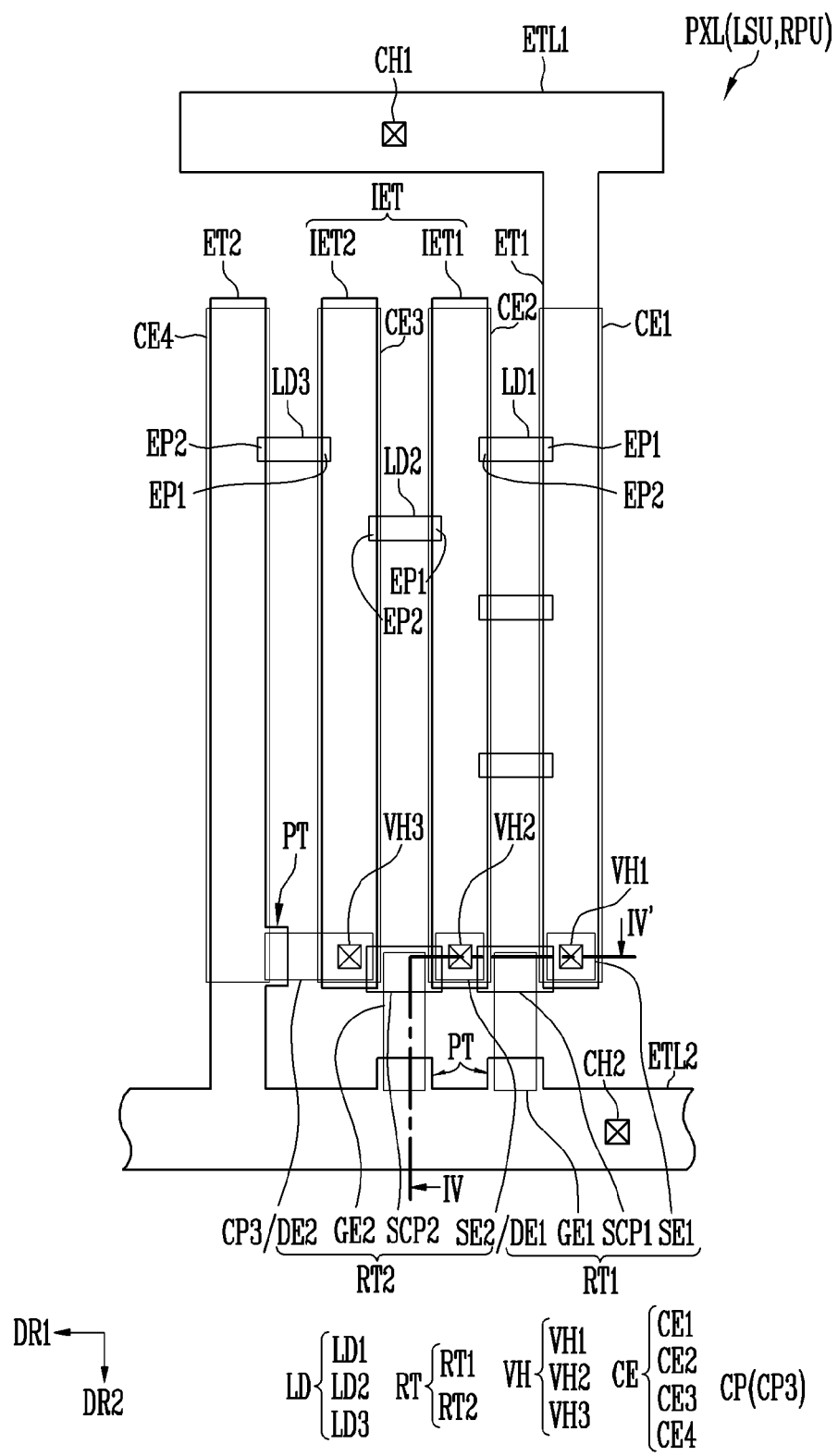
FIGS. 22 and 23 are plan views each schematically illustrating a pixel in accordance with an embodiment of the disclosure.
Figure 23:
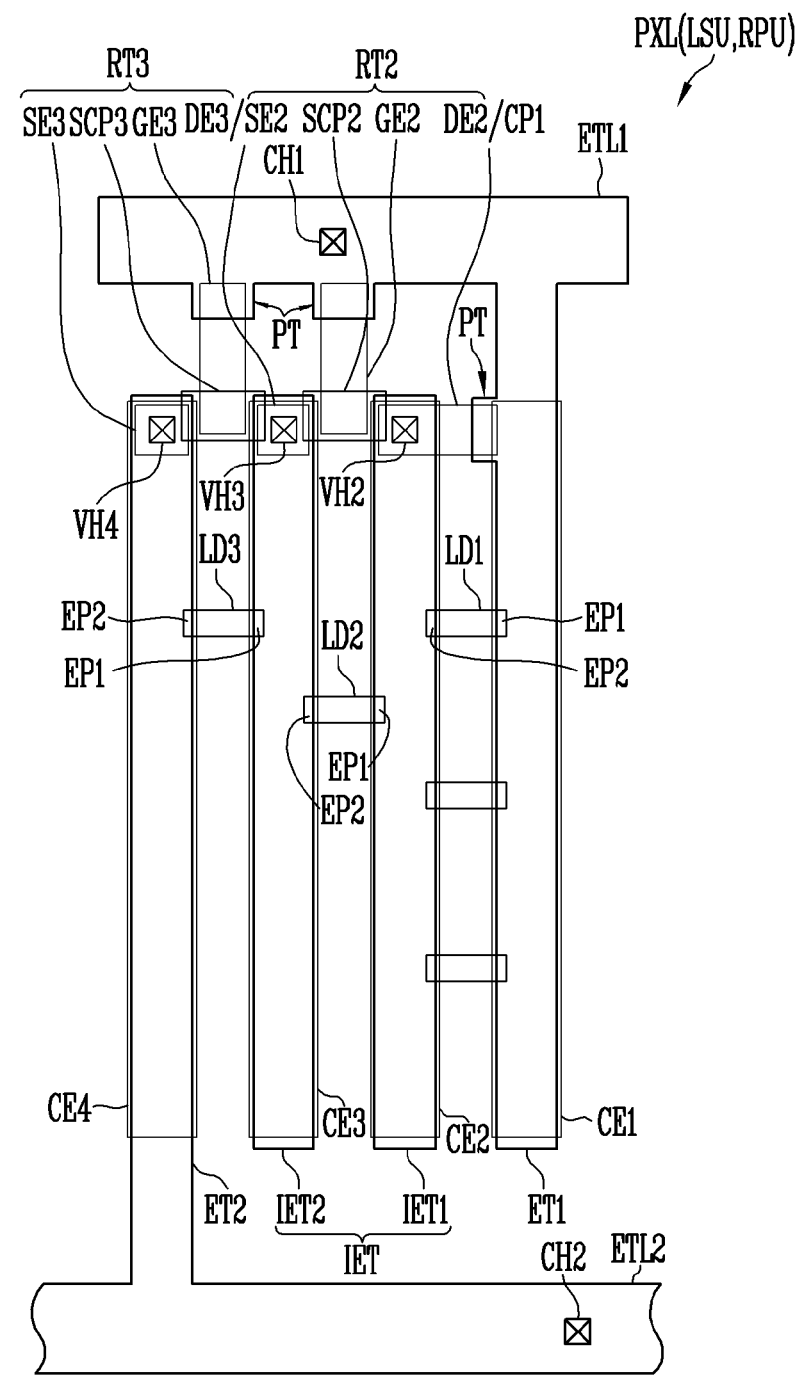
Figure 24:
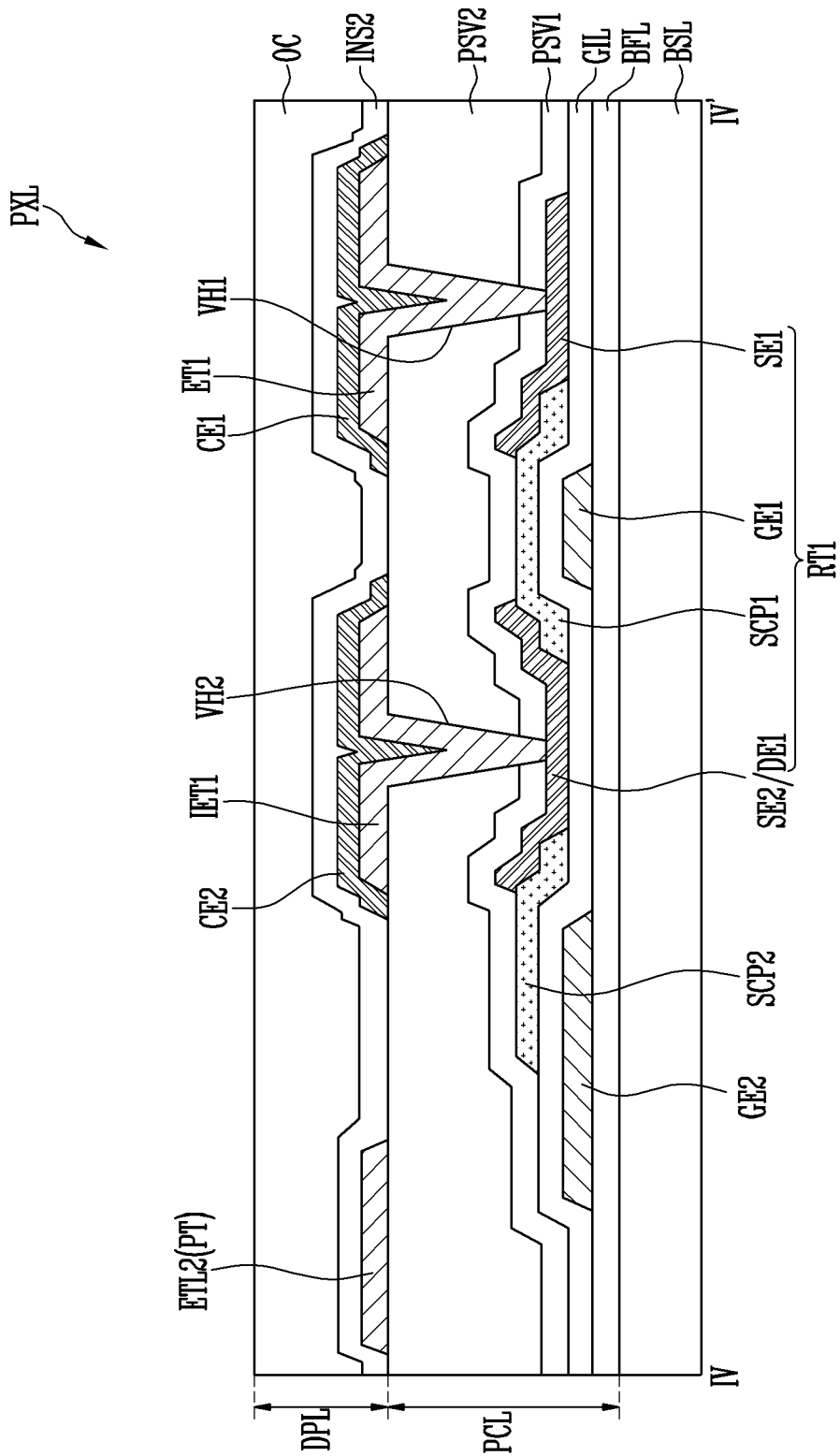
FIG. 24 is a cross-sectional view schematically illustrating a pixel in accordance with an embodiment of the disclosure and for example illustrates an embodiment of a cross-section of the pixel corresponding to line IV-IV' of FIG. 22.

FIGS. 22 and 23 are schematic plan views each illustrating a pixel PXL in accordance with an embodiment. In an embodiment, each pixel PXL illustrated in FIGS. 22 and 23 may be any one of the pixels PXL illustrated in FIGS. 4 to 14. For example, the pixel PXL shown in FIG. 22 may be a pixel PXL according to the embodiment of FIG. 13, and the pixel PXL shown in FIG. 23 may be a pixel PXL according to the embodiment of FIG. 14. FIG. 24 is a schematic cross-sectional view illustrating a pixel PXL in accordance with an embodiment and, for example, illustrates an embodiment of a cross-section of the pixel PXL corresponding to line IV-IV' of FIG. 22. In an embodiment, the pixels PXL disposed in the display area DA (see FIG. 4) may have substantially identical or similar structures. In the description of the embodiment(s) of FIGS. 22 to 24, like reference numerals will be used to designate components similar or equal to those of the previous embodiments, and detailed descriptions thereof will be omitted.

Referring to FIGS. 13, 14, and 22 to 24, the repair pattern circuit RPU of each pixel PXL may include a combination of at least one repair transistor RT and at least one conductive pattern CP. For example, some of the repair patterns that constitute each repair pattern circuit RPU may be formed as repair transistors RT, and other repair patterns may be formed as conductive patterns CP.

In an embodiment, the gate electrode GE of each repair transistor RT may overlap the first or second electrode line ETL1 or ETL2 (or the first or second electrode ET1 or ET2). For example, in case that each repair transistor RT is a P-type transistor, the gate electrode GE of the repair transistor RT may overlap the second electrode line ETL2 (or the second electrode ET2 electrically connected to the second electrode line ETL2). In case that each repair transistor RT is an N-type transistor, the gate electrode GE of the repair transistor RT may overlap the first electrode line ETL1 (or the first electrode ET1 electrically connected to the first electrode line ETL1. Compared to the embodiments of FIGS. 15 to 19, there is no need to dispose the gate-on power line VL such that the gate-on power line VL intersects the repair transistors RT of each pixel PXL. Therefore, there is no need to take into account the probability of occurrence of a short-circuit between the gate-on power line VL and the data line Dj, so that the repair transistors RT may be readily formed even in a display device having a structure in which the circuit element layer PCL includes only a single source/drain layer.

In an embodiment, the first electrode ET1 and the first electrode line ETL1 or the second electrode ET2 and the second electrode line ETL2 that overlap the repair patterns may include respective protrusions PT in areas thereof overlapping the respective repair patterns. Each protrusion PT indicates a short-circuit position for repairing an open defect, so that an open defect which occurs in the light source unit LSU can be readily repaired even without forming a separate guide pattern (e.g., guide patterns GP disclosed in the embodiments of FIGS. 15 to 19).

As described above, in the pixel PXL and the display device including the pixel PX in accordance with various embodiments, the light source unit LSU of each pixel PXL is formed to have a serial connection structure, so that in case that the display device is driven, panel current flowing through the display panel PNL may be reduced, and the power consumption may be reduced. Furthermore, since the repair patterns are disposed between electrodes of each pixel PXL including the first electrode ET1 and the second electrode ET2 and at least one intermediate electrode IET disposed between the first and second electrodes ET1 and ET2, an open defect which may occur in the pixel PXL having the serial connection structure of the light emitting elements LD may be readily repaired. In an embodiment, each repair pattern may be a repair transistor RT electrically connected between a pair of electrodes disposed on opposite sides of the repair pattern, or may include a conductive pattern CP intersecting the pair of electrodes disposed on the opposite sides of the repair pattern.

In an embodiment, in case that at least one serial stage constituting the light source unit LSU of the pixel PXL is a normal serial stage having no open defect, a repair pattern corresponding to the normal serial stage among repair patterns disposed in the pixel PXL may be electrically isolated from a pair of electrodes that constitute the corresponding serial stage. In this case, at least one light emitting element LD may be electrically connected in the forward direction between the pair of electrodes that overlap the isolated repair pattern.

In case that at least one serial stage constituting the light source unit LSU of the pixel PXL is a defective serial stage (e.g., a serial stage in which an open defect has occurred) having no light emitting element LD validly connected in the forward direction between a pair of electrodes corresponding to the at least one serial stage, a repair pattern corresponding to the defective serial stage among repair patterns disposed in the pixel PXL may be electrically connected between a pair of electrodes constituting the corresponding serial stage, whereby the open defect can be repaired. In this case, the pair of electrodes that overlap the repair pattern may be electrically connected only through the repair pattern.

In accordance with the above-mentioned embodiments, if an open defect occurs in a pixel PXL including serial stages, the open defect of the pixel PXL may be readily repaired by using a repair pattern. Therefore, the yield of the pixel PXL and the display device including the pixel PXL may be enhanced.

While the scope of the disclosure is described by detailed embodiments, it should be noted that the above-described embodiments are merely descriptive and should not be considered limiting. It should be understood by those skilled in the art that various changes, substitutions, and alternations may be made herein without departing from the scope of the disclosure as defined by the following claims.

The scope of the disclosure is not limited by detailed descriptions of the specification, and should be defined by the accompanying claims. Furthermore, all changes or modifications of the disclosure derived from the meanings and scope of the claims, and equivalents thereof should be construed as being included in the scope of the disclosure.

What is claimed is:

1. A display device comprising:
a pixel disposed in a display area,
wherein the pixel comprises:
    a first electrode and a second electrode spaced apart from each other;
    at least one intermediate electrode disposed between the first electrode and the second electrode;
    a plurality of light emitting elements electrically connected between a pair of adjacent electrodes of a plurality of electrodes including the first electrode, the second electrode, and the at least one intermediate electrode; and
    a plurality of repair patterns overlapping and disposed between a pair of adjacent electrodes of the plurality of electrodes.

2. The display device according to claim 1, wherein the pixel comprises:
a display element layer in which the first electrode, the second electrode, the at least one intermediate electrode, and the plurality of light emitting elements are disposed; and
a circuit element layer disposed under the display element layer, and in which the plurality of repair patterns are disposed.

3. The display device according to claim 2,
wherein
at least one of the plurality of repair patterns comprises a repair transistor, and
the repair transistor comprises:
- a gate electrode overlapping a gate-on power line to be supplied with a gate-on voltage capable of turning on the repair transistor, any one electrode of the first and second electrodes, or an electrode line electrically connected to the any one electrode;
- a semiconductor pattern overlapping an area of the gate electrode; and
- a source electrode and a drain electrode electrically connecting a pair of adjacent electrodes to respective different ends of the semiconductor pattern.

4. The display device according to claim 3, wherein the gate-on power line and the source and drain electrodes of the repair transistor are disposed on a same layer.

5. The display device according to claim 4, wherein the pixel comprises:
a guide pattern disposed in the display element layer and overlapping the gate electrode of the repair transistor and the gate-on power line.

6. The display device according to claim 5, wherein
the guide pattern comprises a conductive or insulating pattern, and
the conductive or insulating pattern and at least one electrode of the plurality of electrodes disposed in the display element layer including the first and the second electrodes are disposed on a same layer, or the conductive or insulating pattern and at least one insulating layer disposed in the display element layer are disposed on a same layer.

7. The display device according to claim 3, further comprising:
a first power line electrically connected to the first electrode; and
a second power line electrically connected to the second electrode.

8. The display device according to claim 7, wherein
the pixel comprises a pixel circuit electrically connected between the first power line and the first electrode or between the second power line and the second electrode, and
the pixel circuit comprises transistors of an identical type to the repair transistor.

9. The display device according to claim 7, wherein the pixel comprises:
a first electrode line electrically connected between the first power line and the first electrode, and
a second electrode line electrically connected between the second power line and the second electrode, and
the gate-on power line is disposed adjacent to one of the first and second electrode lines that is supplied with a power or signal having a potential closer to a potential of a power or signal of the gate-on power line than the other of the first and second electrode lines.

10. The display device according to claim 2, wherein at least one of the plurality of repair patterns comprises a conductive pattern disposed in the circuit element layer such that the conductive pattern intersects a pair of electrodes of the plurality of electrodes corresponding to the at least one of the plurality of repair patterns.

11. The display device according to claim 10, wherein the at least one intermediate electrode overlaps at least two repair patterns of the plurality of repair patterns spaced apart from each other, the at least one intermediate electrode including a slit disposed between the at least two repair patterns.

12. The display device according to claim 1, wherein the first electrode, the at least one intermediate electrode, and the second electrode are successively connected in series via each of the plurality of light emitting elements or the plurality of repair patterns.

13. The display device according to claim 12, wherein the first electrode, the at least one intermediate electrode, and the second electrode are successively disposed at positions spaced apart from each other in a first direction, and each extends in a second direction intersecting the first direction.

14. The display device according to claim 13, wherein the plurality of repair patterns are spaced apart from each other in the first direction.

15. The display device according to claim 1, wherein one of the first and second electrodes or an electrode line electrically connected to the one of the first and second electrodes includes a protrusion overlapping one of the plurality of repair patterns.

16. The display device according to claim 1,
wherein
the plurality of repair patterns include at least one repair pattern electrically isolated from a pair of electrodes of the plurality of electrodes corresponding to the at least one repair pattern, and
the pixel comprises at least one light emitting element electrically connected in a forward direction between the pair of adjacent electrodes that overlap the at least one repair pattern.

17. The display device according to claim 1, wherein
the plurality of repair patterns include at least one repair pattern electrically connected between a pair of electrodes of the plurality of electrodes corresponding to the at least one repair pattern, and
the pair of adjacent electrodes that overlap the at least one repair pattern are electrically connected to each other only through the at least one repair pattern.

18. The display device according to claim 1, wherein the pixel comprises at least one of:
a plurality of banks disposed under respective partial areas of the first electrode, the second electrode, and the at least one intermediate electrode; and
a plurality of contact electrodes respectively disposed over the first electrode, the second electrode, and the at least one intermediate electrode, and electrically connecting each of the first electrode, the second electrode, and the at least one intermediate electrode to an end of an adjacent light emitting element.

19. A pixel comprising:
a first electrode and a second electrode spaced apart from each other;
at least one intermediate electrode disposed between the first electrode and the second electrode;
a plurality of light emitting elements electrically connected between a pair of adjacent electrodes of a plurality of electrodes including the first electrode, the second electrode, and the at least one intermediate electrode; and
a plurality of repair patterns overlapping and disposed between a pair of adjacent electrodes of the plurality of electrodes.

20. The pixel according to claim 19, wherein the plurality of repair patterns comprises at least one repair pattern including:

a repair transistor electrically connected between a pair of adjacent electrodes of the plurality of electrodes disposed on sides of the repair pattern; or a conductive pattern intersecting the pair of adjacent electrodes disposed on the sides of the repair pattern.

* * * * *